(12) United States Patent
Kondiles et al.

(10) Patent No.: US 11,977,545 B2
(45) Date of Patent: May 7, 2024

(54) GENERATION OF AN OPTIMIZED QUERY PLAN IN A DATABASE SYSTEM

(71) Applicant: Ocient Inc., Chicago, IL (US)

(72) Inventors: George Kondiles, Chicago, IL (US); Jason Arnold, Chicago, IL (US)

(73) Assignee: Ociient Inc., Chicago, IL (US)

(*) Notice: Subject to any disclaimer, the term of this patent is extended or adjusted under 35 U.S.C. 154(b) by 295 days.

(21) Appl. No.: 16/267,608

(22) Filed: Feb. 5, 2019

(65) Prior Publication Data
US 2020/0117664 A1    Apr. 16, 2020

Related U.S. Application Data

(60) Provisional application No. 62/745,787, filed on Oct. 15, 2018.

(51) Int. Cl.
*G06F 16/2453*    (2019.01)
*G06F 3/06*    (2006.01)
(Continued)

(52) U.S. Cl.
CPC ...... *G06F 16/24542* (2019.01); *G06F 3/0604* (2013.01); *G06F 3/0647* (2013.01);
(Continued)

(58) Field of Classification Search
CPC .......... G06F 16/24542; G06F 16/278; G06F 16/24573; G06F 16/2458; G06F 16/2453;
(Continued)

(56) References Cited

U.S. PATENT DOCUMENTS 4,590,560 A    5/1986 Sado
5,548,770 A    8/1996 Bridges
(Continued)

FOREIGN PATENT DOCUMENTS

CN    102243629 A  *  11/2011
CN    103064875 A  *  4/2013
(Continued)

OTHER PUBLICATIONS

Slot, "Distributed Execution of Subqueries and CTEs in Citus", Mar. 9, 2018; (Year: 2018).*
(Continued)

*Primary Examiner* — Neveen Abel Jalil
*Assistant Examiner* — Hubert Cheung
(74) *Attorney, Agent, or Firm* — Garlick & Markison; Katherine C. Stuckman; Bruce E. Stuckman

(57) ABSTRACT

A method includes receiving, by a first computing entity of a database system, a query request that is formatted in accordance with a generic query format. The method further includes generating, by the first computing entity, an initial query plan based on the query request and a query instruction set. The method further includes determining, by the first computing entity, storage parameters. The method further includes determining, by the first computing entity, processing resources for processing the query request based on the storage parameters. The method further includes generating, by the first computing entity, an optimized query plan from the initial query plan based on the storage parameters, the processing resources, and optimization tools. The method further includes sending, by the first computing entity, the optimized query plan to a second computing entity for distribution and execution of the optimized query plan.

24 Claims, 43 Drawing Sheets

(51) Int. Cl.

| | |
|---|---|
| G06F 7/24 | (2006.01) |
| G06F 9/4401 | (2018.01) |
| G06F 9/50 | (2006.01) |
| G06F 11/10 | (2006.01) |
| G06F 12/0893 | (2016.01) |
| G06F 12/109 | (2016.01) |
| G06F 16/17 | (2019.01) |
| G06F 16/22 | (2019.01) |
| G06F 16/23 | (2019.01) |
| G06F 16/242 | (2019.01) |
| G06F 16/2455 | (2019.01) |
| G06F 16/2457 | (2019.01) |
| G06F 16/2458 | (2019.01) |
| G06F 16/27 | (2019.01) |
| G06F 16/901 | (2019.01) |
| H03M 7/30 | (2006.01) |
| H04L 67/10 | (2022.01) |

(52) U.S. Cl.
CPC .............. G06F 3/068 (2013.01); G06F 7/24 (2013.01); G06F 9/4406 (2013.01); G06F 9/5016 (2013.01); G06F 9/5027 (2013.01); G06F 9/5061 (2013.01); G06F 11/1004 (2013.01); G06F 11/1044 (2013.01); G06F 11/1076 (2013.01); G06F 12/0893 (2013.01); G06F 12/109 (2013.01); G06F 16/1727 (2019.01); G06F 16/22 (2019.01); G06F 16/2246 (2019.01); G06F 16/2282 (2019.01); G06F 16/2365 (2019.01); G06F 16/244 (2019.01); G06F 16/2445 (2019.01); G06F 16/2453 (2019.01); G06F 16/24553 (2019.01); G06F 16/24573 (2019.01); G06F 16/2458 (2019.01); G06F 16/278 (2019.01); G06F 16/901 (2019.01); G06F 16/9017 (2019.01); H03M 7/30 (2013.01); H04L 67/10 (2013.01); G06F 3/067 (2013.01); G06F 16/24547 (2019.01); G06F 2211/1011 (2013.01); G06F 2212/608 (2013.01)

(58) Field of Classification Search
CPC ............. G06F 16/2246; G06F 16/2445; G06F 16/244; G06F 16/2282; G06F 16/2365; G06F 16/901; G06F 16/1727; G06F 16/22; G06F 16/24553; G06F 16/9017; G06F 9/5061; G06F 12/109; G06F 3/0604; G06F 16/24574; G06F 16/24547
See application file for complete search history.

(56) References Cited

U.S. PATENT DOCUMENTS

| | | | |
|---|---|---|---|
| 5,822,749 A * | 10/1998 | Agarwal ............ G06F 12/0866 |
| 6,230,200 B1 | 5/2001 | Forecast |
| 6,633,772 B2 | 10/2003 | Ford |
| 7,499,907 B2 | 3/2009 | Brown |
| 7,908,242 B1 | 3/2011 | Achanta |
| 10,795,887 B1 * | 10/2020 | Schreier ............ G06F 16/24542 |
| 10,909,114 B1 * | 2/2021 | Virtuoso ............. G06F 16/2282 |
| 2001/0051949 A1 | 12/2001 | Carey |
| 2002/0032676 A1 | 3/2002 | Reiner |
| 2004/0098374 A1 * | 5/2004 | Bayliss ............ G06F 16/24542 |
| 2004/0162853 A1 | 8/2004 | Brodersen |
| 2005/0192937 A1 * | 9/2005 | Barsness ........... G06F 16/24532 |
| 2006/0218123 A1 * | 9/2006 | Chowdhuri ........ G06F 16/24532 |
| 2008/0065588 A1 * | 3/2008 | Aldrich ............ G06F 16/24542 |
| 2008/0133456 A1 | 6/2008 | Richards |
| 2009/0063893 A1 | 3/2009 | Bagepalli |
| 2009/0183167 A1 | 7/2009 | Kupferschmidt |
| 2010/0082577 A1 | 4/2010 | Mirchandani |
| 2010/0191720 A1 * | 7/2010 | Al-Omari ......... G06F 16/24542 707/718 |
| 2010/0198806 A1 * | 8/2010 | Graefe ............. G06F 16/24542 707/713 |
| 2010/0241646 A1 | 9/2010 | Friedman |
| 2010/0274983 A1 | 10/2010 | Murphy |
| 2010/0306188 A1 * | 12/2010 | Cunningham .... G06F 16/24542 707/713 |
| 2010/0312756 A1 | 12/2010 | Zhang |
| 2011/0219169 A1 | 9/2011 | Zhang |
| 2012/0109888 A1 | 5/2012 | Zhang |
| 2012/0130988 A1 * | 5/2012 | Nica ................. G06F 16/24542 707/718 |
| 2012/0151118 A1 | 6/2012 | Flynn |
| 2012/0185866 A1 | 7/2012 | Couvee |
| 2012/0254252 A1 | 10/2012 | Jin |
| 2012/0259840 A1 * | 10/2012 | Nica ................. G06F 16/24542 707/719 |
| 2012/0311246 A1 | 12/2012 | McWilliams |
| 2012/0323923 A1 | 12/2012 | Duan |
| 2013/0332484 A1 | 12/2013 | Gajic |
| 2014/0047095 A1 | 2/2014 | Breternitz |
| 2014/0114952 A1 * | 4/2014 | Robinson .......... G06F 16/24532 707/718 |
| 2014/0136510 A1 | 5/2014 | Parkkinen |
| 2014/0188841 A1 | 7/2014 | Sun |
| 2014/0214798 A1 * | 7/2014 | Nica ................. G06F 16/24542 707/718 |
| 2014/0304251 A1 * | 10/2014 | Bornea ............. G06F 16/24542 707/718 |
| 2015/0154256 A1 * | 6/2015 | McKenna ......... G06F 16/24542 707/718 |
| 2015/0205607 A1 | 7/2015 | Lindholm |
| 2015/0244804 A1 | 8/2015 | Warfield |
| 2015/0248366 A1 | 9/2015 | Bergsten |
| 2015/0293966 A1 | 10/2015 | Cai |
| 2015/0310045 A1 | 10/2015 | Konik |
| 2016/0034547 A1 | 2/2016 | Lerios |
| 2016/0042013 A1 * | 2/2016 | Fan ..................... G06F 16/283 707/792 |
| 2016/0239540 A1 * | 8/2016 | Zheng ................ G06F 16/258 |
| 2016/0253402 A1 | 9/2016 | Klots et al. |
| 2016/0292224 A1 * | 10/2016 | Konik ................ G06F 16/25 |
| 2016/0350347 A1 * | 12/2016 | Das .................. G06F 12/023 |
| 2017/0116015 A1 * | 4/2017 | Cropper ........... G06F 9/45558 |
| 2017/0139991 A1 | 5/2017 | Teletia |
| 2017/0212933 A1 * | 7/2017 | Burton .............. G06F 16/217 |
| 2018/0349364 A1 * | 12/2018 | Arnold ............. G06F 16/901 |
| 2019/0042304 A1 * | 2/2019 | Wang ................ H04L 47/2441 |
| 2019/0392068 A1 * | 12/2019 | Wen ................. G06F 16/24545 |

FOREIGN PATENT DOCUMENTS

| | | | | |
|---|---|---|---|---|
| CN | 103646099 A | * | 3/2014 | ......... G06F 17/3064 |
| CN | 104077369 A | * | 10/2014 | ....... G06F 17/30442 |
| CN | 105007287 A | * | 10/2015 | ......... G06F 9/45558 |
| CN | 103064875 B | * | 6/2017 | |
| CN | 107220113 A | * | 9/2017 | |
| CN | 107733696 A | * | 2/2018 | .......... G06F 16/182 |
| CN | 106598937 B | * | 10/2019 | |
| CN | 110968723 A | * | 4/2020 | |
| IN | 201400988 A | | 10/2015 | |
| JP | 2005338095 A | * | 12/2005 | |
| SE | 520554 C2 | * | 7/2003 | ............. G10L 19/10 |
| WO | WO-2011103580 A1 | * | 8/2011 | ....... G06F 17/30312 |
| WO | WO-2020242631 A1 | * | 12/2020 | .......... G06F 11/3419 |

OTHER PUBLICATIONS

"Oracle Data Warehouse Parallel Query", 2014 (Year: 2014).*
Pinal, "How to Force a Parallel Execution Plan for a Query", 2018; (Year: 2018).*
S. I. Yusuf and S. B. Junaidu, "Parallel and Distributed Intra Query Transient Fault Tolerance Model via Parity Checking," 2018 14th International Conference on Electronics Computer and Computation (ICECCO), Kaskelen, Kazakhstan, 2018, pp. 206-212, doi: 10.1109/ICECCO.2018.8634666. (Year: 2018).*

(56) References Cited

OTHER PUBLICATIONS

Ganguly et al., "Query Optimization for Parallel Execution", 1992 ACM SIGMOD—6/92/CA, 1992 ACM 0-89791-522-4192 / 000510009. (Year: 1992).*

Srivastava et al., "Query Optimization over Web Services", VLDB '06, VLDB Endowment, ACM 1-59593-385-09/06/09. (Year: 2006).*

International Searching Authority; International Search Report and Written Opinion; International Application No. PCT/US2019/056254; dated Jan. 3, 2020; 7 pgs.

A new high performance fabric for HPC, Michael Feldman, May 2016, Intersect360 Research.

Alechina, N. (2006-2007). B-Trees. School of Computer Science, University of Nottingham, http://www.cs.nott.ac.uk/~psznza/G5BADS06/lecture13-print.pdf. 41 pages.

Amazon DynamoDB: ten things you really should know, Nov. 13, 2015, Chandan Patra, http://cloudacademy..com/blog/amazon-dynamodb-ten-thing.

An Inside Look at Google BigQuery, by Kazunori Sato, Solutions Architect, Cloud Solutions team, Google Inc., 2012.

Big Table, a NoSQL massively parallel table, Paul Krzyzanowski, Nov. 2011, https://www.cs.rutgers.edu/pxk/417/notes/contentlbigtable.html.

Distributed Systems, Fall2012, Mohsen Taheriyan, http://www-scf.usc.edu/-csci57212011Spring/presentations/Taheriyan.pptx.

International Searching Authority; International Search Report and Written Opinion; International Application No. PCT/US2017/054773; dated Feb. 13, 2018; 17 pgs.

International Searching Authority; International Search Report and Written Opinion; International Application No. PCT/US2017/054784; dated Dec. 28, 2017; 10 pgs.

International Searching Authority; International Search Report and Written Opinion; International Application No. PCT/US2017/066145; dated Mar. 5, 2018; 13 pgs.

International Searching Authority; International Search Report and Written Opinion; International Application No. PCT/US2017/066169; dated Mar. 6, 2018; 15 pgs.

International Searching Authority; International Search Report and Written Opinion; International Application No. PCT/US2018/025729; dated Jun. 27, 2018; 9 pgs.

International Searching Authority; International Search Report and Written Opinion; International Application No. PCT/US2018/034859; dated Oct. 30, 2018; 8 pgs.

MapReduce: Simplied Data Processing on Large Clusters, OSDI 2004, Jeffrey Dean and Sanjay Ghemawat, Google, inc.

Rodero-Merino, L.; Storage of Structured Data: Big Table and HBase, New Trends In Distributed Systems, MSc Software and Systems, Distributed Systems Laboratory; Oct. 17, 2012; 24 pages.

Step 2: Examine the data model and implementation details, 2016, Amazon Web Services, Inc., http://docs.aws.amazon.com/amazondynamodb/latestldeveloperguide!Ti . . . .

European Patent Office; Extended European Search Report; EP Application No. 19873897.3; dated Jun. 15, 2022; 9 pgs.

Papadomanolakis, et al.; AutoPart: Automating Schema Design for Large Scientific Databases Using Data Partitioning; Proceedings of the 16th International Conference on Scientific and Statistical Database Management; Jul. 1, 2003; 19 pgs.

Zhou, et al.; Incorporating Partitioning and Parallel Plans into the SCOPE Optimizer; IEEE 26th International Conference on Data Engineering (ICDE); Mar. 1, 2010; pp. 1060-1071.

* cited by examiner database system 10 computing device 18 computing device 18 computing device 18 node 37 node 37 node 37

FIG. 21

PCR = processing core resource storage cluster storage cluster

GENERATION OF AN OPTIMIZED QUERY PLAN IN A DATABASE SYSTEM

CROSS-REFERENCE TO RELATED APPLICATIONS

The present U.S. Utility Patent Application claims priority pursuant to 35 U.S.C. § 119(e) to U.S. Provisional Application No. 62/745,787, entitled "DATABASE SYSTEM AND OPERATION," filed Oct. 15, 2018, which is hereby incorporated herein by reference in its entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networking and more particularly to database system and operation.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function.

Of the many applications a computer can perform, a database system is one of the largest and most complex applications. In general, a database system stores a large amount of data in a particular way for subsequent processing. In some situations, the hardware of the computer is a limiting factor regarding the speed at which a database system can process a particular function. In some other instances, the way in which the data is stored is a limiting factor regarding the speed of execution. In yet some other instances, restricted co-process options are a limiting factor regarding the speed of execution.

BRIEF DESCRIPTION OF THE SEVERAL VIEWS OF THE DRAWING(S)

FIGS. 15-25 are schematic block diagrams of an example of processing a table or data set for storage in the database system in accordance with the present invention;

DETAILED DESCRIPTION OF THE INVENTION

Figure 1:
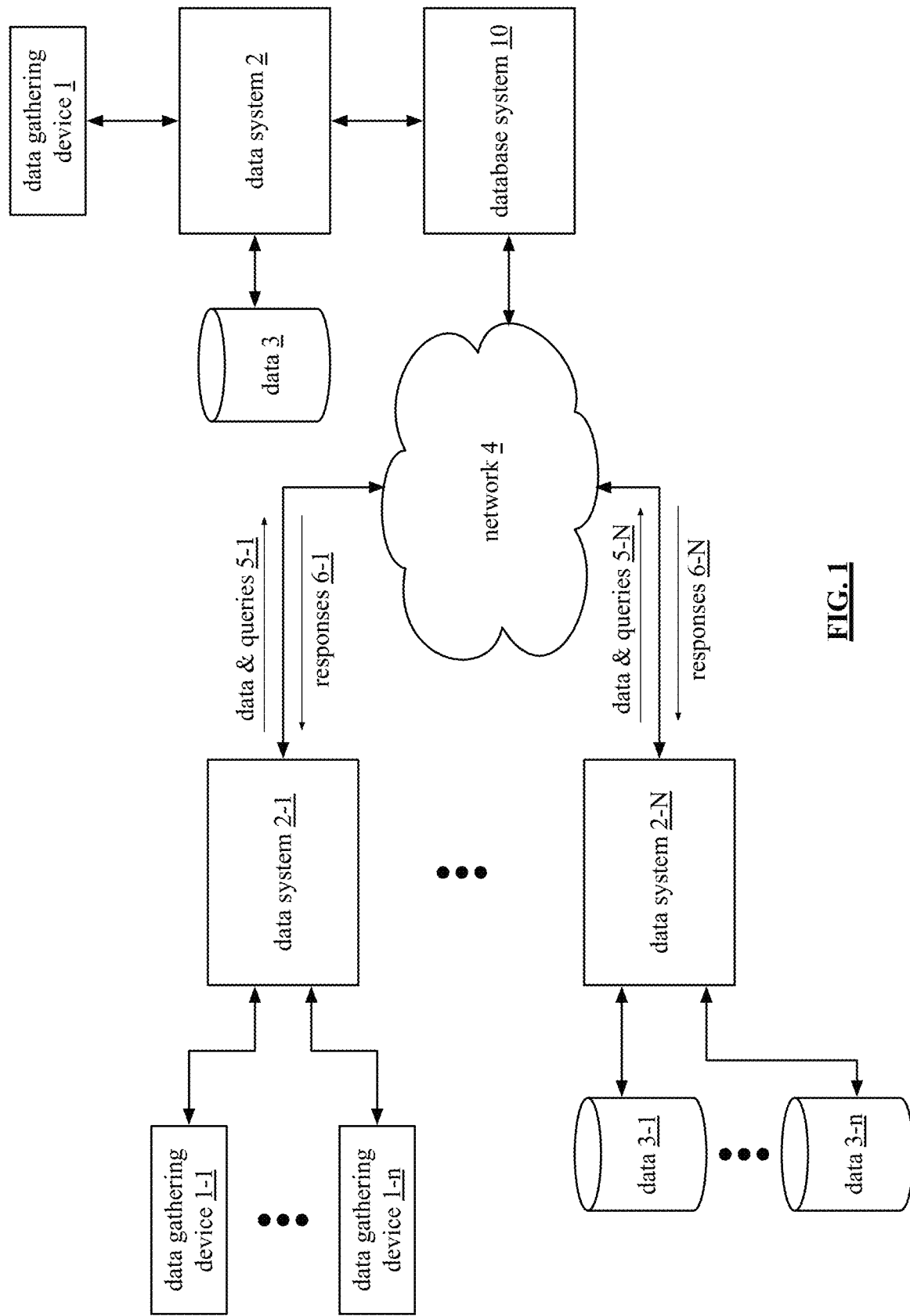
FIG. 1 is a schematic block diagram of an embodiment of a large scale data processing network that includes a database system in accordance with the present invention.

FIG. 1 is a schematic block diagram of an embodiment of a large-scale data processing network that includes data gathering device 1, data gathering devices 1-1 through 1-n, data system 2, data systems 2-1 through 2-N, data 3, data 3-1 through 3-n, a network 4, and a database system 10. The data systems 2-1 through 2-N provide, via the network 4, data and queries 5-1 through 5-N data to the database system 10. Alternatively, or in addition to, the data system 2 provides further data and queries directly to the database system 10. In response to the data and queries, the database system 10 issues, via the network 4, responses 6-1 through 6-N to the data systems 2-1 through 2-N. Alternatively, or in addition to, the database system 10 provides further responses directly to the data system 2. The data gathering devices 1, 1-1 through 1-n may be implemented utilizing sensors, monitors, handheld computing devices, etc. and/or a plurality of storage devices including hard drives, cloud storage, etc. The data gathering devices 1-1 through 1-n may provide real-time data to the data system 2-1 and/or any other data system and the data 3-1 through 3-n may provide stored data to the data system 2-N and/or any other data system.

Figure 1A:
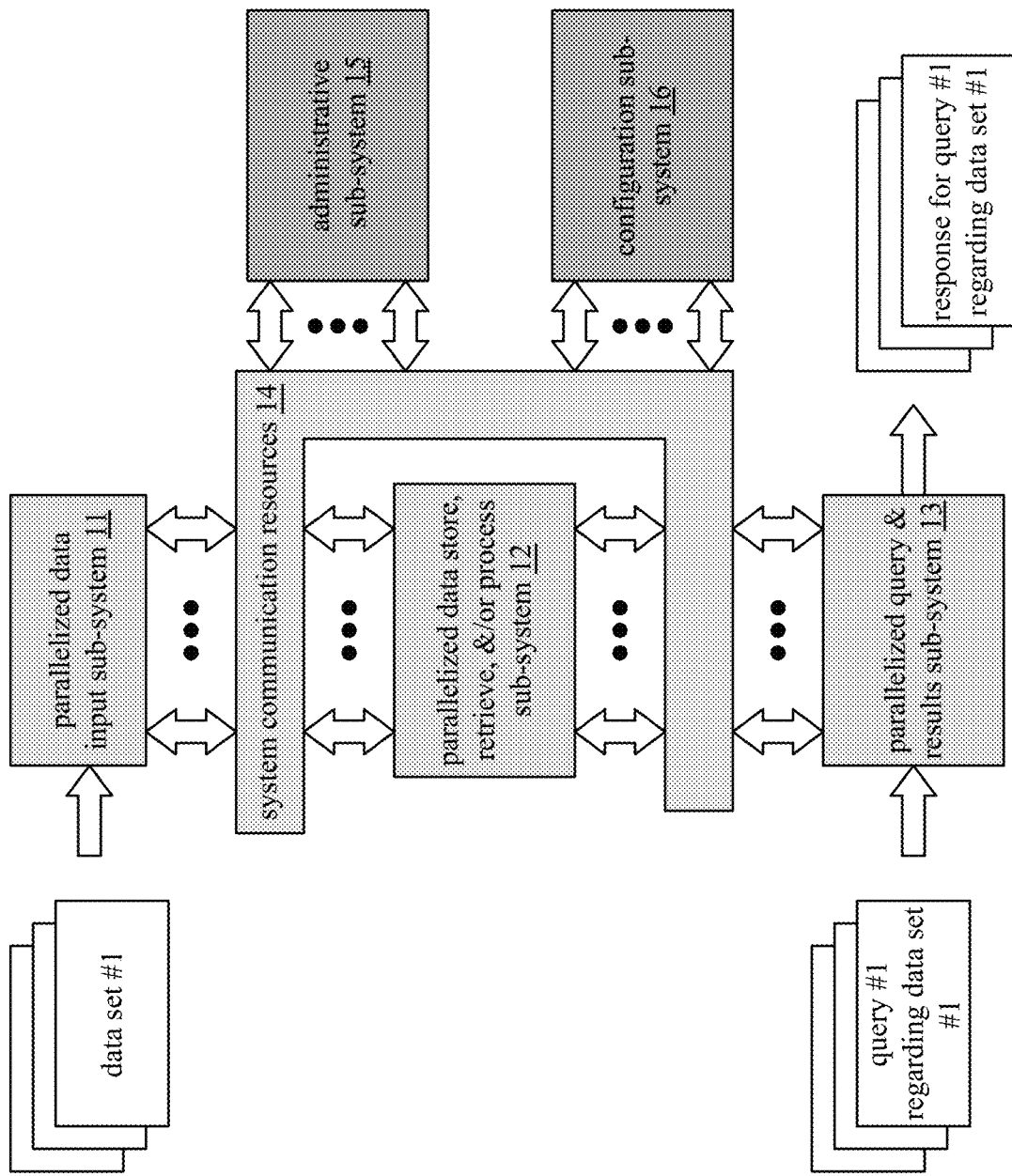
FIG. 1A is a schematic block diagram of an embodiment of a database system in accordance with the present invention.

FIG. 1A is a schematic block diagram of an embodiment of a database system 10 that includes data processing 7 and system administration 8. The data processing 7 includes a parallelized data input sub-system 11, a parallelized data store, retrieve, and/or process sub-system 12, a parallelized query and response sub-system 13, and system communication resources 14. The system administration 8 includes an administrative sub-system 15 and a configuration sub-system 16. The system communication resources 14 include one or more of wide area network (WAN) connections, local area network (LAN) connections, wireless connections, wireline connections, etc. to couple the sub-systems 11, 12, 13, 15, and 16 together. Each of the sub-systems 11, 12, 13, 15, and 16 include a plurality of computing devices; an example of which is discussed with reference to one or more of FIGS. 7-9.

In an example of operation, the parallelized data input sub-system 11 receives tables of data from a data source. For example, a data set no. 1 is received when the data source includes one or more computers. As another example, the data source is a plurality of machines. As yet another example, the data source is a plurality of data mining algorithms operating on one or more computers. The data source organizes its data into a table that includes rows and columns. The columns represent fields of data for the rows. Each row corresponds to a record of data. For example, a table include payroll information for a company's employees. Each row is an employee's payroll record. The columns include data fields for employee name, address, department, annual salary, tax deduction information, direct deposit information, etc.

The parallelized data input sub-system 11 processes a table to determine how to store it. For example, the parallelized data input sub-system 11 divides the data into a plurality of data partitions. For each data partition, the parallelized data input sub-system 11 determines a number of data segments based on a desired encoding scheme. As a specific example, when a 4 of 5 encoding scheme is used (meaning any 4 of 5 encoded data elements can be used to recover the data), the parallelized data input sub-system 11 divides a data partition into 5 segments. The parallelized data input sub-system 11 then divides a data segment into data slabs. Using one or more of the columns as a key, or keys, the parallelized data input sub-system 11 sorts the data slabs. The sorted data slabs are sent, via the system communication resources 14, to the parallelized data store, retrieve, and/or process sub-system 12 for storage.

The parallelized query and response sub-system 13 receives queries regarding tables and processes the queries prior to sending them to the parallelized data store, retrieve, and/or process sub-system 12 for processing. For example, the parallelized query and response sub-system 13 receives a specific query no. 1 regarding the data set no. 1 (e.g., a specific table). The query is in a standard query format such as Open Database Connectivity (ODBC), Java Database Connectivity (JDBC), and/or SPARK. The query is assigned to a node within the sub-system 13 for subsequent processing. The assigned node identifies the relevant table, determines where and how it is stored, and determines available nodes within the parallelized data store, retrieve, and/or process sub-system 12 for processing the query.

In addition, the assigned node parses the query to create an abstract syntax tree. As a specific example, the assigned node converts an SQL (Standard Query Language) statement into a database instruction set. The assigned node then validates the abstract syntax tree. If not valid, the assigned node generates a SQL exception, determines an appropriate correction, and repeats. When the abstract syntax tree is validated, the assigned node then creates an annotated abstract syntax tree. The annotated abstract syntax tree includes the verified abstract syntax tree plus annotations regarding column names, data type(s), data aggregation or not, correlation or not, subquery or not, and so on.

The assigned node then creates an initial query plan from the annotated abstract syntax tree. The assigned node optimizes the initial query plan using a cost analysis function (e.g., processing time, processing resources, etc.). Once the query plan is optimized, it is sent, via the system communication resources 14, to the parallelized data store, retrieve, and/or process sub-system 12 for processing.

Within the parallelized data store, retrieve, and/or process sub-system 12, a computing device is designated as a primary device for the query plan and receives it. The primary device processes the query plan to identify nodes within the parallelized data store, retrieve, and/or process sub-system 12 for processing the query plan. The primary device then sends appropriate portions of the query plan to the identified nodes for execution. The primary device receives responses from the identified nodes and processes them in accordance with the query plan. The primary device provides the resulting response to the assigned node of the parallelized query and response sub-system 13. The assigned node determines whether further processing is needed on the resulting response (e.g., joining, filtering, etc.). If not, the assigned node outputs the resulting response as the response to the query (e.g., a response for query no. 1 regarding data set no. 1). If, however, further processing is determined, the assigned node further processes the resulting response to produce the response to the query.

Figure 2:
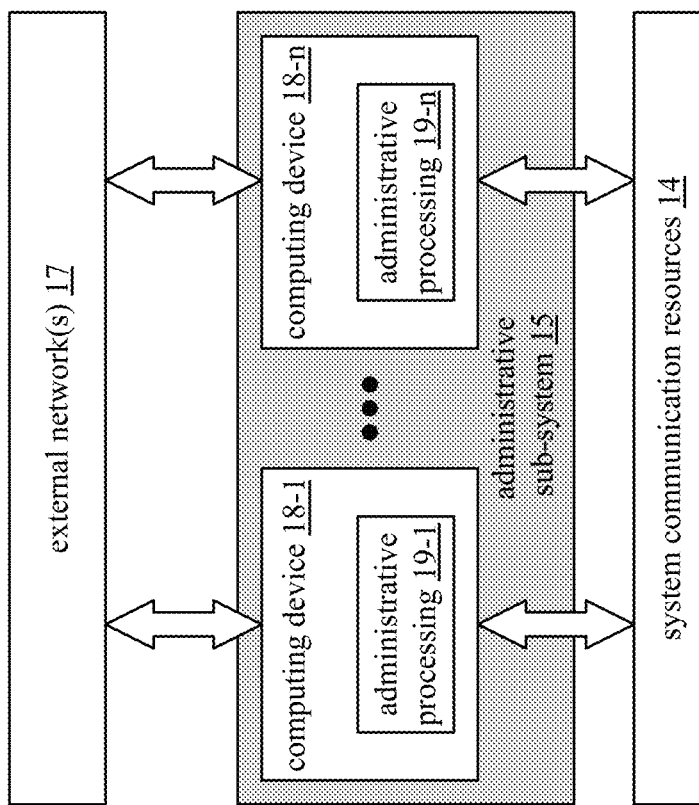
FIG. 2 is a schematic block diagram of an embodiment of an administrative sub-system in accordance with the present invention.

FIG. 2 is a schematic block diagram of an embodiment of the administrative sub-system 15 of FIG. 1A that includes one or more computing devices 18-1 through 18-n. Each of the computing devices executes an administrative processing function utilizing a corresponding administrative processing of administrative processing 19-1 through 19-n (which includes a plurality of administrative operations) that coordinates system level operations of the database system. Each computing device is coupled to an external network 17, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of an administrative operation independently. This supports lock free and parallel execution of one or more administrative operations.

Figure 3:
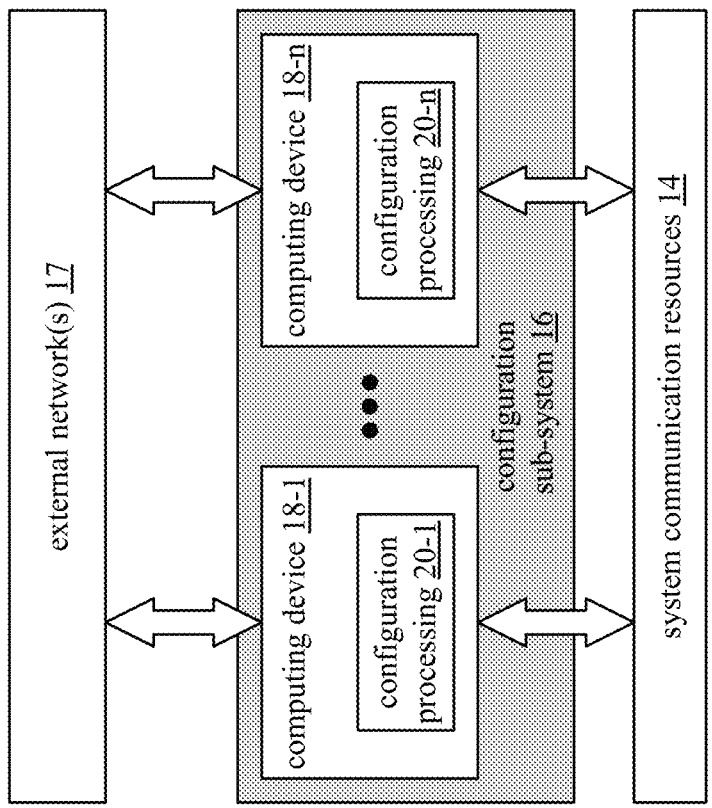
FIG. 3 is a schematic block diagram of an embodiment of a configuration sub-system in accordance with the present invention.

FIG. 3 is a schematic block diagram of an embodiment of the configuration sub-system 16 of FIG. 1A that includes one or more computing devices 18-1 through 18-n. Each of the computing devices executes a configuration processing function utilizing a corresponding configuration processing of configuration processing 20-1 through 20-n (which includes a plurality of configuration operations) that coordinates system level configurations of the database system. Each computing device is coupled to the external network 17 of FIG. 2, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of a configuration operation independently. This supports lock free and parallel execution of one or more configuration operations.

Figure 4:
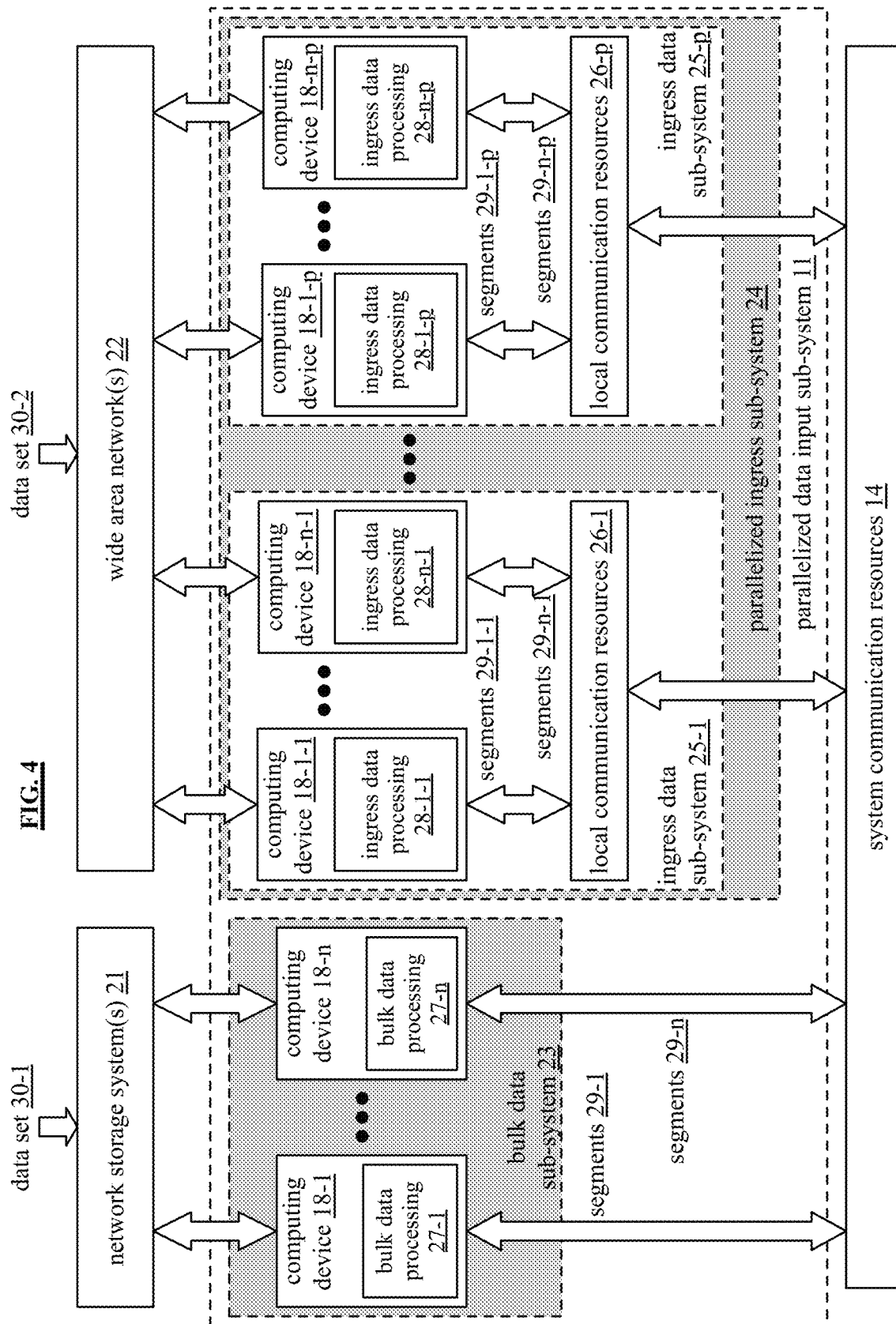
FIG. 4 is a schematic block diagram of an embodiment of a parallelized data input sub-system in accordance with the present invention.

FIG. 4 is a schematic block diagram of an embodiment of the parallelized data input sub-system 11 of FIG. 1A that includes a bulk data sub-system 23 and a parallelized ingress sub-system 24. The bulk data sub-system 23 includes a plurality of computing devices 18-1 through 18-n. The computing devices of the bulk data sub-system 23 execute a bulk data processing function to retrieve a table from a network storage system 21 (e.g., a server, a cloud storage service, etc.).

The parallelized ingress sub-system 24 includes a plurality of ingress data sub-systems 25-1 through 25-p that each include a local communication resource of local communication resources 26-1 through 26-p and a plurality of computing devices 18-1 through 18-n. Each of the computing devices of the parallelized ingress sub-system 24 execute an ingress data processing function utilizing an ingress data processing of ingress data processing 28-1 through 28-n of each ingress data sub-system 25-1 through 25-p that enables the computing device to stream data of a table (e.g., a data set 30-2 as segments 29-1-1 through 29-1-n and through 29-1-p through 29-n-p) into the database system 10 of FIG. 1A via a wide area network 22 (e.g., cellular network, Internet, telephone network, etc.). The streaming may further be via corresponding local communication resources 26-1 through 26-p and via the system communication resources 14 of FIG. 1A. With the plurality of ingress data sub-systems 25-1 through 25-p, data from a plurality of tables can be streamed into the database system 10 at one time (e.g., simultaneously utilizing two or more of the ingress data sub-systems 25-1 through 25-p in a parallel fashion).

Each of the bulk data processing function and the ingress data processing function generally function as described with reference to FIG. 1 for processing a table for storage. The bulk data processing function is geared towards retrieving data of a table in a bulk fashion (e.g., a data set 30-1 as the table is stored and retrieved, via the system communication resources 14 of FIG. 1A, from storage as segments 29-1 through 29-n). The ingress data processing function, however, is geared towards receiving streaming data from one or more data sources. For example, the ingress data processing function is geared towards receiving data from a plurality of machines in a factory in a periodic or continual manner as the machines create the data.

As will be described in greater detail with reference to one or more subsequent figures, a computing device includes a plurality of nodes and each node includes a plurality of processing core resources. Each processing core resource is capable of executing at least a portion of the bulk data processing function or the ingress data processing function. In an embodiment, a plurality of processing core resources of one or more nodes executes the bulk data processing function or the ingress data processing function to produce the storage format for the data of a table.

Figure 5:
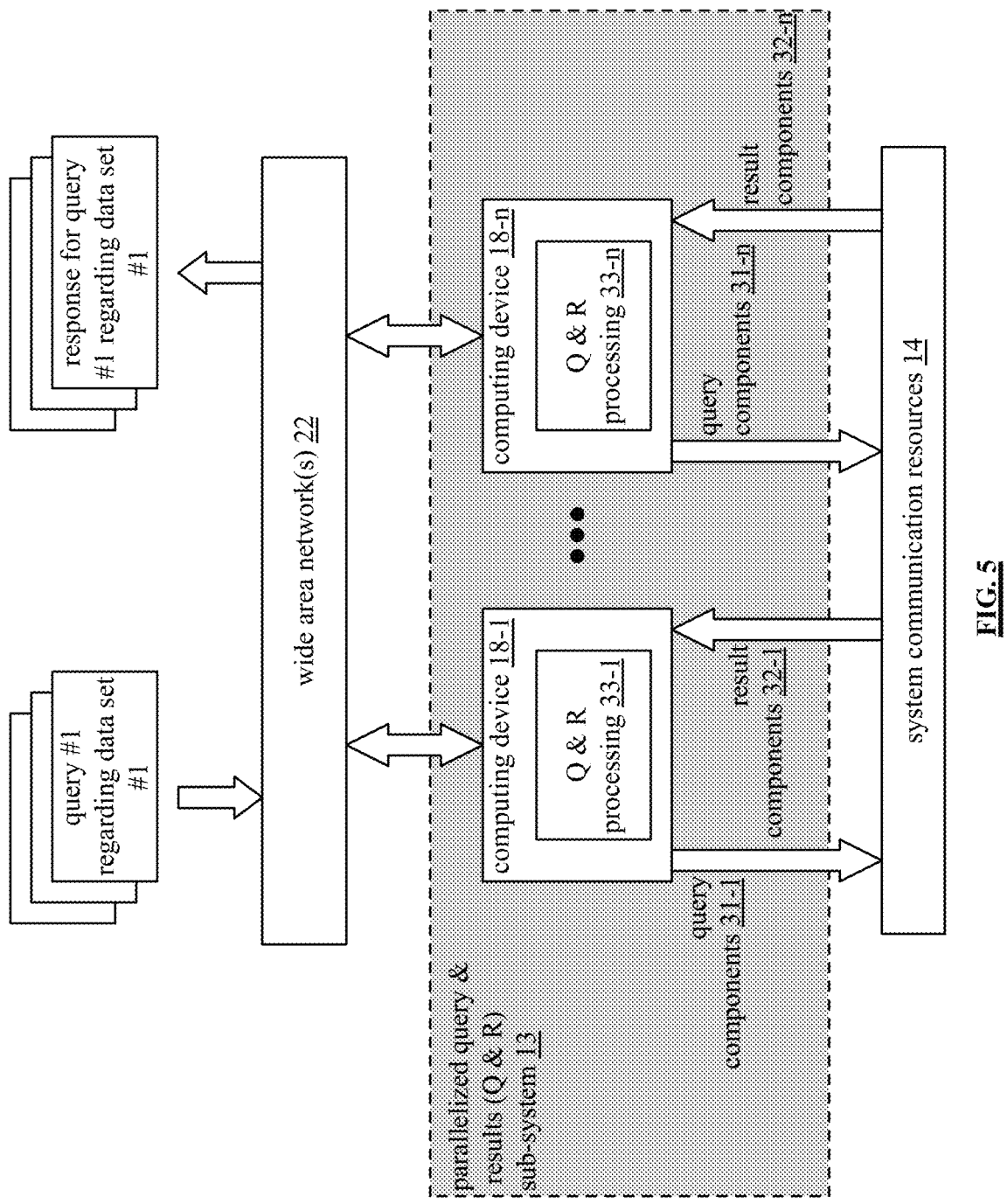
FIG. 5 is a schematic block diagram of an embodiment of a parallelized query and response (Q&R) sub-system in accordance with the present invention.

FIG. 5 is a schematic block diagram of an embodiment of a parallelized query and results sub-system 13 that includes a plurality of computing devices 18-1 through 18-n. Each of the computing devices executes a query (Q) & response (R) function utilizing a corresponding Q & R processing of Q & R processing 33-1 through 33-n. The computing devices are coupled to the wide area network 22 of FIG. 4 to receive queries (e.g., query no. 1 regarding data set no. 1) regarding tables and to provide responses to the queries (e.g., response for query no. 1 regarding the data set no. 1). For example, the plurality of computing devices 18-1 through 18-n receives a query, via the wide area network 22, issues, via the system communication resources 14 of FIG. 1A, query components 31-1 through 31-n to the parallelized data store, retrieve, &/or process sub-system 12 of FIG. 1A, receives, via the system communication resources 14, results components 32-1 through 32-n, and issues, via the wide area network 22, a response to the query.

The Q & R function enables the computing devices to processing queries and create responses as discussed with reference to FIG. 1. As will be described in greater detail with reference to one or more subsequent figures, a computing device includes a plurality of nodes and each node includes a plurality of processing core resources. Each processing core resource is capable of executing at least a portion of the Q & R function. In an embodiment, a plurality of processing core resources of one or more nodes executes the Q & R function to produce a response to a query.

Figure 6:
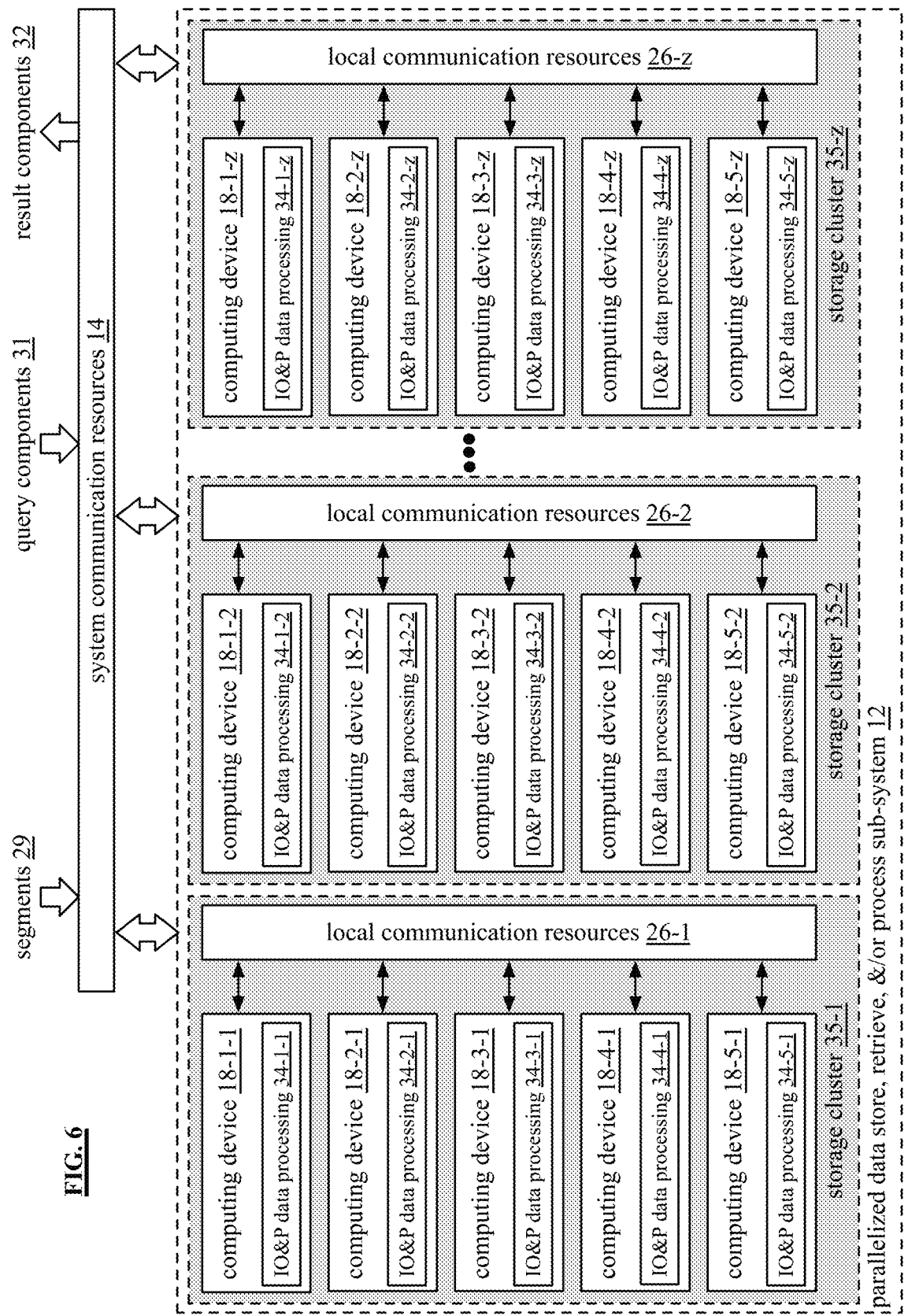
FIG. 6 is a schematic block diagram of an embodiment of a parallelized data store, retrieve, and/or process (IO& P) sub-system in accordance with the present invention.

FIG. 6 is a schematic block diagram of an embodiment of a parallelized data store, retrieve, and/or process sub-system 12 that includes a plurality of storage clusters 35-1 through 35-z. Each storage cluster includes a corresponding local communication resource of a plurality of local communication resources 26-1 through 26-z and includes a plurality of computing devices 18-1 through 18-5 and each computing device executes an input, output, and processing (IO &P) function utilizing a corresponding IO &P function of IO &P functions 34-1 through 34-5 to produce at least a portion of a resulting response. Each local communication resource may be implemented with a local communication resource of the local communication resources 26-1 through 26p of FIG. 4. The number of computing devices in a cluster corresponds to the number of segments in which a data partitioned is divided. For example, if a data partition is divided into five segments, a storage cluster includes five computing devices. Each computing device then stores one of the segments. As an example of operation, segments 29 are received, via the system communication resources 14 of FIG. 1A and via the local communication resources 26-1, for storage by computing device 18-4-1. Subsequent to storage, query components 31 (e.g., a query) are received, via the system communication resources 14 and the local communication resources 26-1, by the computing device 18-4-1 for processing by the IO & P data processing 34-4-1 to produce result components 32 (e.g., query response). The computing device 18-4-1 facilitates sending, via the local communication resources 26-1 and the system communication resources 14, the result components 32 to a result receiving entity.

As will be described in greater detail with reference to one or more subsequent figures, a computing device includes a plurality of nodes and each node includes a plurality of processing core resources. Each processing core resource is capable of executing at least a portion of the IO & P function. In an embodiment, a plurality of processing core resources of one or more nodes executes the IO & P function to produce at least a portion of the resulting response as discussed in FIG. 1.

Figure 7:
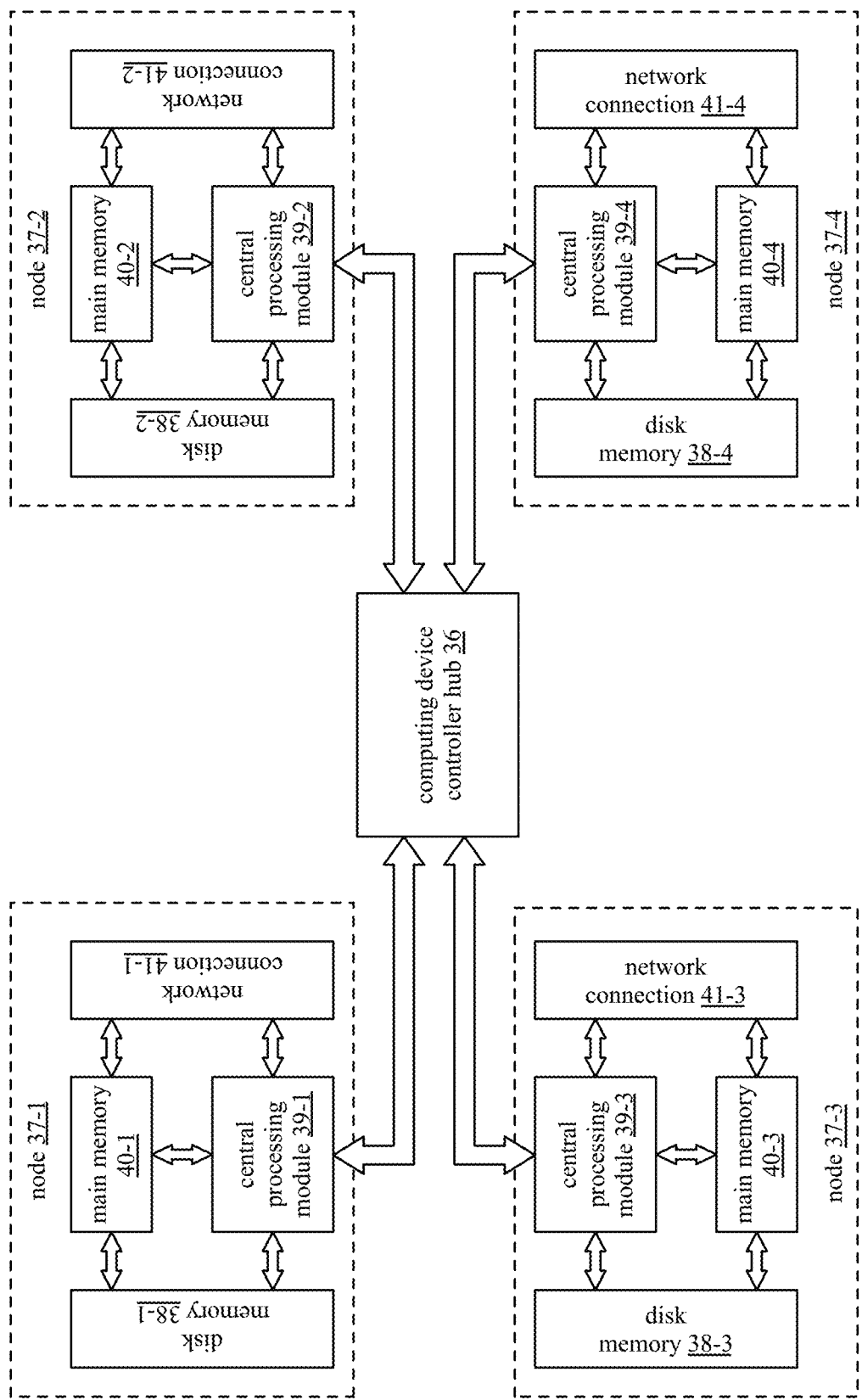
FIG. 7 is a schematic block diagram of an embodiment of a computing device in accordance with the present invention.

FIG. 7 is a schematic block diagram of an embodiment of a computing device 18 that includes a plurality of nodes 37-1 through 37-4 coupled to a computing device controller hub 36. The computing device controller hub 36 includes one or more of a chipset, a quick path interconnect (QPI), and an ultra path interconnection (UPI). Each node 37-1 through 37-4 includes a central processing module of central processing modules 40-1 through 40-4, a main memory of main memories 39-1 through 39-4, a disk memory of disk memories 38-1 through 38-4, and a network connection of network connections 41-1 through 41-4. In an alternate configuration, the nodes share a network connection, which is coupled to the computing device controller hub 36 or to one of the nodes as illustrated in subsequent figures.

In an embodiment, each node is capable of operating independently of the other nodes. This allows for large scale parallel operation of a query request, which significantly reduces processing time for such queries. In another embodiment, one or more node function as co-processors to share processing requirements of a particular function, or functions.

Figure 8:
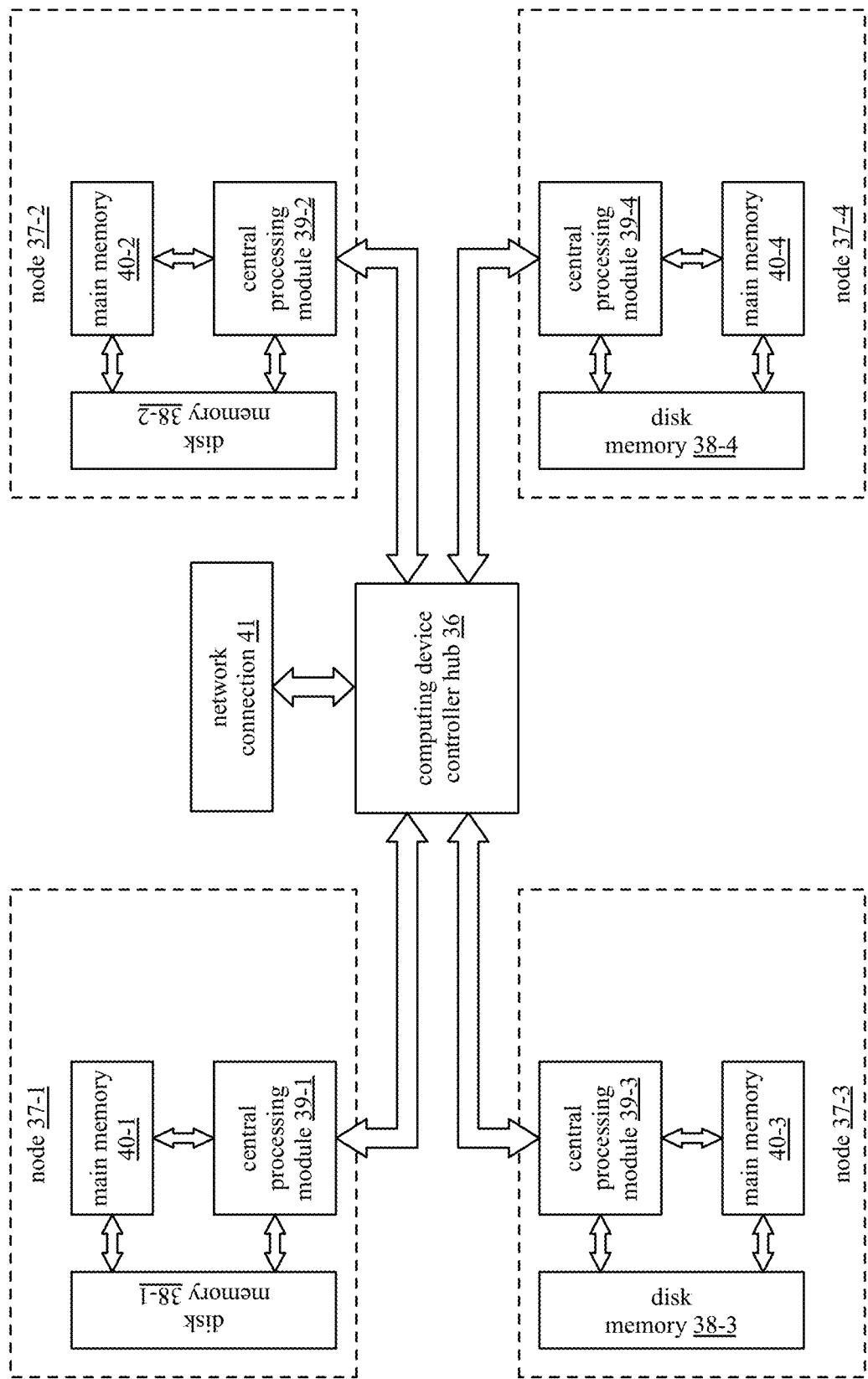
FIG. 8 is a schematic block diagram of another embodiment of a computing device in accordance with the present invention.

FIG. 8 is a schematic block diagram of another embodiment of a computing device is similar to the computing device of FIG. 7 with an exception that it includes a single network connection 41, which is coupled to the computing device controller hub 36. As such, each node coordinates with the computing device controller hub to transmit or receive data via the network connection.

Figure 9:
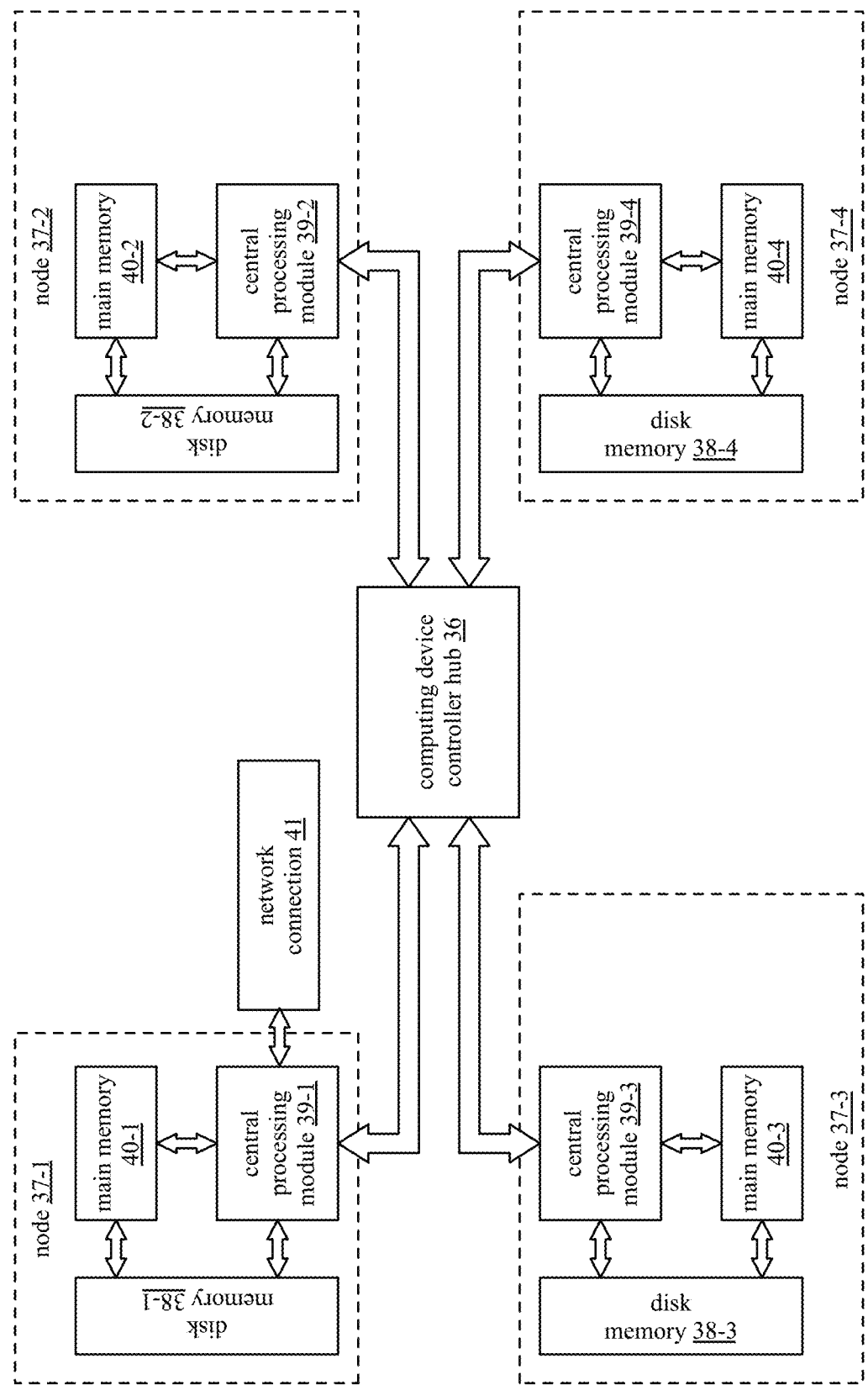
FIG. 9 is a schematic block diagram of another embodiment of a computing device in accordance with the present invention.

FIG. 9 is a schematic block diagram of another embodiment of a computing device is similar to the computing device of FIG. 7 with an exception that it includes a single network connection 41, which is coupled to a central processing module of a node (e.g., to central processing module 40-1 of node 37-1). As such, each node coordinates with the central processing module via the computing device controller hub 36 to transmit or receive data via the network connection.

Figure 10:
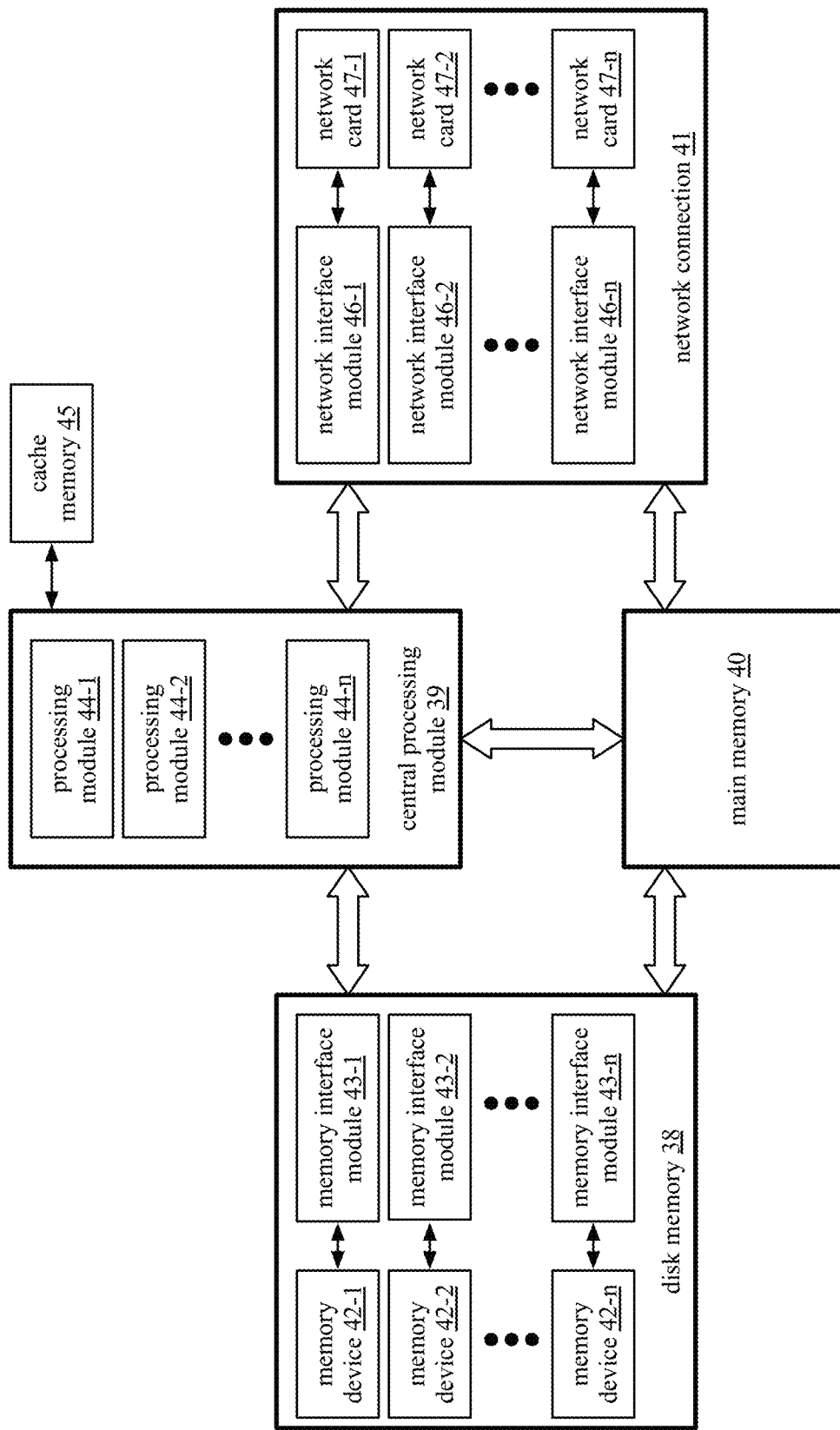
FIG. 10 is a schematic block diagram of an embodiment of a node of a computing device in accordance with the present invention.

FIG. 10 is a schematic block diagram of an embodiment of a node 37 of computing device 18. The node 37 includes the central processing module 39, the main memory 40, the disk memory 38, and the network connection 41. The main memory 40 includes read only memory (RAM) and/or other form of volatile memory for storage of data and/or operational instructions of applications and/or of the operating system. The central processing module 39 includes a plurality of processing modules 44-1 through 44-n and an associated one or more cache memory 45. A processing module is as defined at the end of the detailed description.

The disk memory 38 includes a plurality of memory interface modules 43-1 through 43-n and a plurality of memory devices 42-1 through 42-n. The memory devices 42-1 through 42-n include, but are not limited to, solid state memory, disk drive memory, cloud storage memory, and other non-volatile memory. For each type of memory device, a different memory interface module 43-1 through 43-n is used. For example, solid state memory uses a standard, or serial, ATA (SATA), variation, or extension thereof, as its memory interface. As another example, disk drive memory devices use a small computer system interface (SCSI), variation, or extension thereof, as its memory interface.

In an embodiment, the disk memory 38 includes a plurality of solid state memory devices and corresponding memory interface modules. In another embodiment, the disk memory 38 includes a plurality of solid state memory devices, a plurality of disk memories, and corresponding memory interface modules.

The network connection 41 includes a plurality of network interface modules 46-1 through 46-n and a plurality of network cards 47-1 through 47-n. A network card includes a wireless LAN (WLAN) device (e.g., an IEEE 802.11n or another protocol), a LAN device (e.g., Ethernet), a cellular device (e.g., CDMA), etc. The corresponding network interface modules 46-1 through 46-n include a software driver for the corresponding network card and a physical connection that couples the network card to the central processing module 39 or other component(s) of the node.

The connections between the central processing module 39, the main memory 40, the disk memory 38, and the network connection 41 may be implemented in a variety of ways. For example, the connections are made through a node controller (e.g., a local version of the computing device controller hub 36). As another example, the connections are made through the computing device controller hub 36.

Figure 11:
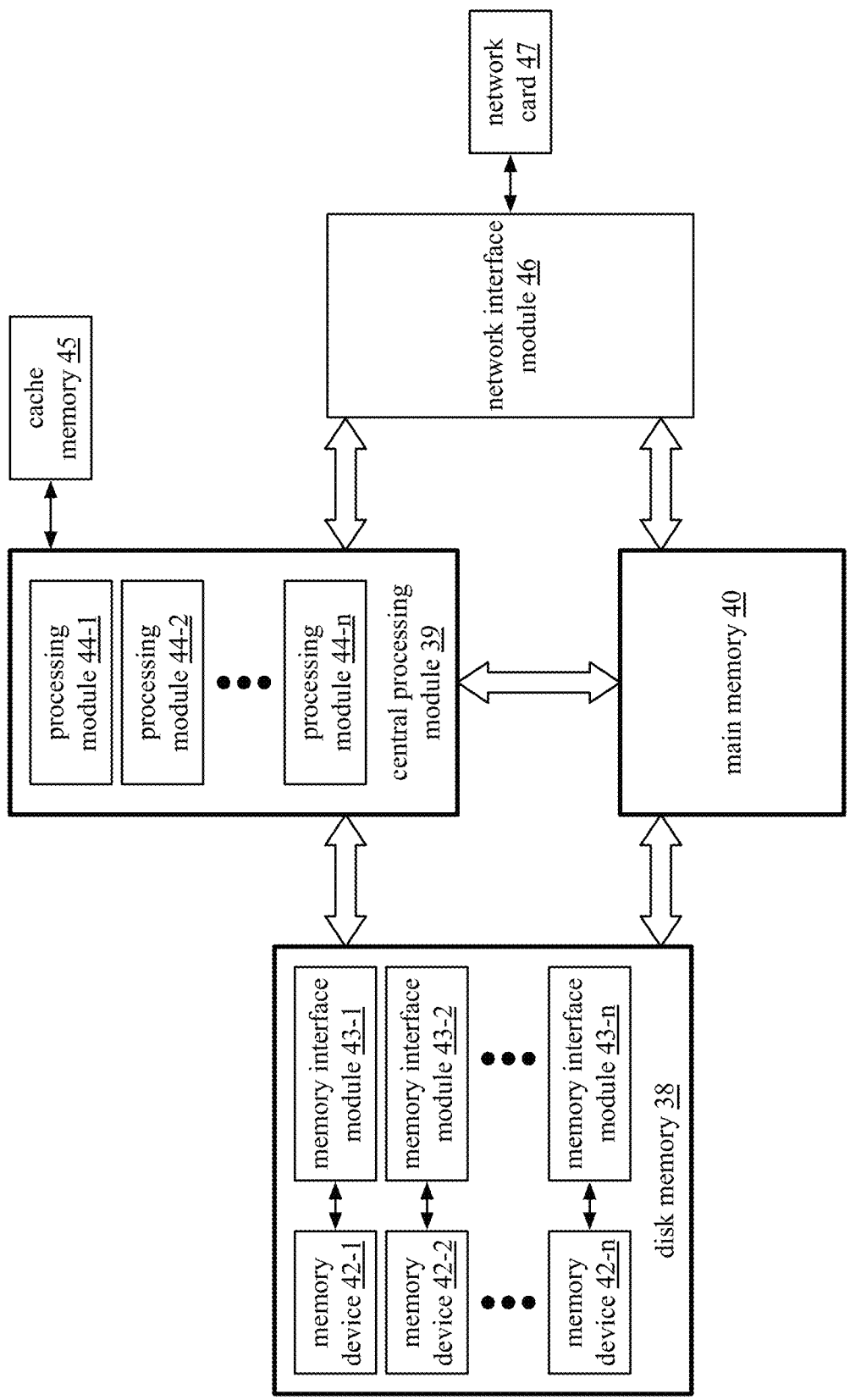
FIG. 11 is a schematic block diagram of an embodiment of a node of a computing device in accordance with the present invention.

FIG. 11 is a schematic block diagram of an embodiment of a node 37 of a computing device 18 that is similar to the node of FIG. 10, with a difference in the network connection. In this embodiment, the node 37 includes a single network interface module 46 and a corresponding network card 47 configuration.

Figure 12:
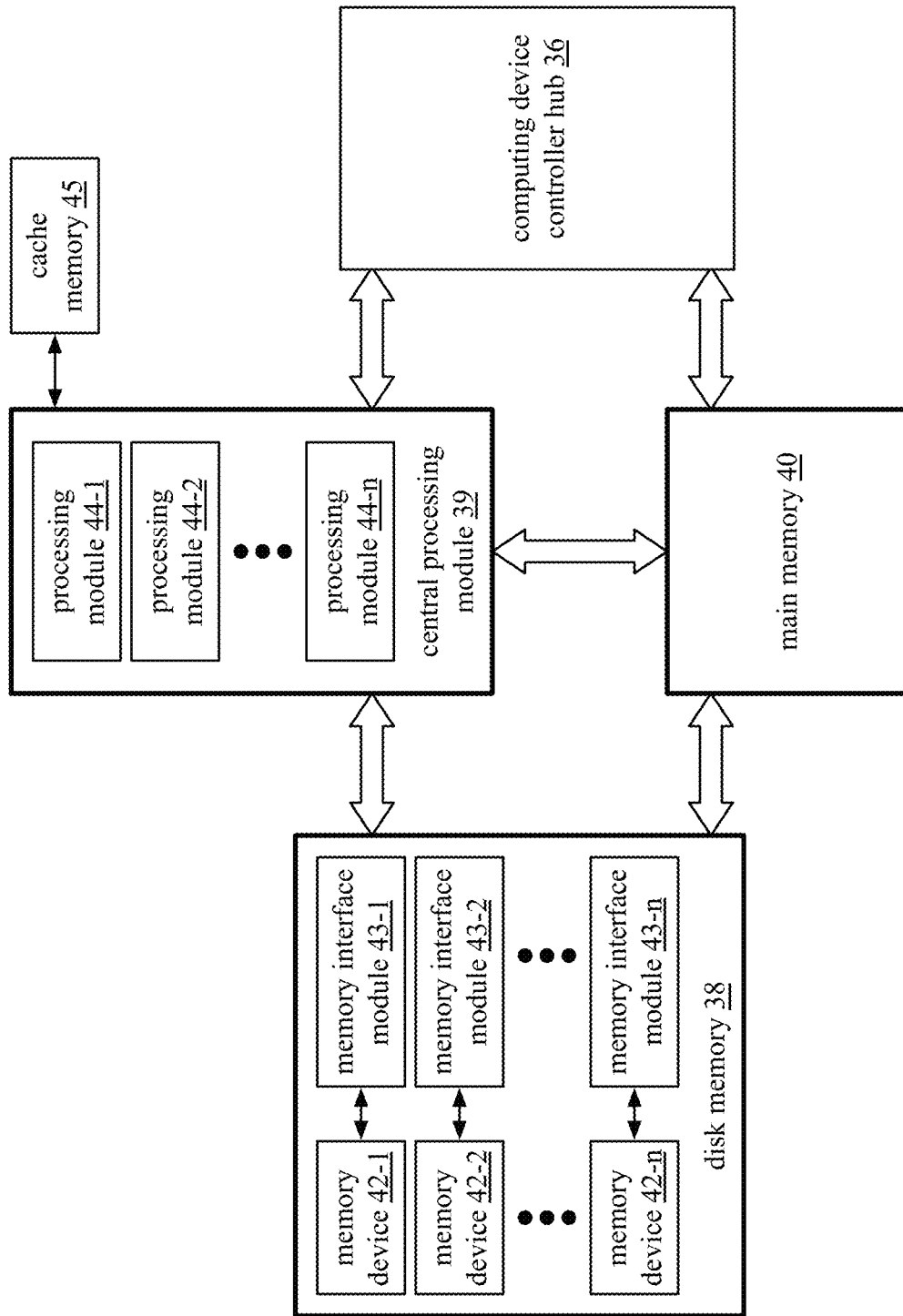
FIG. 12 is a schematic block diagram of an embodiment of a node of a computing device in accordance with the present invention.

FIG. 12 is a schematic block diagram of an embodiment of a node 37 of a computing device 18 that is similar to the node of FIG. 10, with a difference in the network connection. In this embodiment, the node 37 connects to a network connection via the computing device controller hub 36.

Figure 13:
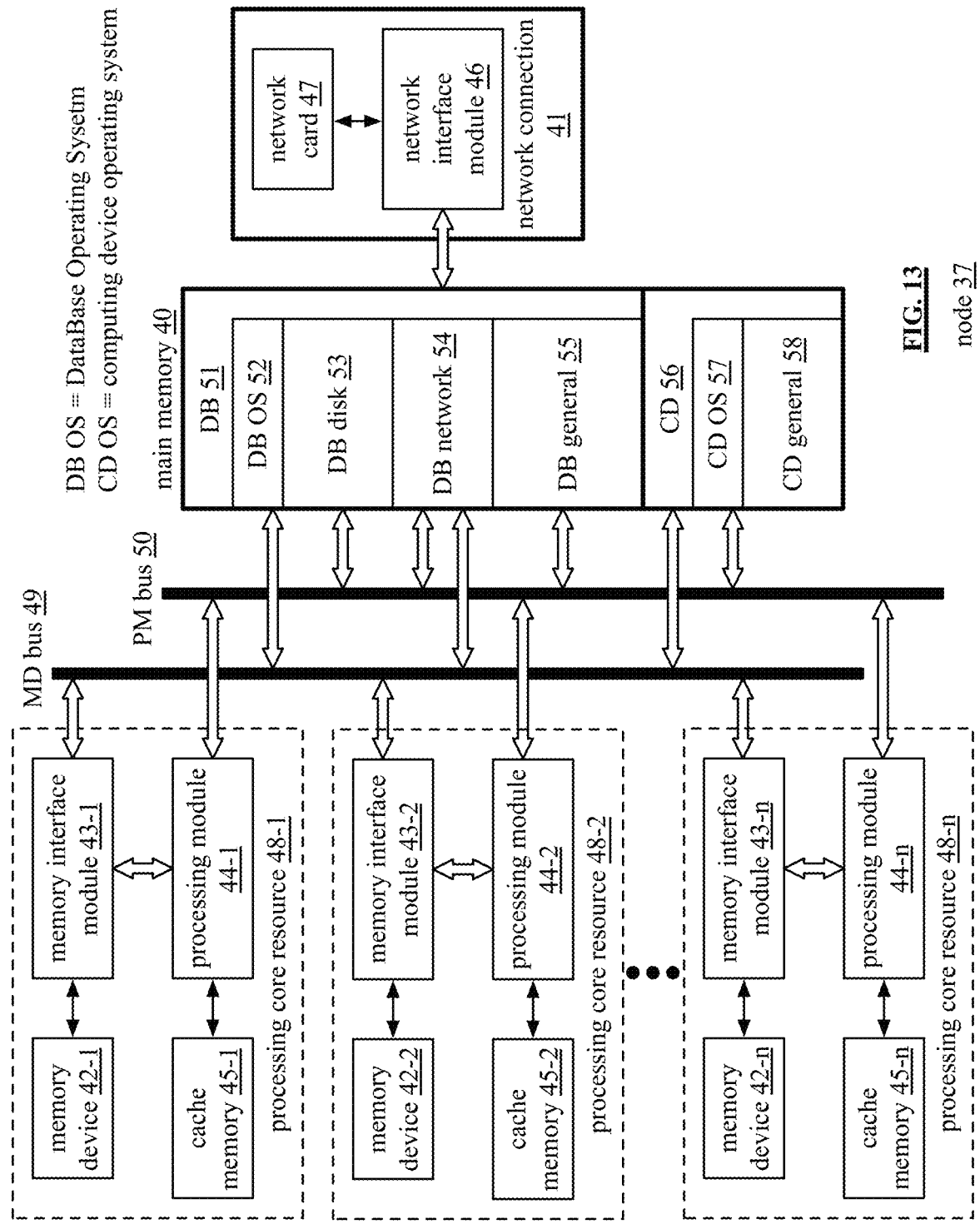
FIG. 13 is a schematic block diagram of an embodiment of a node of a computing device in accordance with the present invention.

FIG. 13 is a schematic block diagram of another embodiment of a node 37 of computing device 18 that includes processing core resources 48-1 through 48-n, a memory device (MD) bus 49, a processing module (PM) bus 50, a main memory 40 and a network connection 41. The network connection 41 includes the network card 47 and the network interface module 46 of FIG. 10. Each processing core resource includes a corresponding processing module of processing modules 44-1 through 44-n, a corresponding memory interface module of memory interface modules 43-1 through 43-n, a corresponding memory device of memory devices 42-1 through 42-n, and a corresponding cache memory of cache memories 45-1 through 45-n. In this configuration, each processing core resource can operate independently of the other processing core resources. This further supports increased parallel operation of database functions to further reduce execution time.

The main memory 40 is divided into a computing device (CD) 56 section and a database (DB) 51 section. The database section includes a database operating system (OS) area 52, a disk area 53, a network area 54, and a general area 55. The computing device section includes a computing device operating system (OS) area 57 and a general area 58.

Note that each section could include more or less allocated areas for various tasks being executed by the database system.

In general, the database OS 52 allocates main memory for database operations. Once allocated, the computing device OS 57 cannot access that portion of the main memory 40. This supports lock free and independent parallel execution of one or more operations.

Figure 14:
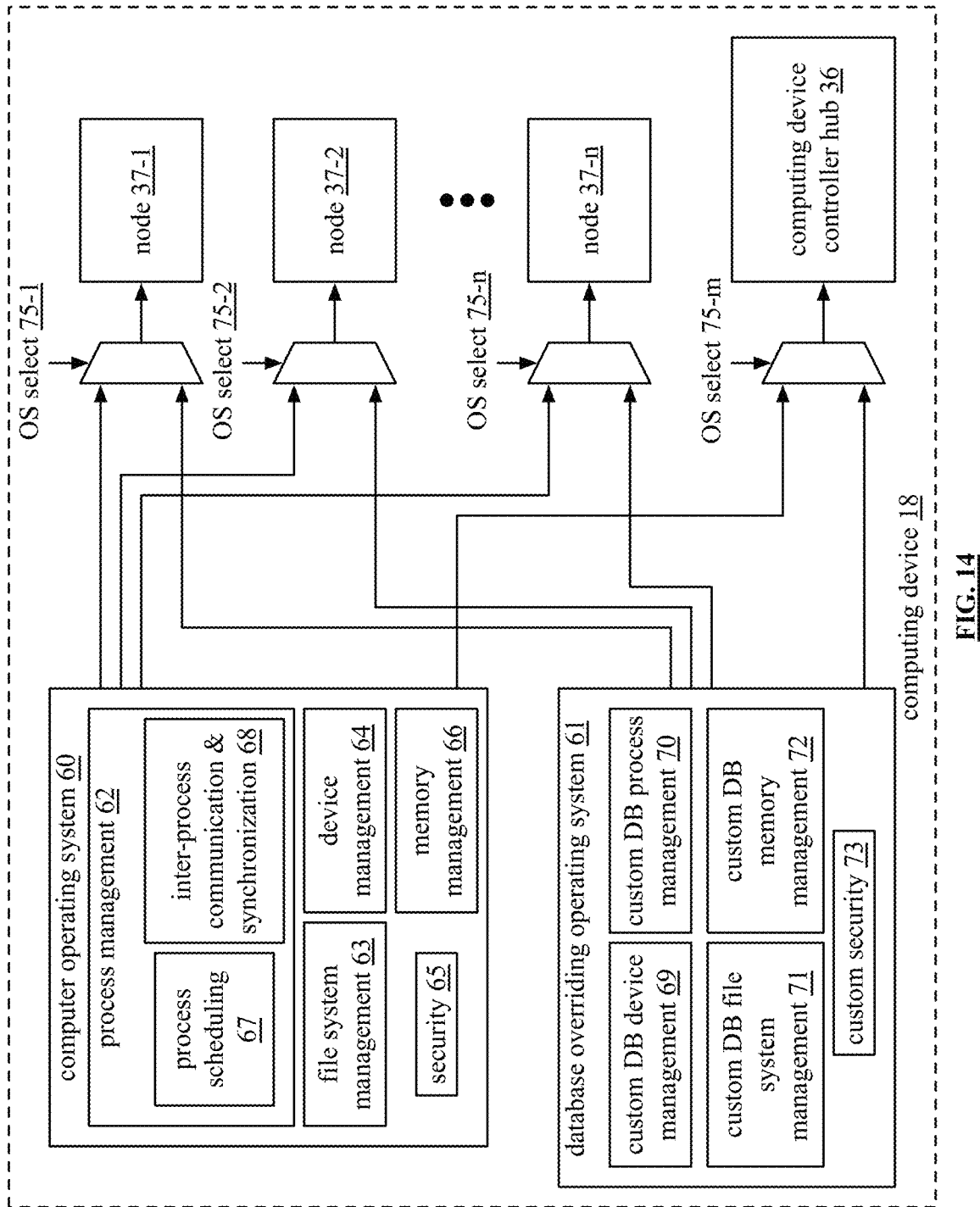
FIG. 14 is a schematic block diagram of an embodiment of operating systems of a computing device in accordance with the present invention.

FIG. 14 is a schematic block diagram of an embodiment of operating systems of a computing device 18. The computing device 18 includes a computer operating system 60 and a database overriding operating system (DB OS) 61. The computer OS 60 includes process management 62, file system management 63, device management 64, memory management 66, and security 65. The processing management 62 generally includes process scheduling 67 and inter-process communication and synchronization 68. In general, the computer OS 60 is a conventional operating system used by a variety of types of computing devices. For example, the computer operating system is a personal computer operating system, a server operating system, a tablet operating system, a cell phone operating system, etc.

The database overriding operating system (DB OS) 61 includes custom DB device management 69, custom DB process management 70 (e.g., process scheduling and/or inter-process communication & synchronization), custom DB file system management 71, custom DB memory management 72, and/or custom security 73. In general, the database overriding OS 61 provides hardware components of a node for more direct access to memory, more direct access to a network connection, improved independency, improved data storage, improved data retrieval, and/or improved data processing than the computing device OS.

In an example of operation, the database overriding OS 61 controls which operating system, or portions thereof, operate with each node and/or computing device controller hub of a computing device (e.g., via OS select 75-1 through 75-n when communicating with nodes 37-1 through 37-n and via OS select 75-m when communicating with the computing device controller hub 36). For example, device management of a node is supported by the computer operating system, while process management, memory management, and file system management are supported by the database overriding operating system. To override the computer OS, the database overriding OS provides instructions to the computer OS regarding which management tasks will be controlled by the database overriding OS. The database overriding OS also provides notification to the computer OS as to which sections of the main memory it is reserving exclusively for one or more database functions, operations, and/or tasks. One or more examples of the database overriding operating system are provided in subsequent figures.

Figure 15:
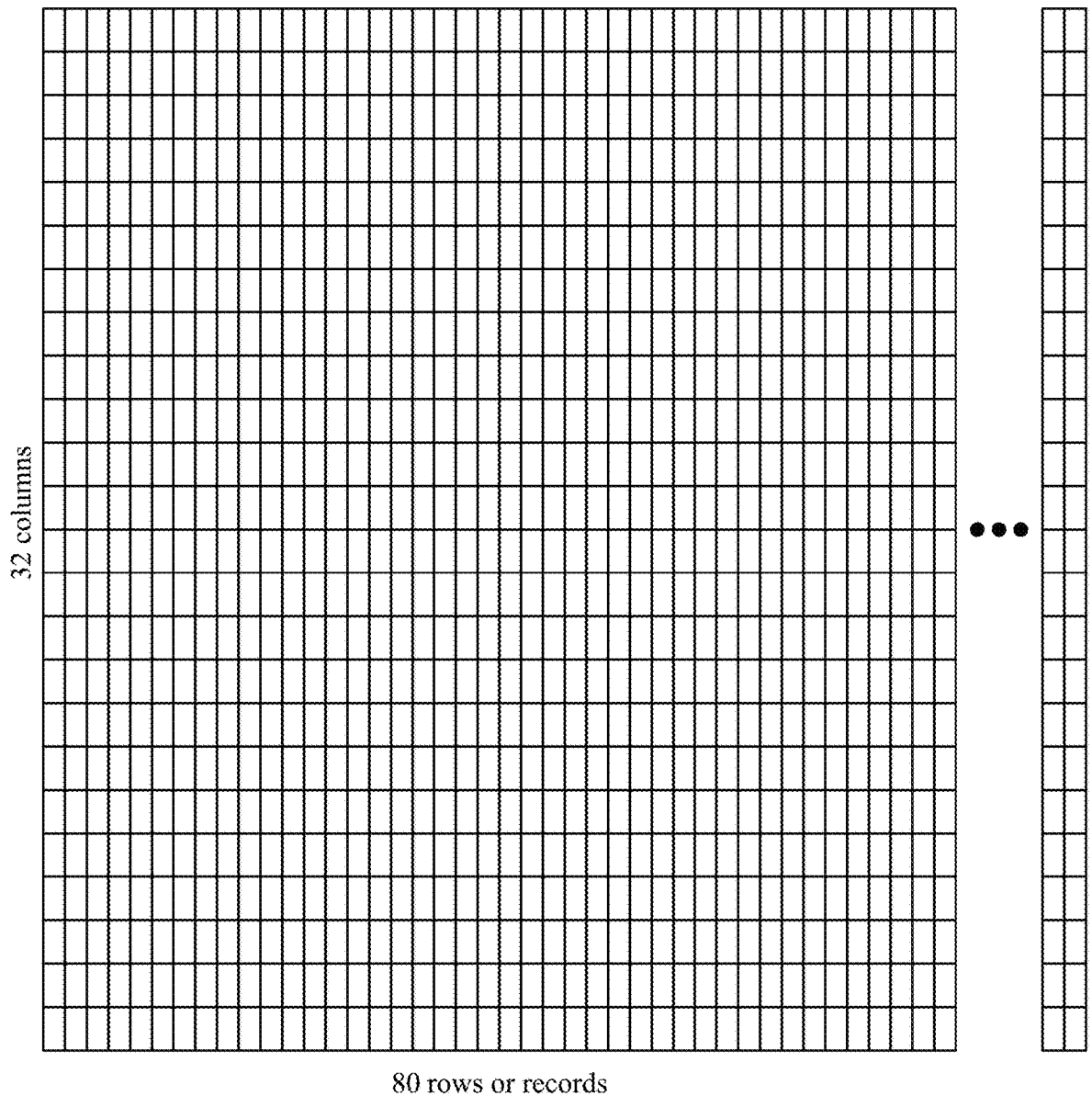

FIGS. 15-25 are schematic block diagrams of an example of processing a table or data set for storage in the database system. FIG. 15 illustrates an example of a data set or table that includes 32 columns and 80 rows, or records, that is received by the parallelized data input-subsystem. This is a very small table, but is sufficient for illustrating one or more concepts regarding one or more aspects of a database system. The table is representative of a variety of data ranging from insurance data, to financial data, to employee data, to medical data, and so on.

Figure 16:
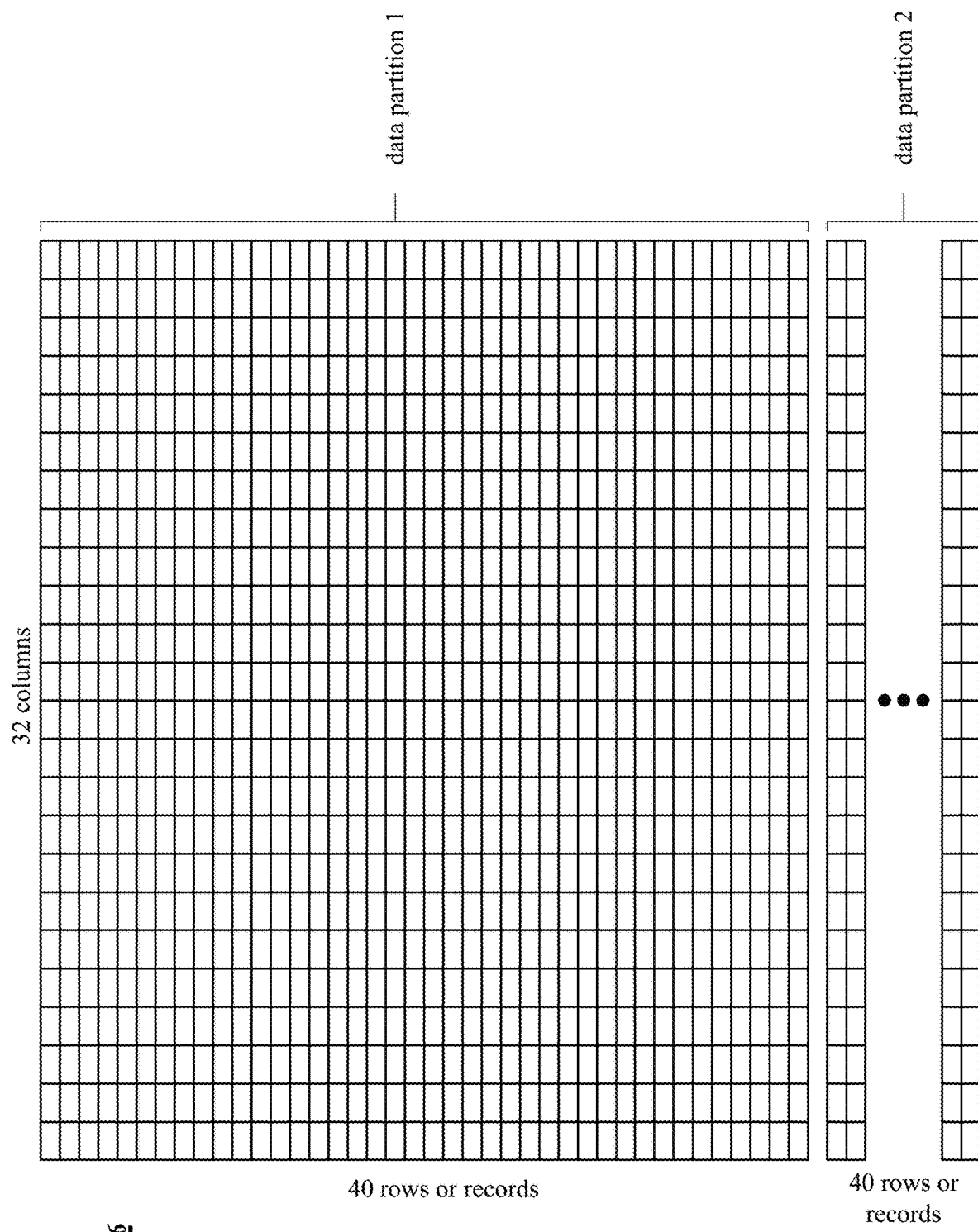

FIG. 16 illustrates an example of the parallelized data input-subsystem dividing the data set into two partitions. Each of the data partitions includes 40 rows, or records, of the data set. In another example, the parallelized data input-subsystem divides the data set into more than two partitions. In yet another example, the parallelized data input-subsystem divides the data set into many partitions and at least two of the partitions have a different number of rows.

Figure 17:
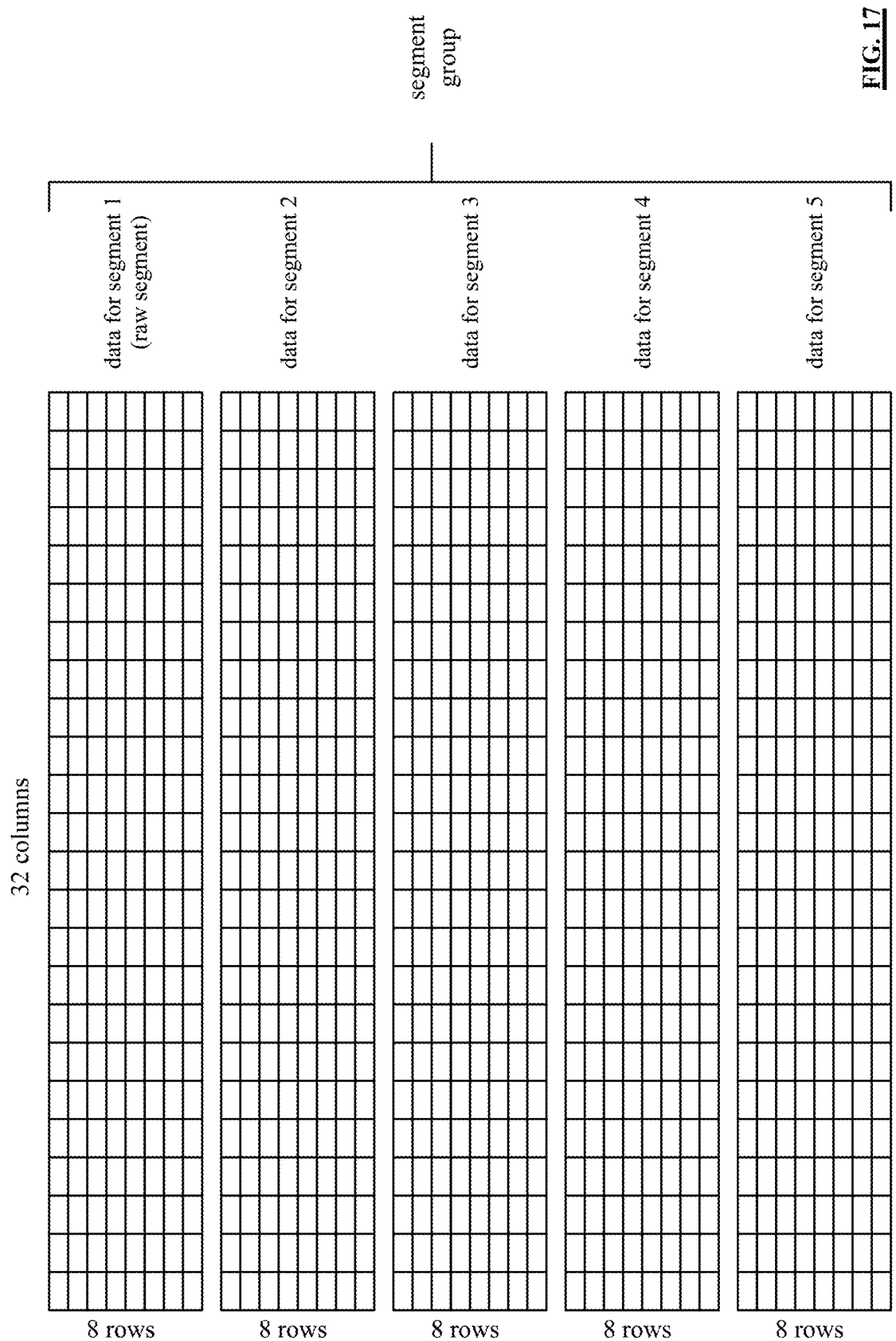

FIG. 17 illustrates an example of the parallelized data input-subsystem dividing a data partition into a plurality of segments to form a segment group. The number of segments in a segment group is a function of the data redundancy encoding. In this example, the data redundancy encoding is single parity encoding from four data pieces; thus, five segments are created. In another example, the data redundancy encoding is a two parity encoding from four data pieces; thus, six segments are created. In yet another example, the data redundancy encoding is single parity encoding from seven data pieces; thus, eight segments are created.

Figures 18, 19, 20:
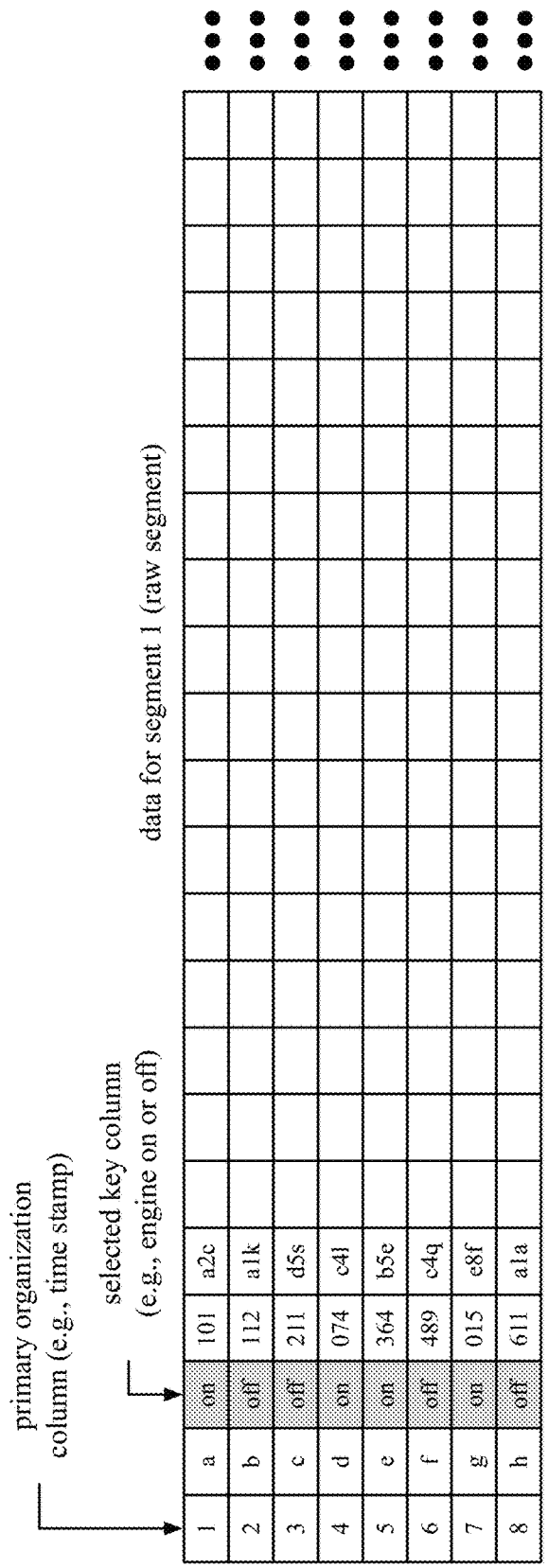

FIG. 18 illustrates an example of data for segment 1 of the segments of FIG. 17. The segment is in a raw form since it has not yet been key column sorted. As shown, segment 1 includes 8 rows and 32 columns. The third column is selected as the key column and the other columns stored various pieces of information for a given row (i.e., a record).

As an example, the table is regarding a fleet of vehicles. Each row represents data regarding a unique vehicle. The first column stores a vehicle ID, the second column stores make and model information of the vehicle. The third column stores data as to whether the vehicle is on or off. The remaining columns store data regarding the operation of the vehicle such as mileage, gas level, oil level, maintenance information, routes taken, etc.

With the third column selected as the key column, the other columns of the segment are to be sorted based on the key column. Prior to sorted, the columns are separated to form data slabs. As such, one column is separated out to form one data slab.

FIG. 19 illustrates an example of the parallelized data input-subsystem dividing segment 1 of FIG. 18 into a plurality of data slabs. A data slab is a column of segment 1. In this figure, the data of the data slabs has not been sorted. Once the columns have been separated into data slabs, each data slab is sorted based on the key column. Note that more than one key column may be selected and used to sort the data slabs based on two or more other columns.

FIG. 20 illustrates an example of the parallelized data input-subsystem sorting the each of the data slabs based on the key column. In this example, the data slabs are sorted based on the third column which includes data of "on" or "off". The rows of a data slab are rearranged based on the key column to produce a sorted data slab. Each segment of the segment group is divided into similar data slabs and sorted by the same key column to produce sorted data slabs.

Figure 21:
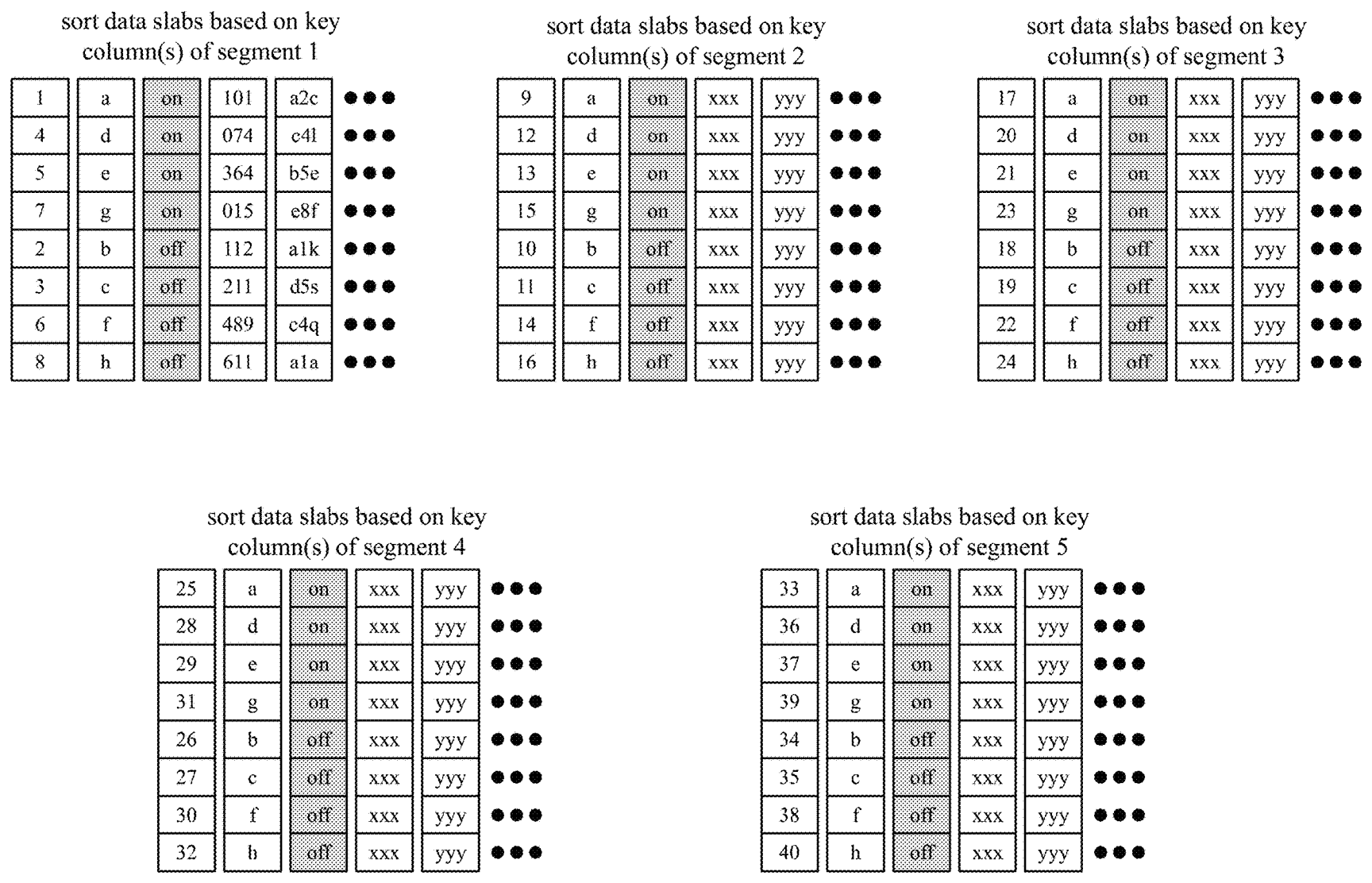

FIG. 21 illustrates an example of each segment of the segment group sorted into sorted data slabs. The similarity of data from segment to segment is for the convenience of illustration. Note that each segment has its own data, which may or may not be similar to the data in the other sections.

Figure 22:
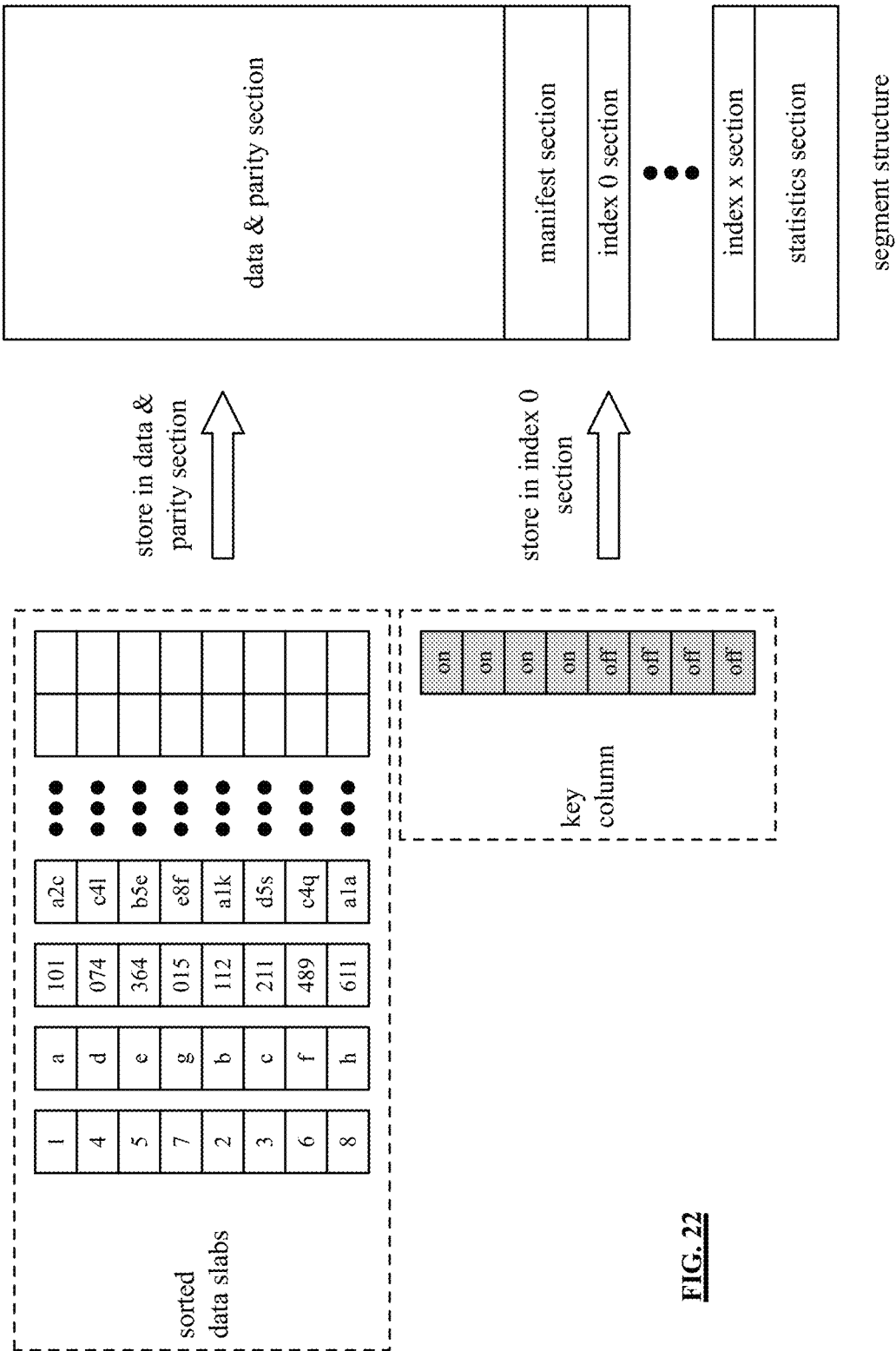

FIG. 22 illustrates an example of a segment structure for a segment of the segment group. The segment structure for a segment includes the data & parity section, a manifest section, one or more index sections, and a statistics section. The segment structure represents a storage mapping of the data (e.g., data slabs and parity data) of a segment and associated data (e.g., metadata, statistics, key column(s), etc.) regarding the data of the segment. The sorted data slabs of FIG. 16 of the segment are stored in the data & parity section of the segment structure. The sorted data slabs are stored in the data & parity section in a compressed format or as raw data (i.e., non-compressed format). Note that a segment structure has a particular data size (e.g., 32 Giga-Bytes) and data is stored within in coding block sizes (e.g., 4 Kilo-Bytes).

Before the sorted data slabs are stored in the data & parity section, or concurrently with storing in the data & parity section, the sorted data slabs of a segment are redundancy encoded. The redundancy encoding may be done in a variety of ways. For example, the redundancy encoding is in accordance with RAID 5, RAID 6, or RAID 10. As another example, the redundancy encoding is a form of forward error encoding (e.g., Reed Solomon, Trellis, etc.).

The manifest section stores metadata regarding the sorted data slabs. The metadata includes one or more of, but is not limited to, descriptive metadata, structural metadata, and/or administrative metadata. Descriptive metadata includes one or more of, but is not limited to, information regarding data such as name, an abstract, keywords, author, etc. Structural metadata includes one or more of, but is not limited to, structural features of the data such as page size, page ordering, formatting, compression information, redundancy encoding information, logical addressing information, physical addressing information, physical to logical addressing information, etc. Administrative metadata includes one or more of, but is not limited to, information that aids in managing data such as file type, access privileges, rights management, preservation of the data, etc.

The key column is stored in an index section. For example, a first key column is stored in index #0. If a second key column exists, it is stored in index #1. As such, for each key column, it is stored in its own index section. Alternatively, one or more key columns are stored in a single index section.

The statistics section stores statistical information regarding the segment and/or the segment group. The statistical information includes one or more of, but is not limited, to number of rows (e.g., data values) in one or more of the sorted data slabs, average length of one or more of the sorted data slabs, average row size (e.g., average size of a data value), etc. The statistical information includes information regarding raw data slabs, raw parity data, and/or compressed data slabs and parity data.

Figure 23:
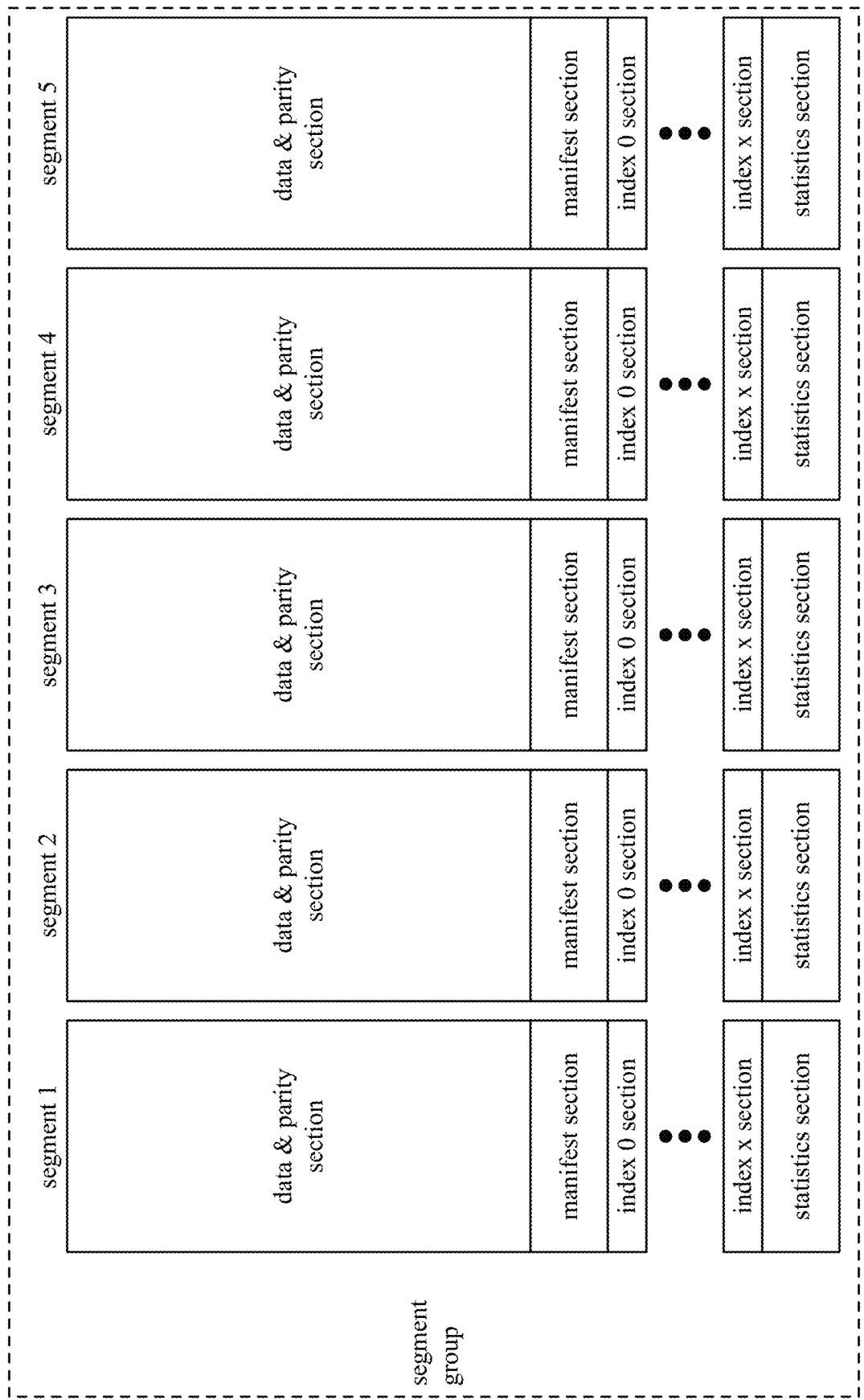

FIG. 23 illustrates the segment structures for each segment of a segment group having five segments. Each segment includes a data & parity section, a manifest section, one or more index sections, and a statistic section. Each segment is targeted for storage in a different computing device of a storage cluster. The number of segments in the segment group corresponds to the number of computing devices in a storage cluster. In this example, there are five computing devices in a storage cluster. Other examples include more or less than five computing devices in a storage cluster.

Figure 24:
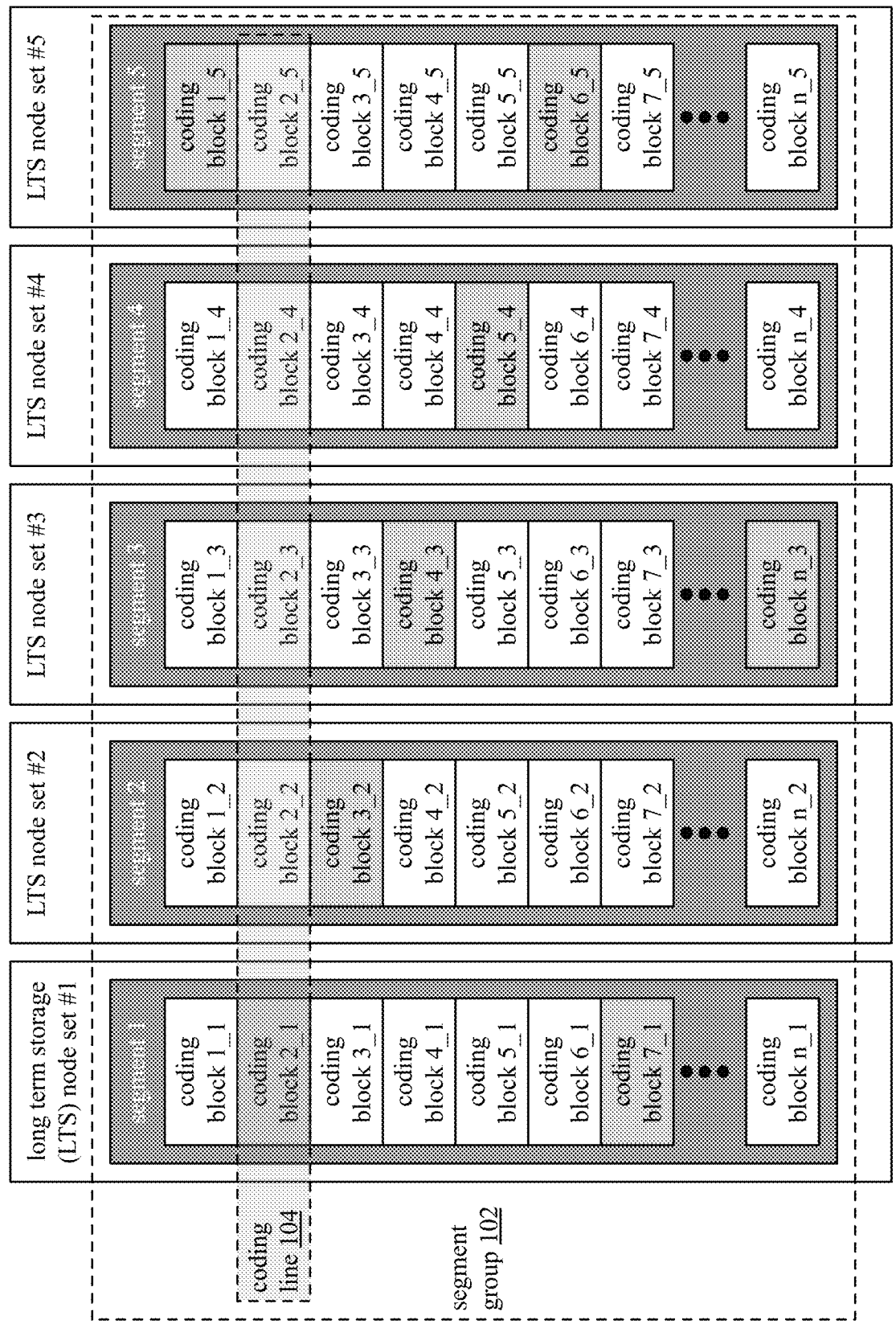

FIG. 24 illustrates an example of redundancy encoding using single parity encoding. The data of each segment of a second group 102 is divided into data blocks (e.g., 4 K bytes). The data blocks of the segments are logically aligned such that the first data blocks of the segments are aligned. For example, coding block 1_1 (the first number represents the code block number in the segment and the second number represents the segment number, thus 1_1 is the first code block of the first segment) is aligned with the first code block of the second segment (code block 1_2), the first code block of the third segment (code block 1_3), and the first code block of the fourth segment (code block 1_4). This forms a data portion of a coding line 104.

The four data coding blocks are exclusively ORed together to form a parity coding block, which is represented by the gray shaded block 1_5. The parity coding block is placed in segment 5 as the first coding block. As such, the first coding line includes four data coding blocks and one parity coding block. Note that the parity coding block is typically only used when a data code block is lost or has been corrupted. Thus, during normal operations, the four data coding blocks are used.

To balance the reading and writing of data across the segments of a segment group, the positioning of the four data coding blocks and the one parity coding block are distributed. For example, the position of the parity coding block from coding line to coding line is changed. In the present example, the parity coding block, from coding line to coding line, follows the modulo pattern of 5, 1, 2, 3, and 4. Other distribution patterns may be used. In some instances, the distribution does not need to be equal. Note that the redundancy encoding may be done by one or more computing devices 18 of the parallelized data input sub-system 11 and/or by one or more computing devices of the parallelized data store, retrieve, &/or process sub-system 12.

Figure 25:
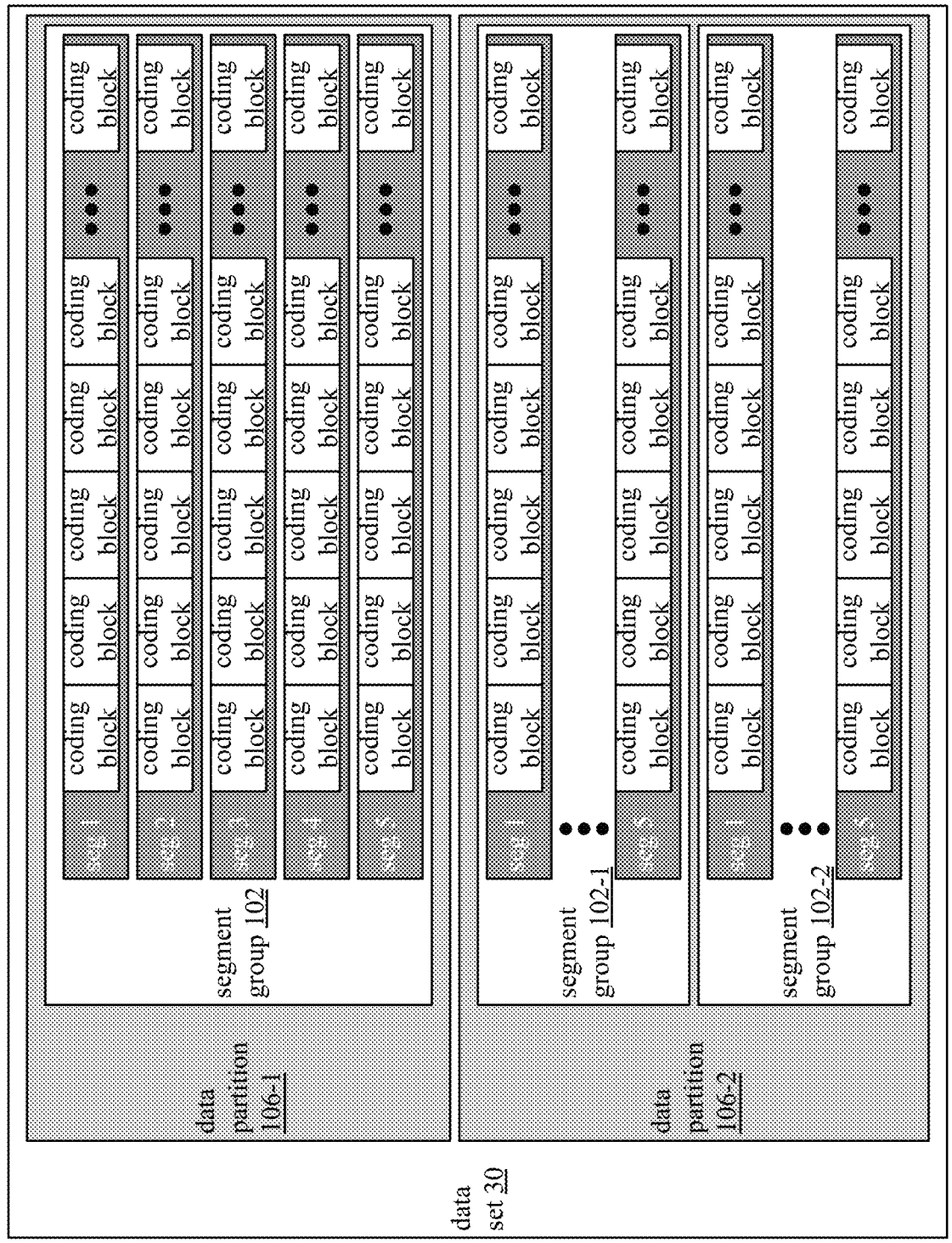

FIG. 25 illustrates an overlay of the dividing of a data set 30 (e.g., a table) into data partitions 106-1 and 106-2. Each partition is then divided into one or more segment groups 102. Each segment group 102 includes a number of segments. Each segment is further divided into coding blocks, which include data coding blocks and parity coding blocks.

Figure 26:
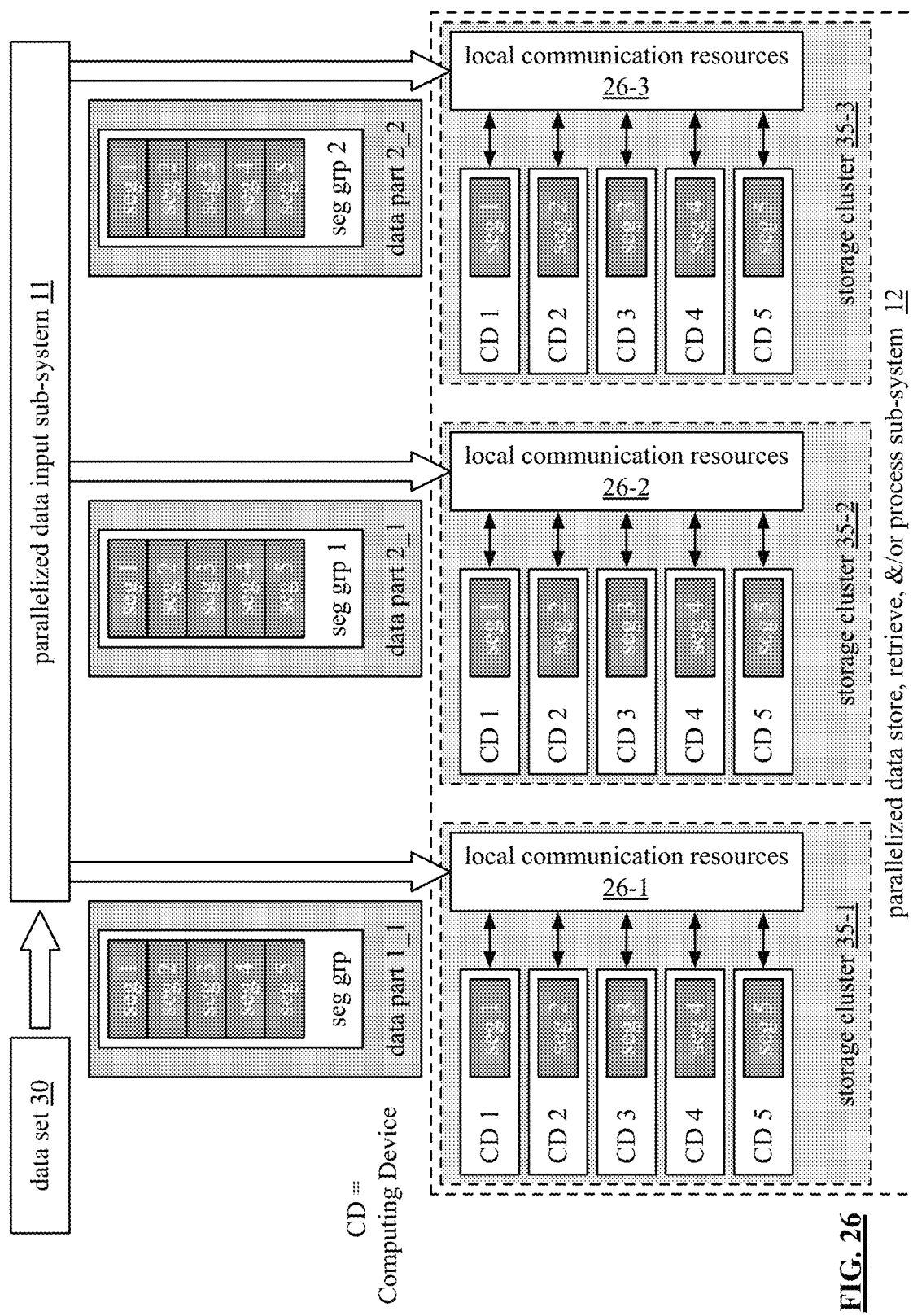
FIGS. 26-28 are schematic block diagrams of an example of storing a processed table or data set in the database system in accordance with the present invention.

FIG. 26 is a schematic block diagrams of an example of storing a processed table or data set 30 in the database system 10. In this example, the parallelized data input sub-system 11 sends, via local communication resources 26-1 through 26-3, segment groups of data partitions of the data set 30 (e.g., table) to storage clusters 35-1 through 35-3 of the parallelized data store, retrieve, &/or process sub-system 12. In this example, each storage cluster includes five computing devices, as such, a segment group includes five segments.

Each storage cluster has a primary computing device 18 for receiving incoming segment groups. The primary computing device 18 is randomly selected for each ingesting of data or is selected in a predetermined manner (e.g., a round robin fashion). The primary computing device 18 of each storage cluster 35 receives the segment group and then provides the segments to the computing devices 18 in its cluster 35; including itself Alternatively, the parallelized data input-section 11 sends, via a local communication resource 26, each segment of a segment group to a particular computing device 18 within the storage clusters 35.

Figure 27:
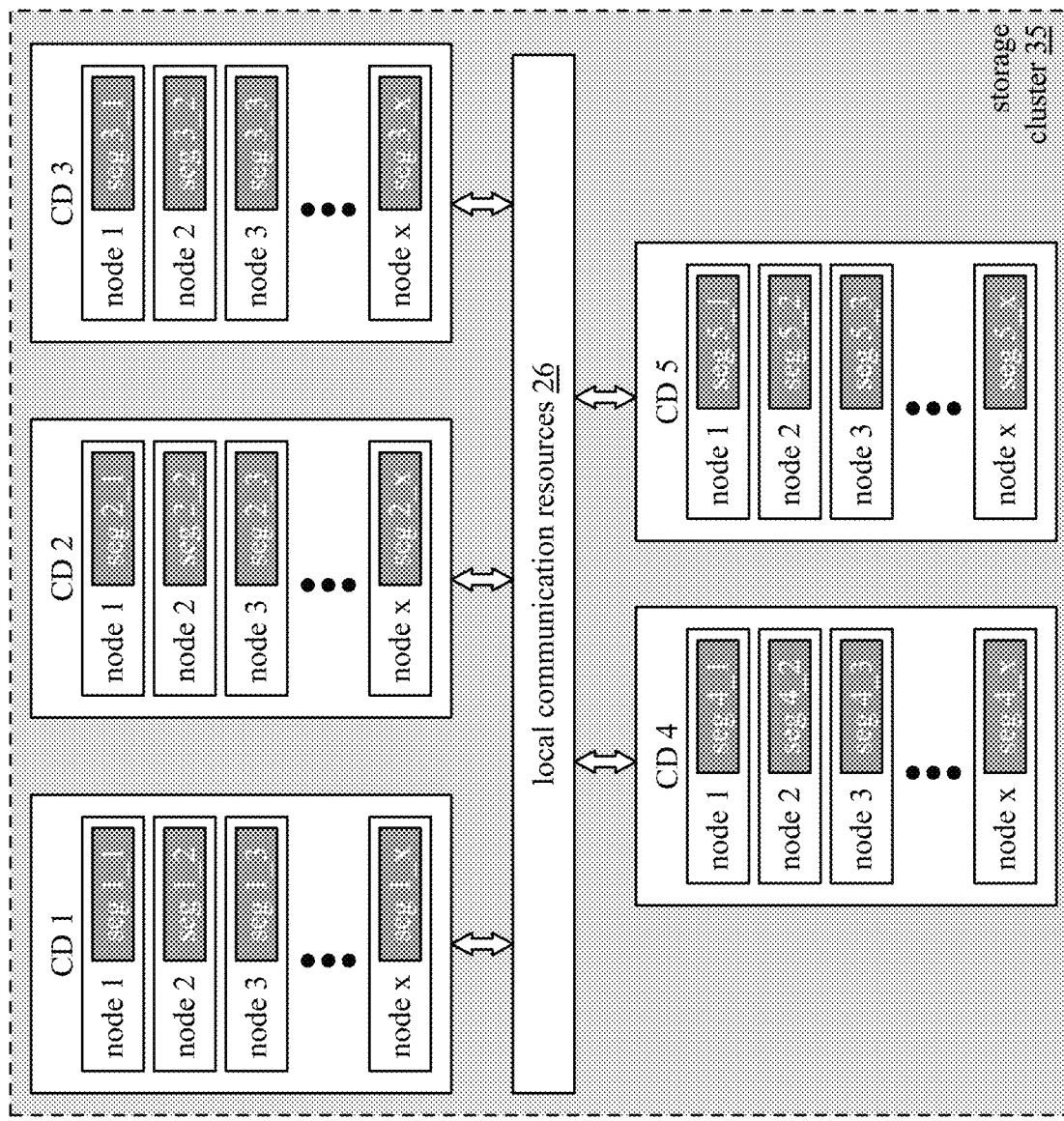

FIG. 27 illustrates a storage cluster 35 distributing storage of a segment group among its computing devices and the nodes within the computing device. Within each computing device, a node is selected as a primary node for dividing a segment into segment divisions and distributing the segment divisions to the nodes; including itself. For example, node 1 of computing device (CD) 1 receives segment 1. Having x number of nodes in the computing device 1, node 1 divides the segment into x segment divisions (e.g., seg 1_1 through seg 1_x, where the first number represents the segment number of the segment group and the second number represents the division number of the segment). Having divided the segment into divisions (which may include an equal amount of data per division, an equal number of coding blocks per division, an unequal amount of data per division, and/or an unequal number of coding blocks per division), node 1 sends the segment divisions to the respective nodes of the computing device.

Figure 28:
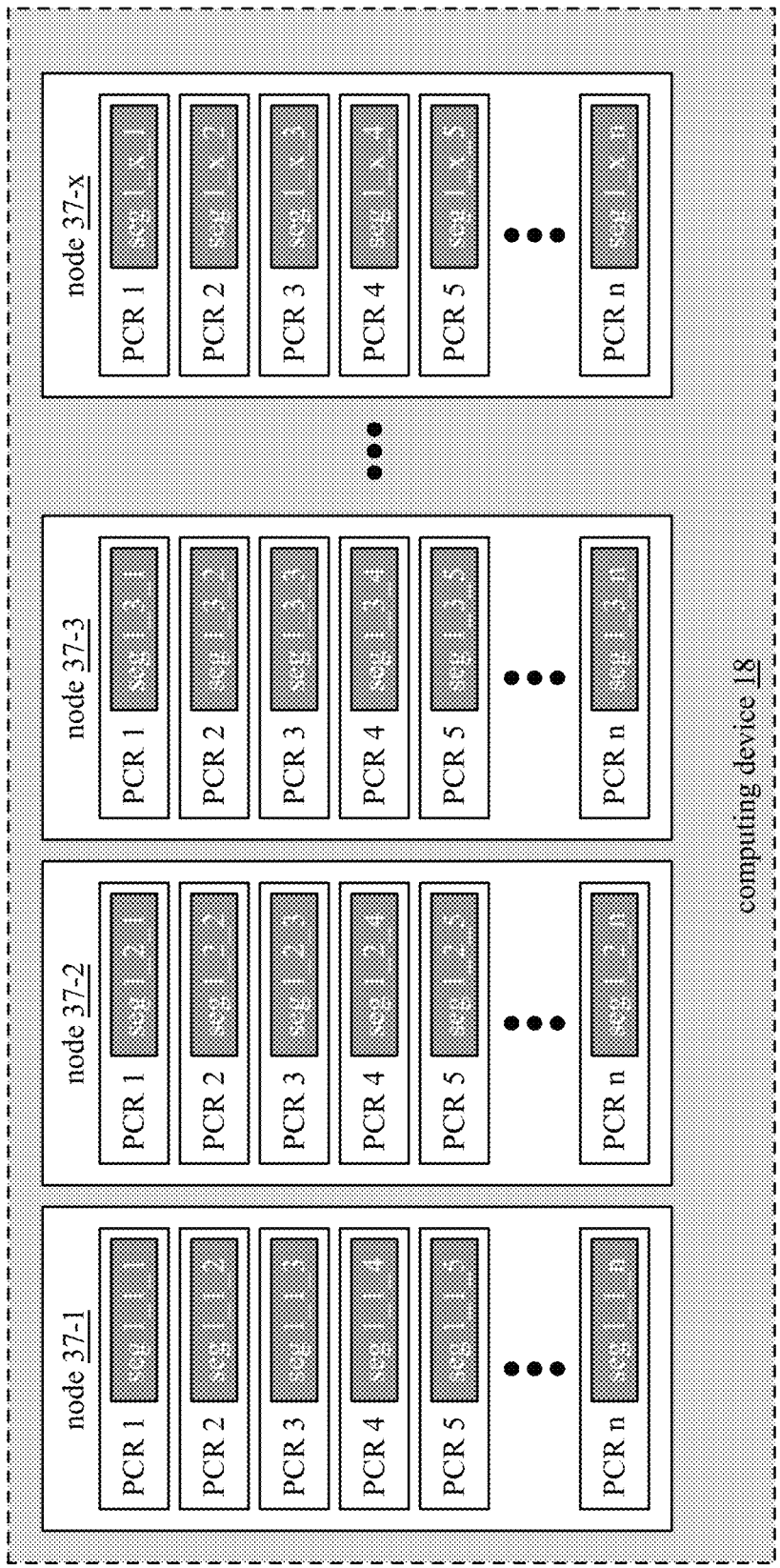

FIG. 28 illustrates notes 37-1 through 37-x of a computing device 18 distributing storage of a segment division among its processing core resources 48 (PCR). Within each node, a processing core resource (PCR) is selected as a primary PCR for dividing a segment division into segment sub-divisions and distributing the segment sub-divisions to the other PCRs of the node; including itself. For example, PCR 1 of node 1 of computing device 1 receives segment division 1_1. Having n number of PCRs in node 1, PCR 1 divides the segment division 1 into n segment sub-divisions (e.g., seg 1_1_1 through seg 1_1_n, where the first number represents the segment number of the segment group, the second number represents the division number of the segment, and the third number represents the sub-division number). Having divided the segment division into sub-divisions (which may include an equal amount of data per sub-division, an equal number of coding blocks per sub-division, an unequal amount of data per sub-division, and/or an unequal number of coding blocks per sub-division), PCR 1 sends the segment sub-divisions to the respective PCRs of node 1 of computing device 1.

Figure 29:
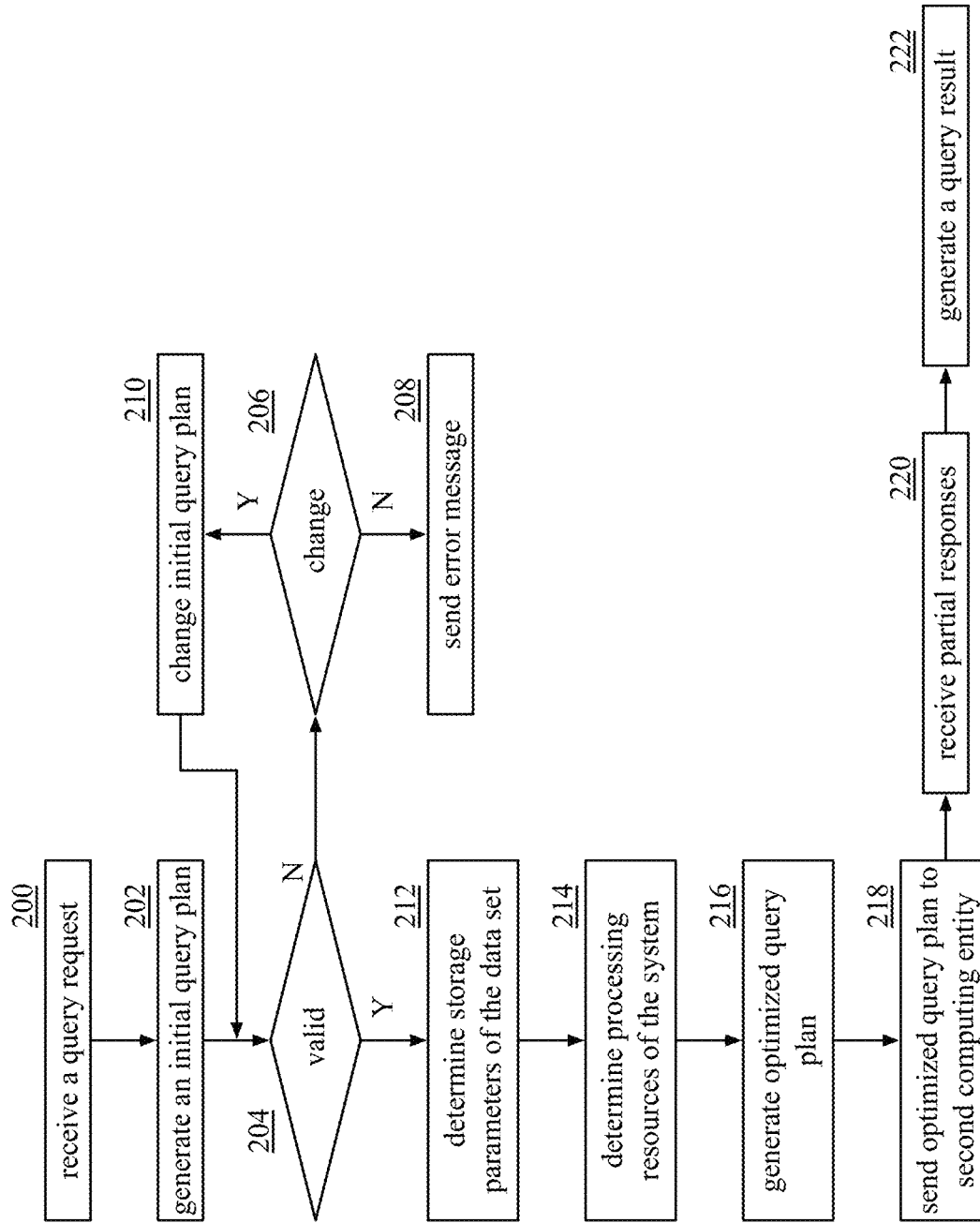
FIG. 29 is a logic diagram of an example of a method for creating a query plan for execution within the database system in accordance with the present invention.

FIG. 29 is a logic diagram of an example of a method for creating a query plan for execution by a computing entity of the parallelized query & results sub-system 12 of the database system 10. The computing entity includes one or more of: one or more computing devices of the query & result sub-system 13, one or more first nodes of the one or more computing devices, and one or more processing core resources of the one or more nodes.

The method begins at step 200 where the computing entity receives a query request. The query request identifies a data set that is the subject of the query. In addition, the query request is formatted in accordance with a generic query format that corresponds to a generic database language. For example, a user desires to execute a database function (e.g., a query) on a data set (e.g., a table) that, from the user's perspective, is contained in a particular file type (e.g., a spreadsheet, business analytic software, or other data relational software). As a non-exhaustive example, the database function, or query, includes generating a billing report, generating a sales report, generating a performance report, identifying certain data files based on one or more search elements (e.g., date, time, department, age, etc.), organizing selected data in a certain way, calculating new data from particular existing data, etc.

An application programming interface (API), such as Open Database Connectivity (ODBC), Java Database Connectivity (JDCB), or Spark, generates the query request based on the requested database function, which may further be based on the particular file type. For example, the API generates an algorithm using a generic Structure Query Language (SQL) instruction set from the requested database function and the particular file type. The algorithm equates to the query request. In another example, the query request is received as the algorithm programmed in accordance with a generic SQL instruction set.

SQL is a programming language for the specific purpose of querying data contained in a relational database. SQL is generally divided into programming language elements of clauses, expressions, predicates, queries, and statements. A clause is a component of a statement and/or a query. An expression produces one or more values and/or produces a table of rows and columns. A predicate is a condition that typically produces a result of true, false, or unknown. A statement effects the schemata and/or data. A statement may also control transactions, process flow, connections, sessions, and/or diagnostics.

A query element of an SQL programming language retrieves data based on specific criteria. This query element is different that the query request of the present method. The query request being received by the computing entity of the query & result sub-system 13 is an algorithm programmed using an SQL programming language, while a query element is a function of an SQL programming language. Note that there are a variety of permutations of SQL based on vendor and/or other factors. The query request being received by the computing entity may be programmed in accordance with one or more of the SQL permutations (e.g., persistent storage mode SQL, procedural SQL, SQL procedural language, stored procedural language, transact SQL, etc.).

The method continues at step 202 where the computing entity generates an initial query plan based on the query request and a query instruction set of the database system. For example, the computing entity interprets the SQL instructions of the query request, determines the desired function(s) contained within the request based on the SQL instructions, and generates the initial query plan using instructions of the query instruction set. The initial query plan is created for execution by the computing entity for ease of verification. In another embodiment, the initial query plan is created for executed by the computing entity and/or one or more other computing entities.

The query instruction set includes custom instructions that are unique for the database system 10. The custom instructions are for storing, processing, manipulating, calculating, retrieving, sorting, and/or interpreting data of a data set (e.g., a table) that are optimized, and/or customized, for the hardware architecture of the database system and the operating system architecture of the database system. In addition to the custom instructions, the query instruction set may further include one or more generic SQL programming language elements and/or instructions. A non-exhausted list of instructions of the instruction set is provided below with reference to FIG. 32 and a more detailed example of generating the initial query plan is discussed with reference to FIG. 30.

The method continues at step 204 where the computing entity determines whether the initial query plan is valid. For example, the initial query plan is an algorithm programmed in accordance with the query instruction set of the database system. During validation, the computing entity is verifying that the initial query plan achieves the desired functionality of the query request (e.g., it will generate the desired report, it will sort the data as desired, it will calculate new data based on existing data, etc.). In addition, the computing entity also verifies that execution of the initial query plan will not hang up. As an example of hang up, execution of a first thread is dependent on an output of second thread and execution of the second thread is dependent on an output of the first thread. As another example of hang up, the execution of the initial plan follows a path the leads to a condition that will never occur.

If the initial query plan is not valid, the method continues at step 206 where the computing entity determines whether the query request can be changed. For example, the computing entity determines whether it can ascertain meaning for the various aspects of the query request. If it can, the computing entity determines that it can change the query request and, if it can't, the computing entity determines that it can't change the query request. If the computing entity cannot change the query request, the method continues at step 208 where the computing entity sends an error message to a requesting device (i.e., the computing device that sent the query request).

If the computing entity determines that it can change the query request, the method continues at step 210 where the computing entity changes the query request. For example, once the computing entity determines the meaning of the various aspects of the query request, it identifies a portion of the query request that has a programming inconsistency with its intended meaning. As a specific example, the computing entity interprets the generic SQL language of the query request to generate state transition diagram(s), flow chart(s), process block diagram(s), and/or state diagram(s) to depict the intended aspects of the query request.

The computing entity interprets the diagram(s), and/or chart(s) to identify a portion of the query request that is inconsistent with other portions of the query request. As a specific example, the computing entity identifies a decision block that deadlocks for a given input. As another specific example, the computing entity identifies an arithmetic-logic function that has an input that comes from a non-existent source. Having identified the portion of the query request, the computing entity creates a new SQL sequence for the portion of the query request to create a changed query request.

The computing entity creates a new initial query plan from the changed query request. The method repeats at step 204 for the new initial query plan. The method stays in this loop until the computing entity has created an initial query plan that is valid, a retry mechanism expires, or the computing entity determines it cannot correctly change the query plan.

When the initial query plan is valid, the method continues at step 212 where the computing entity determines storage parameters regarding how the data set is stored within the database system. The storage parameters include two or more of:

number of rows of the data set;
number of columns of the data set;
number of partitions the data set was divided into;
a number of segments each partition was divided into;
a data redundancy encoding scheme;
a number of storage clusters storing the data set;
a number of computing devices within a storage cluster;
a number of nodes within a computing device; and
a number of processing core resources within a node.

The computing entity can determine the storage parameters in a variety of ways. For example, the computing entity retrieves the storage parameters from a lookup table based on identity of the data set (e.g., an index for a table, a name of the table, etc.). As another example, the computing entity sends a storage parameter request to a second computing entity regarding the data set. In this example, the second computing entity is within the parallelized data store, retrieve, and/or process sub-system 12 of the database system and stores at least a portion of the data set. As yet another example, the computing entity sends a storage parameter request to a third computing entity regarding the data set. In this example, the third computing entity is within a parallelized data input sub-system of the database system and stores the storage parameters.

The method continues at step 214 where the computing entity determines processing resources of the database system for processing the query request based on the storage parameters. For example, the computing entity determines a number of processing core resources associated with storing the data set. As another example, the computing entity determines a number of nodes associated with storing the data set. As a further example, the computing entity determines a number of computing devices associated with storing the data set.

The method continues at step 216 where the computing entity generates an optimized query plan from the initial query plan based on the storage parameters, the processing resources, and optimization tools. As an extension of generating the optimized query plan, the computing entity generates a distribution plan for distribute portions of the optimized query plan among the processing resources. An example of generating the optimized query plan will be discussed with reference to one or more of FIGS. 31-33.

The method continues at step 218 where the computing entity sends the optimized query plan to a second computing entity of the database system for distribution and execution of the optimized query plan. The second computing entity includes one or more of: one or more second computing devices of a data store, retrieve, and process sub-system 12 of the database system 10, one or more second nodes of the one or more second computing devices, and one or more second processing core resources of the one or more second nodes. An example of distributing the optimized query plan is discussed with reference to one or more of FIGS. 34-47.

The method continues at step 220 where the computing entity receives partial responses from the second computing entity. For example, as various parts of the optimized query plan are completed, the second computing entity sends the results of the completed parts to the computing entity. The method continues at step 222 where the computing entity generates a query result from the partial responses.

Figure 30:
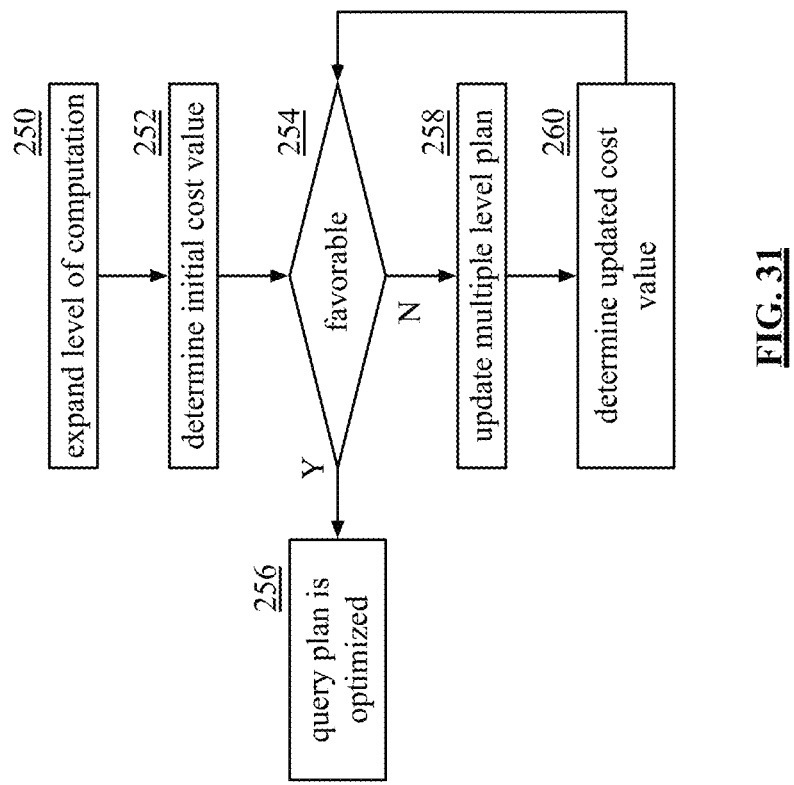
FIG. 30 is a logic diagram of an example of a method for creating a query plan for execution within the database system in accordance with the present invention.

FIG. 30 is a logic diagram of an example of a method for creating a query plan for execution by a computing entity within the database system. The method begins at step 230 the computing entity converts the query request into a syntax tree that represents a syntactic structure of instructions of the query instruction set of the database system. For example, the query request is an algorithm programmed using a generic SQL language. As such, it includes a set of instructions. The syntax tree is a representation of the syntactic structure of the set of instructions presented as levels of nodes in a tree form. A node corresponds to a construct that occurs in the set of instructions and contains structural and/or content related details of an instruction or group of instructions.

The method continues at step 232 wherein the computing entity validates the syntax tree. For example, the computing entity verifies statements of the query request (i.e., the statements are valid statements of the generic query format (e.g., an SQL programming language)). As another example, the computing entity verifies that the data set is a valid data set (e.g., the data set exists, that it is properly stored in the system, and/or is identifiable based on a data set identifier). As yet another example, the computing entity verifies no hang conditions occurs (e.g., no deadlocks (one thread or process is dependent on a result from another thread or process and the other thread or process is dependent on a result from the first thread or process), no infinite loops, no dead ends (e.g., a thread or process that leads to no other threads or processes and it does not produce a final resultant)).

The method branches at step 234 based on the validity of the syntax tree. If it is valid, the method continues at step 236 where the computing entity annotates the syntax tree with particular information of the data set to produce an annotated syntax tree. For example, the computing entity adds column information (names, number of columns, field types, etc.) and/or row information (name, number of rows, etc.)

regarding the data set. As another example, the computing entity adds information as to whether data of the data set is aggregated with data of the data set and/or with data or another data set or is to be aggregated with data of the data set and/or with data or another data set. As yet another example, the computing entity adds information as to whether data of the data set is to be correlated or not. As a further example, the computing entity adds information as to whether data of the data set is part of a subquery or not.

The method continues at step 238 where the computing entity generates the initial query plan based on the annotated syntax tree. For example, the computing entity generates source code using the custom instruction set of the database system based on the annotated syntax tree. As another example, the computing entity interprets the annotated nodes of the annotated syntax tree on a node-by-node basis and/or a group-of-nodes-by-a-group-of-nodes basis to identify appropriate instructions of the custom instruction set of the database system.

As a specific example, assume that annotated nodes of the annotated syntax tree specific that the data of column 2 is to be added to the data of column 7 and the results are to be placed in a new column 16. The computing entity interprets these nodes to determine that:
data needs to be read from column 2;
data needs to be read from column 7;
a new column 12 needs to be created; and
the data needs to be added together.

From this information, the computing entity identifies instructions from the instruction set to produce the corresponding portion of the source code. In particular, the computing entity would select an "extend" instruction to add the new column for receiving the result of the addition. The computing entity would also select an "aggregation" instruction to add the data of columns 2 and 7 together.

When the syntax tree is not validated at step 234, the method continues at step 240 where the computing entity determines whether it can change a portion of the query request that caused the syntax tree to fail validation. For example, the computing entity attempts to determine which node, or nodes, of the syntax tree contributed to the validation failure. If it can't, then it can't change the query request and the method continues at step 242, where the computing entity sends a query error message to a requesting device associated with the query request.

If the computing entity can identify a node, or nodes, that contribute to the validation failure, the method continues at step 234 where the computing entity identifies the portion of the query request that corresponds to the identified node or nodes. The method continues at step 246 where the computing entity changes coding of the portion of the query request while substantially preserving meaning of the portion of the query request. For example, if the original query request included instructions to add data of two columns, but did not include instructions on what do to with the results, the computing entity adds an instruction, or instructions, on what to do with the addition result. Having changed the query request, the method repeats at step 230 for the changed query request.

Figure 31:
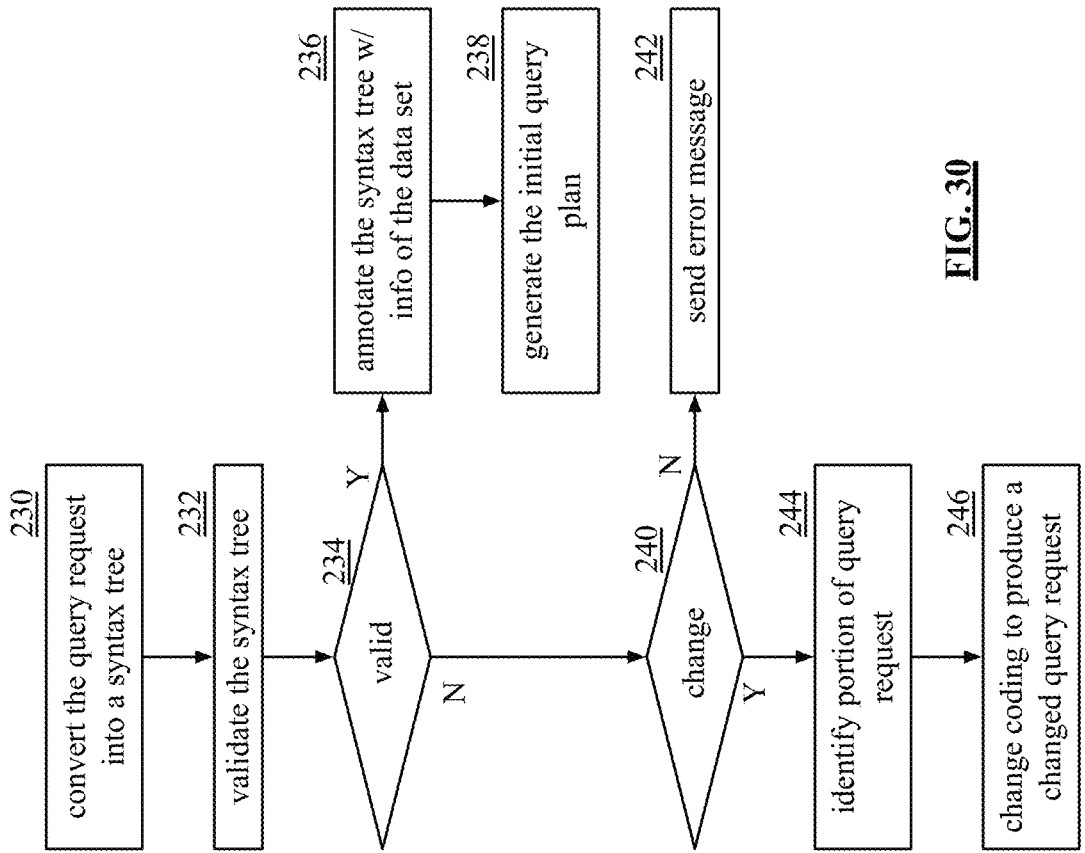
FIG. 31 is a logic diagram of an example of a method for creating a query plan for execution within the database system in accordance with the present invention.

FIG. 31 is a logic diagram of an example of a method for optimizing an initial query plan, which corresponds to step 216 of FIG. 29. Recall that the initial query plan was created to be executed by the computing entity with primary design concerns of being accurate and hang-up free and secondary design concerns of being efficiency and speed of execution. The intent of optimizing the initial query plan is to maintain the accuracy of the initial query plan while increasing the efficiency and/or speed of execution of the query plan to at least a desired level of efficiency and/or speed of execution.

The method begins at step 250 where the computing entity expands a level of a computation of the initial query plan from a single level (e.g., executed in a primarily serial manner by the computing entity) to a multiple level (e.g., executed in multiple levels of parallelism by the computing entity and the second computing entity). Expanding the level of computation divides the operating instructions of the initial query plan to a plurality of levels, where a first level of operating instructions is to be performed by the computing entity and the remaining levels (e.g., 1 or more) of operating instructions are to be performed by the second computing entity.

For example, assume a very simple query of adding the data of two columns together of a very large table, creating a new column for the table, and storing the results of the row-by-row addition in the new column. The initial query plan has the computing entity performing these functions in a substantially serial manner on a row-by-row basis or on a-small-number-of-rows-by-a-small-number-of-rows basis. A first pass of optimizing the initial query plan divides the functionality among different levels of the computing entity and the second computing entity. At a lowest level, processing core resources of nodes of one or more computing devices of the second computing entity are performing the functions in parallel on an assigned portion of the data. This is can be viewed as a level 3 function.

The results of the level 3 function are aggregated by a node, or nodes, of a computing device, or devices, of the second computing entity to produce level 2 results. The second computing entity sends the level 2 results to the computing entity, which performs a level 1 function on the level 2 results to produce the query result.

The method continues at step 252 where the computing entity determines an initial cost value for the multiple level initial query plan. For example, the computing entity determines an estimated efficiency and/or estimated speed of execution for the multiple level initial query plan. The method continues at step 254 where the computing entity determines whether the initial cost value compares favorably with a cost threshold. For example, does the estimated efficiency compare favorably to an efficiency threshold and/or does the estimated speed of execution compare favorably to a speed of execution threshold. Note that efficiency in a measure of error rate, load balancing, use of processing resources, and/or memory accesses and speed of execution is the time it takes to produce the query result from enabling execution of the query plan. When the initial cost value compares favorably to the cost threshold, the method continues at step 256 where the multiple level initial query plan is used as the optimized query plan.

When the initial cost value compares unfavorably to the cost threshold, the method continues to step 258 wherein the computing entity changes the multiple level initial query plan in accordance with one or more of the optimization tools. The optimization tools include one or more pre-optimization tools, one or more heuristic optimization tools, one or more particle swarm optimization tools, and one or more time-key-time optimization tools. A more detailed list of optimization tools, or transforms, is provided with reference to FIG. 32.

The method continues at step 260 where the computing entity determines an updated cost value for the updated query plan. The method repeats at step 254 for the updated query plan and the updated cost value. In this manner, the query plan is optimized to a level that provides the desired level of efficiency and desired speed of execution. Once it hits that level, it is ready to deploy.

Figure 32:
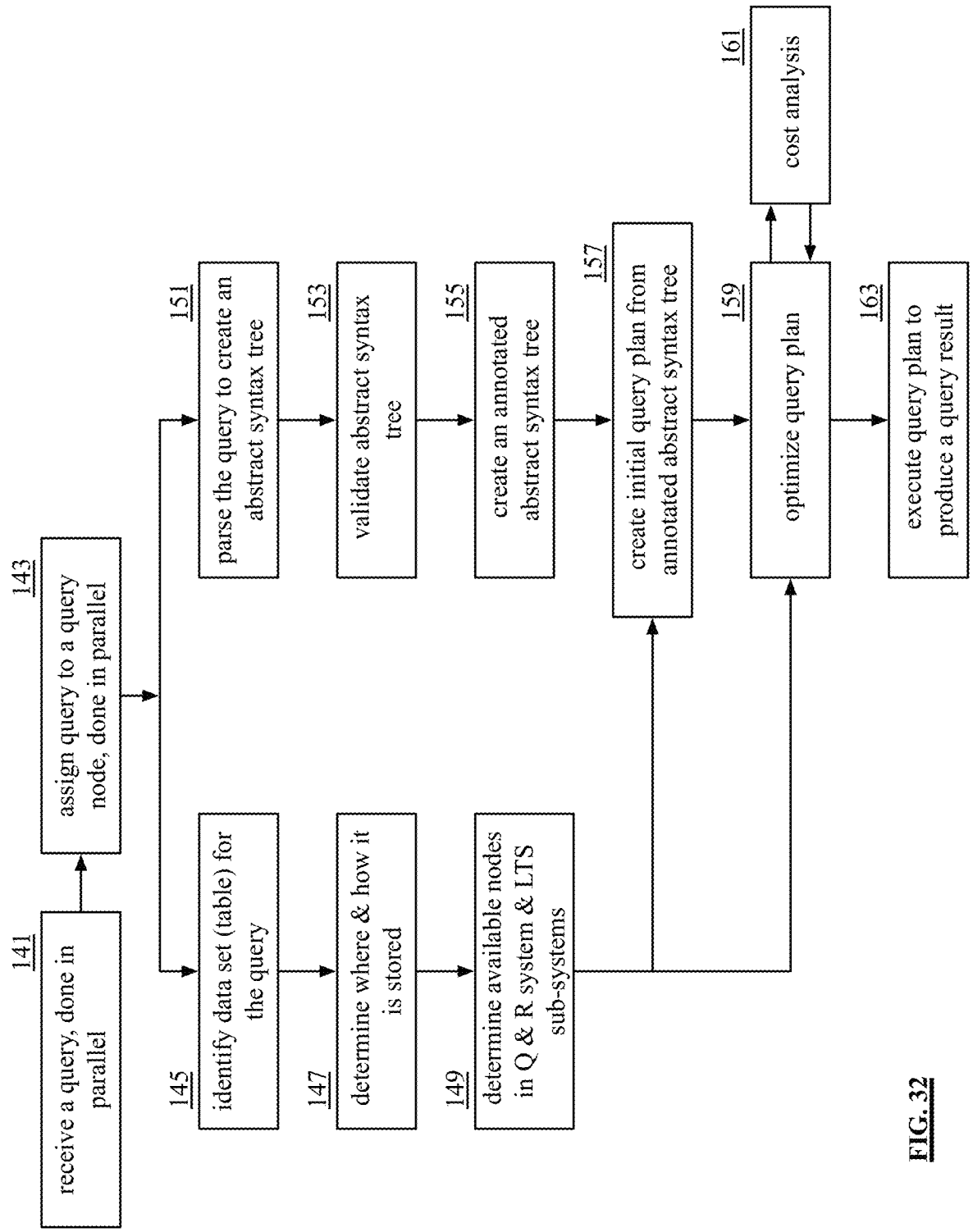
FIG. 32 is a logic diagram of another example of a method for creating a query plan for execution within the database system in accordance with the present invention.

FIG. 32 is a logic diagram of an example of creating a query plan for execution within the database system that begins at steps 141 and 143 where one or more processing core resources of a node, one or more nodes of a computing device, and/or one or more computing devices of the parallelized query & response sub-system 13) (hereinafter referred to as a computing entity for the discussion of this figure) is assigned to receive a query. The received query is formatted in one of a variety of conventional query formats. For example, the query is formatted in generic SQL programming language and corresponding API of Open Database Connectivity (ODBC), Java Database Connectivity (JDCB), or Spark.

The parallelized query & response sub-system 13 is capable of receiving and processing a plurality of queries in parallel. For ease of discussion, the present method is discussed with reference to one query. The sub-system processes multiple queries individually and in parallel. For instance, the sub-system 13 functions as a distributed virtual machine that coordinates network protocols, manages data and query flow, and scheduling thereof.

The method branches to steps 145 and 151. At step 145, the computing entity identifies a table (or tables) for the received query. The method continues at step 147 where the computing entity determines where and how the table(s) is/are stored. For example, the computing entity determines how the table was partitioned; how each partition was divided into one or more segment groups; how many segments in a segment group; how many storage clusters are storing segment groups; how many computing devices are in a storage cluster; how many nodes per computing device; and/or how many processing core resources per node.

The method continues at step 149 where the computing entity determines available nodes (and/or processing core resources) within the parallelized Q&R sub-system 13 for processing operations of the query. In addition, the computing entity determines nodes (and/or processing core resources) available for processing operations of the query within the parallelized data store, retrieve, &/or process sub-system 12. Typically, the nodes and/or processing core resources storing a relevant portion of the table will be selected to process one or more operations of the query on their respective portions of the table.

At step 151, the computing entity parses the received query to create an abstract syntax tree, or syntax tree. For example, the computing device converts SQL statements of the query into nodes of a syntactic structure of source code and creates a tree structure of the nodes. A node corresponds to a construct occurring in the source code.

The method continues at step 153 where the computing entity validates the abstract syntax tree. For example, the computing entity verifies one or more of the SQL statements are valid, the conversion to operations of the DB instruction set are valid, the table(s) exists, the selected operations of the DB instruction set and/or the SQL statements yield viable data (e.g., will produce a result, will not cause a deadlock, etc.), etc. If not, the computing entity sends an SQL exception to the source of the query.

For validated abstract syntax tree, the method continues at step 155 where the computing entity generates an annotated abstract syntax tree. For example, the computing device adds column names, data types, aggregation information, correlation information, subquery information, etc. to the verified abstract system tree.

The method continues at step 157 where the computing entity creates an initial query plan from the annotated abstract syntax tree. For example, the computing entity selects operations from an operating instruction set of the database system to implement the abstract syntax tree. The operating instruction set of the database system (i.e., DB instruction set) includes the following operations:

Aggregation—aggregates two or more rows based on one or more values of a row and then combine (e.g., sum, average, appended, sort, etc.) into a row;

AggVectorOperationInstance—use when number of rows is known and is less than or equal to a specific value (e.g., 256), use a vector operation instead of a hash function to aggregate rows, which allows aggregation without the need for caching;

Broadcast—computing device or node sending data to other computing devices or nodes performing similar tasks, functions, and/or operations (typically for lateral data flow in the system);

Eos—"end of stream" is a placeholder to indicate no data, may also be used to indicate a function cannot be performed;

Except—set subtraction;

Extend—add a column to received data;

Gather—combine data together;

GdeLookup—"Global Dictionary Compression" lookup function for data compression;

HashJoin—join data using a hash function;

IncrementBigInt—increment one or more data values in accordance with a test protocol IncremetingInt—increment one or more data values Index—uses indexed metadata to reduce amount of data to read and/or to push operations downstream to delay reading;

IndexAgg—aggregation of indexing;

IndexDistinct—indexing of distinct row, rows, column, and/or columns;

SegmentAgg (operator instance)—segmenting of an aggregation operation to produce sub-aggregation operations;

SegmentDistinct (operator instance)—segmenting of a distinct operation to produce sub-distinct operations;

IndexCountStar—

Intersect—is a mathematical function to find data from two or more sets of data that intersect;

JobsVirtual—

Limit—limit the number of rows to be read, to be operated on, etc.;

MakeVector—convert columns into a matrix for linear algebra functions;

UnMakeVector—convert a resulting matrix back into columns;

MatrixExtend—add columns or another matrix to an existing matrix;

Offset—is an offset for data retrieval;

OrderedAgg—ordering of aggregation to allow for lower level aggregation, which allows higher level to be more efficient;

OrderedDistinct—ordering of distinct values at lower levels, which allows higher levels to be more efficient;

OrderedGather—ordering of gathering at lower levels, which allows higher levels to be more efficient;

ProductJoin—nested loop join function (e.g., join data from one or more rows and/or from one or more columns);

ProjectOut—remove a column for data of interest (e.g., want to do this as far downstream as possible);

Rename—change name of a column, (can be used to avoid column name collisions);

Reorder—reorder data of one or more rows and/or one or more columns based on an ordering preference;

Root—conduit for data flow;

Select—select columns from one or more tables;

Shuffle—sub-divide data into a plurality of data subdivisions (typically for lateral data flow in the system);

Switch—change where to send data when a condition is met;

TableScan—retrieve all of the data of a table;

TableSlab Scan (operator instance)—retrieve particular data slabs of a table;

Tee—creates a brand in operational flow when operating on redundant data;

Union—establish a set of operations;

Window—is a specific type of aggregation that captures a moving window of aggregated data (e.g., a running sum, a running average, etc.); and MultiplexerOperatorInstance for Set/ProductJoin/HashJoin/Sort/Aggregation—allows for lock free multiplexing for various types of operations.

The method continues at step 159 where the computing entity optimizes the query plan using a cost analysis of step 161. The initial query plan is created to be executed by a computing entity within the parallelized query & response sub-system. Optimizing the plan spreads the execution of the query across multiple layers (e.g., three or more) and to include the other sub-systems of the database system. The computing device utilizes one or more optimization transforms, or tools, to optimize the initial query plan. The optimization transforms, or tools, include:

AddDistinctBeforeMinMax: Adds a union distinct before an aggregation operator that only performs min/max RemoveDistinctBeforeMinMax: The opposite of addDistinctBeforeMinMax AddDistinctBetoreSemiAnti: Adds a union distinct as the right child of a join that is a semi or anti join RemoveDistinctBeforeSemiAnti: The opposite of addDistinctBeforeSemiAnti AggDistinctPushDown: Pushes down an aggregation that is only performing distinct operators (count/sum distinct) below its child AggDistinctPushUp: The opposite of AggDistinctPushDown AggregatePushDown: The same as AggDistinctPushDown but for aggregations performing non-distinct operations AggregatePushUp: The opposite of AggregatePushDown ConvertProductToHashJoin: Converts a product join with 1hasCol=rhsCol filters into an equivalent hash join CreateTee: Given a certain node in the tree, searches the rest of the tree for equivalent subtrees, if one or more is found, the equivalent subtrees are deleted and a tee operator is created as the parent of the given node, which then forwards the results to the parents of those equivalent subtrees Delete Tee: The opposite of create Tee RedistributeAggDistinct: Moves a distinct aggregation to a lower level (below a gather), and adds a shuffle if needed DedistributeAggDistinct: The opposite of redistributeAggDistinct RedistibuteAggregation: The same as redistributeAggDistinct but for non-distinct aggregations DedistributeAggregation: The opposite of redistribute-Aggregation DeletePointlessSort: Deletes a pointless sort from the tree DeletePointlessSwitch: Deletes a pointless switch from the tree (only happens if all of the extends the switch created were pushed out of the switch-union block)

DuplicateAggBelowShuffles: Given an aggregation (including aggdistinct) with a shuffle as its child, create a copy of the aggregation below the shuffle and update the original to have the correct operations RemoveAggBelowShuffles: The opposite of duplicateAggBelowShuffles DuplicateLimit: Given a limit above a gather type operator, create a copy of it below the gather type operator ExceptPushDown: Pushes an except operator down below all of its child, can only happen if they are all equivalent ExceptPushUp: The opposite of exceptPushDown ExceptUnionContract: Given an except with more than 2 children, take children [1, N-1] and make them the children of a union all, which becomes child 1 of the except ExceptUnionExpand: The opposite of exceptUnionContract ExtendPushDown ExtendPush Up IntersectPushDown: The same as exceptPushDown but for an intersect operator IntersectPushUp: The opposite of intersectPushDown JoinPushDown: Pushes a join down below its child(ren). Similar to except/intersectPushDown except with a few other cases. If one child is a join it instead swaps the joins, it also has to check that pushing below its children doesn't break the join (for example by creating name collisions or removing columns that needed to exist)

JoinPushUp: The opposite of joinPushDown, but with some more potential for optimizations. Specifically, if the parent is a select on equiJoin columns, the select can be pushed down to all children, or is the parent is a project and the join is a gdcJoin, then this deletes the join and its right subtree entirely LimitPushDown LimitPushUp MakeVectorDown MakeVectorPushUp MatrixExtendPushDown MatrixExtendPushI)own MergeEquiJoins: Given two adjacent inner hash joins with no other filters, combine them into a single hash join with more children SplitEquiJoins: The opposite of mergeEquiJoins MergeExcept: Given two adjacent except operators, take the input to the lower one and make all of its children become children of the higher one MergeIntersect: The same as mergeExcept but for intersect MergeTee: Given two adjacent tee operators, take delete the higher one and make its parent additional parents on the lower one MergeUnion: The same as mergeExcept but for union MergeWindows: Combine two adjacent window operators into a single one OffsetPushDown OffsetPushUp ProjectOutPushDown ProjectOutPushUp PushAggBelowJoin: Duplicates an aggregation below a hash join, and updates the higher one accordingly PushAggAboveJoin: The opposite of pushAggBelowJoin PushAggBelowGdcJoin: Given an aggregation above a gdcJoin, this moves it below the gdcJoin if possible. Currently requires that the aggregation does not reference the gdc column at all, or only groups by it. More cases are possible PushJoinBelowSet: Given a join where one if it's children is a set operator, and moves the join below the set such that there are not multiple joins as the children of the set operator PushSetBelowJoin: The opposite of pushJoinBelowSet PushLimitintoIndex: Pushes a limit operator into an index operator, this way the index knows to only output up to LIMIT rows PushLimitIntoSort: Pushes a limit into a sort operator, which causes us to run a faster limitSort algorithm in the virtual machine (e.g., node or processing core resource)

PushLimitOutOfSort: The opposite of pushLimitIntoSort

PushProjectIntoIndex: Pushes a project into an operator, which causes a not read of a column. Used when start reading all columns in plan generation PushSelectBelowGdcJoin: Given a select above a gdcJoin, where the select is filtering the compressed column, this converts the filter to a filter on the stored integer mapping of that column, and moves the select below the join. For example, where col1="hello" might be converted to where col1 Key=42

PushSelectintoHashJoin: Given a select above a hash join, where the select filters on 1hsCol=rhsCol, this creates additional equi join columns on the hash join PushSelectOutOfHashJoin: The opposite of pushSelectintoHashJoin PushSelectintoProduct: The same as pushSelectintoHashJoin but for product joins PushSelectOut01Product: The opposite of pushSelectIntoProduct RenamePushDown RenamePushUp ReorderPushDown ReorderPushUp SelectOutJoinNulls: Given a join that is joining on col1, if col1 is nullable this creates a select below the join that has the filter where col1 !=NULL UnselectOutJoinNulls: The opposite of selectOutJoinNulls SelectPushDown SelectPushUp SortPushDown SortPushUp SwapJoinChildren: Swaps the order of a joins children SwitchPushDown: Given a switch operator, push it down over its child. In some cases, this causes copies of the child to become the switch's parents', and in others this causes that child to jump the entire switch union block and become the parent of the union associated with the switch SwitchPushUp: The opposite of switchPushDown, but nothing jumps because the parents of the switch are inside the switch union block already. Also requires that all parents are equivalent TeePushDown: Pushes a tee down below its child, causing that child to be copied for each parent of the tee TeePushUp: The opposite of teePushDown, requires that all parents are equivalent UnionDistinctCopyDown: Given a union distinct with gathers as its children, creates another 1 child union distinct as the children of those gathers UnionDistinctCopyUp: The opposite of unionDistinctCopyDown UnionPushDown: The same as exceptPushDown except for union, also handles the different rules that apply to union all and union distinct UnionPushUp: The opposite of unionPushDown, also handles the case where this is the opposite of switchPushDown because the union has an associated switch, so some operators will jump the entire switch union block UnmakeVectorPushDown UnmakeVectorPushUp WindowPushDown WindowPushUp post-optimization options Combining adjacent selects into super Selects Combining adjacent limits Combining adjacent offsets Converting distinct aggregations into a non-distinct aggregation with a union distinct as its child Duplicating union distincts around shuffles, this only happens if there is a union distinct on 1 side of a shuffle, but not both Replacing index type operators with an eos operator we if can determine that the filters (if any) on the index are always false (possible by comparing possible values of data types)

Evaluating alternate indexes besides the primary index

Building orderedAggregations and orderedDistincts

Getting rid of pointless renames

Pushing sorts down to level 3 if possible

Creating indexCountStar operators if possible

Fixing out of order indexAggs, this makes the grouping key order match the primary index order when possible Tee'ing leaf operators, this combines as many equivalent leaf operators as possible to reduce IO Deleting pointless reorders Note that the Down and push Up transforms are used frequently, and mean to take the given operator and swap its position in the tree with its child (or parent) for most operators. Further note that not all of these transforms are legal in all possible cases, and they only get applied if they are legal.

The method continues at step 163 where the query plan is executed to produce a query result. FIGS. 34-42 provide an example of optimizing a query plan and producing a query result therefrom.

Figure 33:
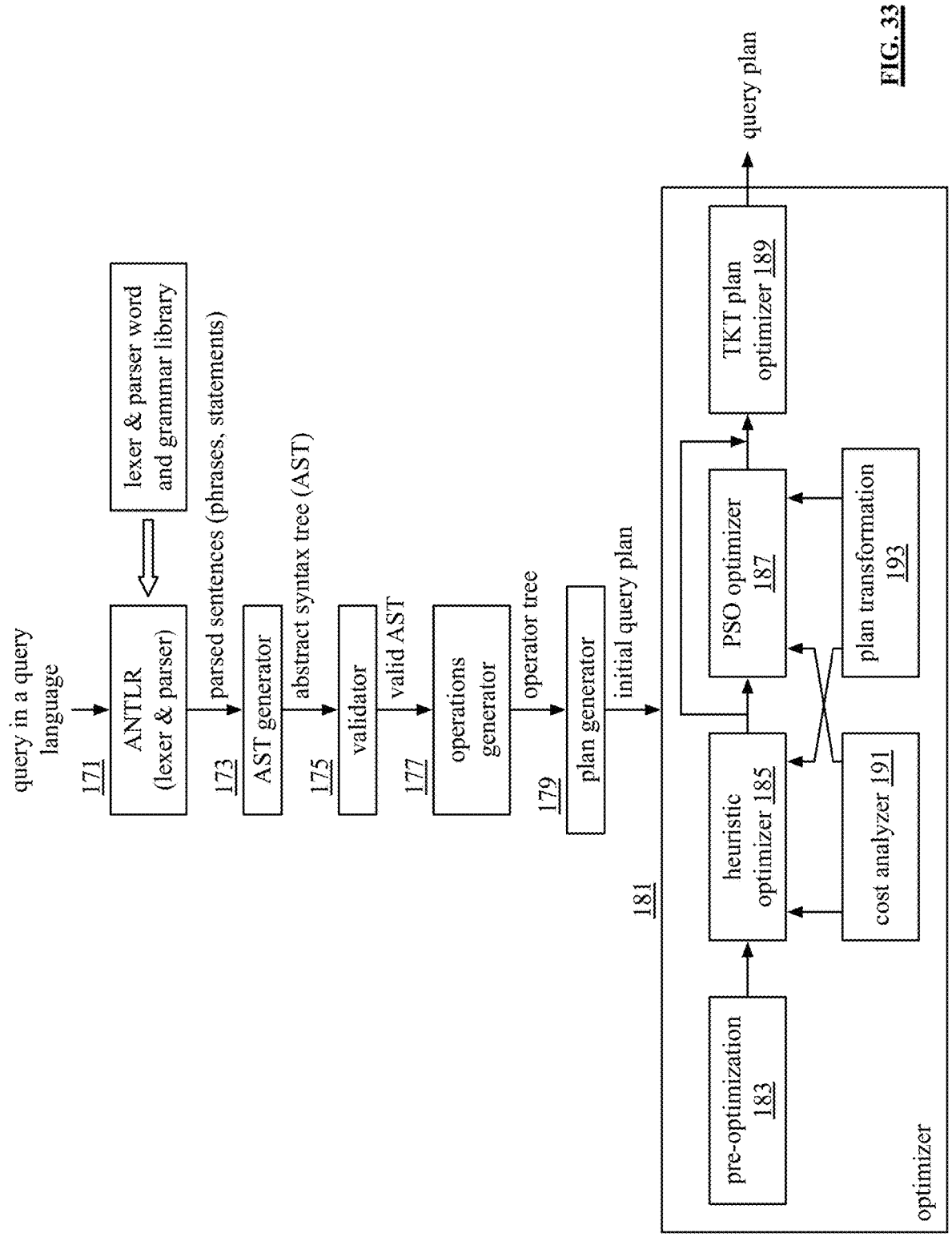
FIG. 33 is a logic diagram of another example of a method for creating a query plan for execution within the database system in accordance with the present invention.

FIG. 33 is a logic diagram of another example of creating a query plan for execution within the database system that begins at step 171 where one or more processing core resources of a node, one or more nodes of a computing device, and/or one or more computing devices of the parallelized query & response sub-system (hereinafter referred to as a computing entity for the discussion of this figure) performs a lexer function and/or a parsing function using ANTRL (another tool for language recognition) on a received query, which was received in a query language.

A lexer function separates streams of characters into different words, which can be referred to as tokens. A parsing function interprets various groupings of the tokens to determine if proper sentences, statements, and/or phrases are formed. In general, a lexer function works at the word level and the parsing function works at the grammar level to produce meaningful sentences and/or phrases. Through the lexer function and parsing function, the computing entity generates parsed sentences, statements, and/or phrases. As a particular example, the computing entity using the lexer function and parsing function on the source code a query request, which is programmed in a generic SQL language, to generate parsed sentences, statements, and/or phrases.

The method continues at step 173 where the computing entity performs an abstract syntax tree (ABS) generator function to create an abstract syntax tree from the parsed sentences, statements, and/or phrases. The method continues at step 175 where the computing entity performs a validator function on the abstract syntax tree (AST) to produce, when valid, a valid AST. An example of generating a syntax tree and validating it was described with reference to one or more FIGS. 29-31.

The method continues at step 177 where the computing entity performs an operations generator to produce an operator tree (e.g., query tree) from the valid AST. The method continues at step 197 where the computing entity performs a plan generator to create an initial query plan from the operator tree. An example of generating an initial query plan was described with reference to one or more of FIGS. 29-31.

The method continues at step 181 where the computing entity converts the initial query plan into an optimized query plan. The computing entity uses one or more of a plurality of optimization tools, or transforms, as listed above to produce the optimized query plan. For example, the computing entity uses one or more optimization tools for pre-optimization 183 of the initial query plan; uses one or more optimization tools for a heuristic optimization 185; uses one or more optimization tools for a particle swam optimization (PSO) 187; uses one or more optimization tools for plan transformation 193; and/or uses one or more optimization tools for Time-Key-Time optimization 189. One or more of the optimization steps are analyzed via a cost analyzer function 191 to achieve the desired efficiency and/or desired speed of execution. While there is a flow illustrated for optimizing the query plan, the optimization steps may be done in any order, repeated in any order, skipped, duplicated, and/or repeated any number of times to achieve a query plan that meets or exceeds the desired efficiency and/or desired speed of operation.

Figure 34:
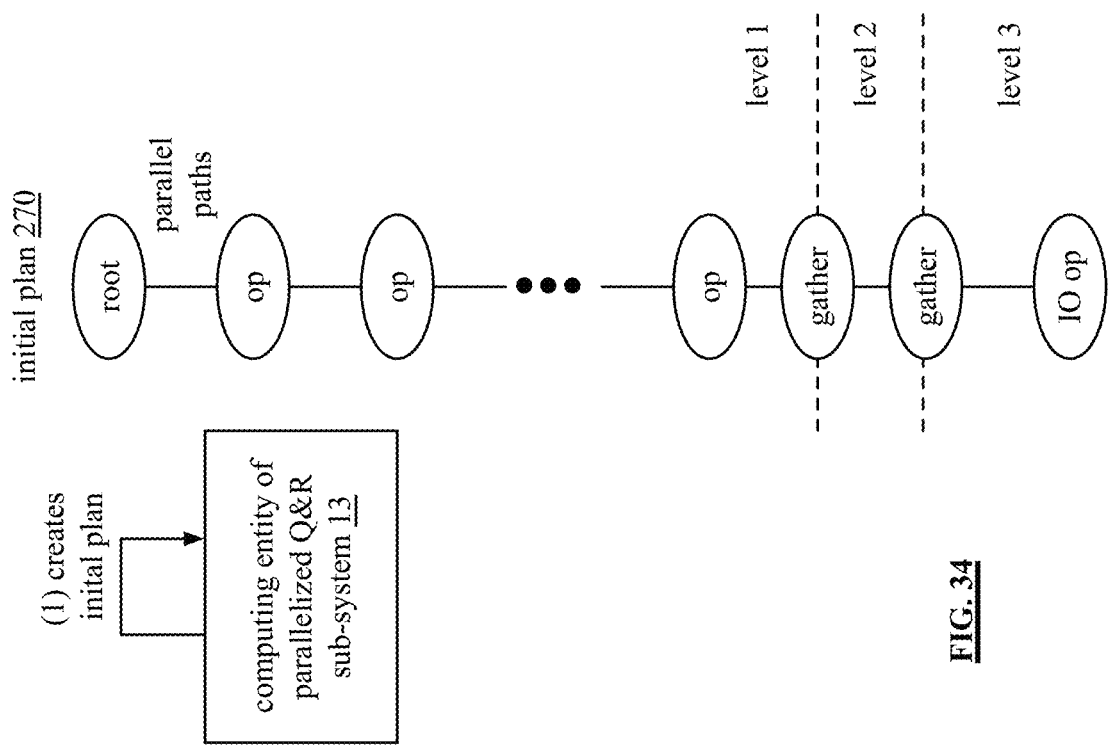

FIGS. 34-42 are schematic block diagrams of an example of creating and distributing a query plan in the database system. FIG. 34 illustrates one or more processing core resources of a node, one or more nodes of a computing device, and/or one or more computing devices of the parallelized query & response sub-system (hereinafter referred to as a computing entity for the discussion of FIGS. 34-42). The computing entity creates an initial plan from a received query using one or more operators from a plurality of operators. An example of generating an initial query plan was previously discussed.

In this example, the initial query plan includes a root operator, a plurality of operators (op), and one or more input/output operations (IO op). The initial query plan also includes one or more parallel paths of execution. Accordingly, when the computing entity is creating the initial plan, it is dividing the execution of the query plan into threads that can be executed relatively independently and without lock up. For the most part, the operations of the initial query plan at executed at level 1 and the other levels have very few, if any, operations. The other levels do, however, have IO operations and gather operations to retrieve and/or stored data as needed for the operations above it.

Figure 35:
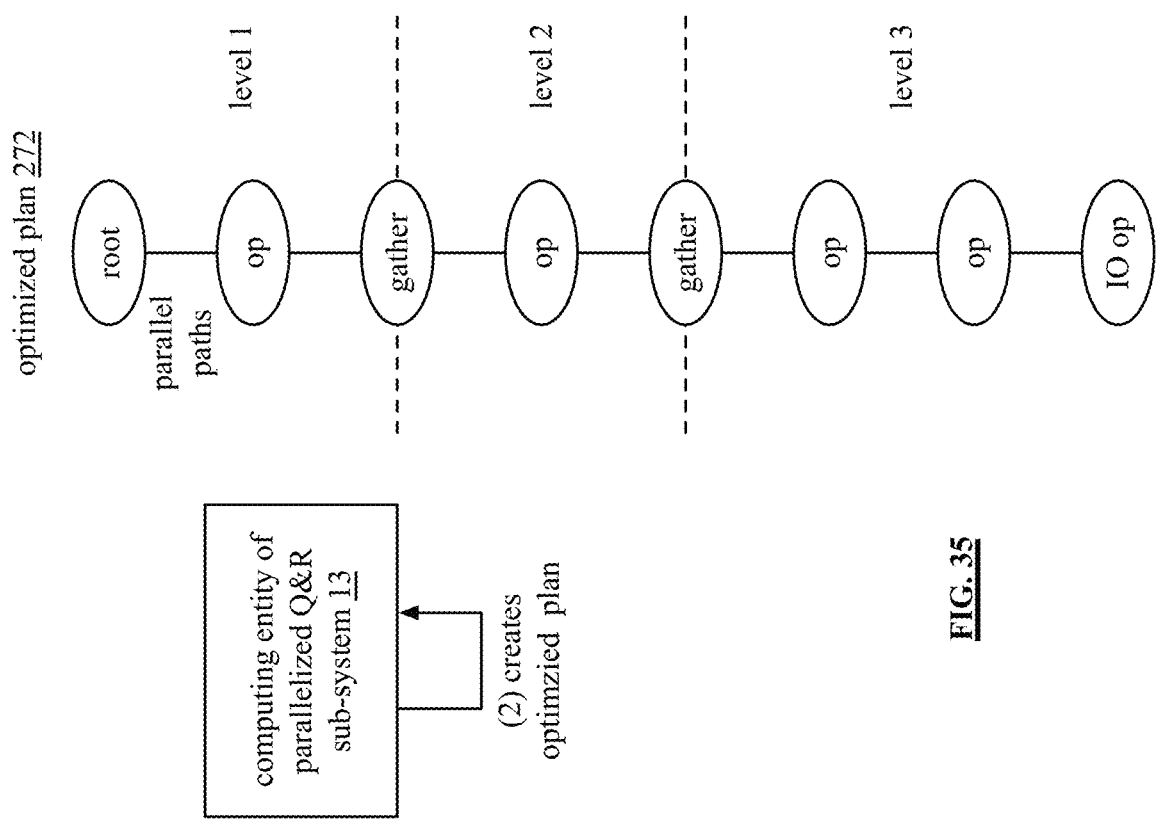
FIGS. 34-42 are schematic block diagrams of an example of creating and distributing a query plan in the database system in accordance with the present invention.

FIG. 35 illustrates the computing entity optimizing the initial query plan to produce an optimized plan. In general, an optimized query plan guarantees a result, just like the initial query plan, but is optimized for efficiency of execution (e.g., efficient use of processing resources of the database system) and for speed in producing an answer. In this example, the computing entity creates a plurality of a parallel paths and distributes execution of operations among three levels. Note that there may be more than three levels of execution. An example of optimizing a query plan was previously discussed.

Figure 36:
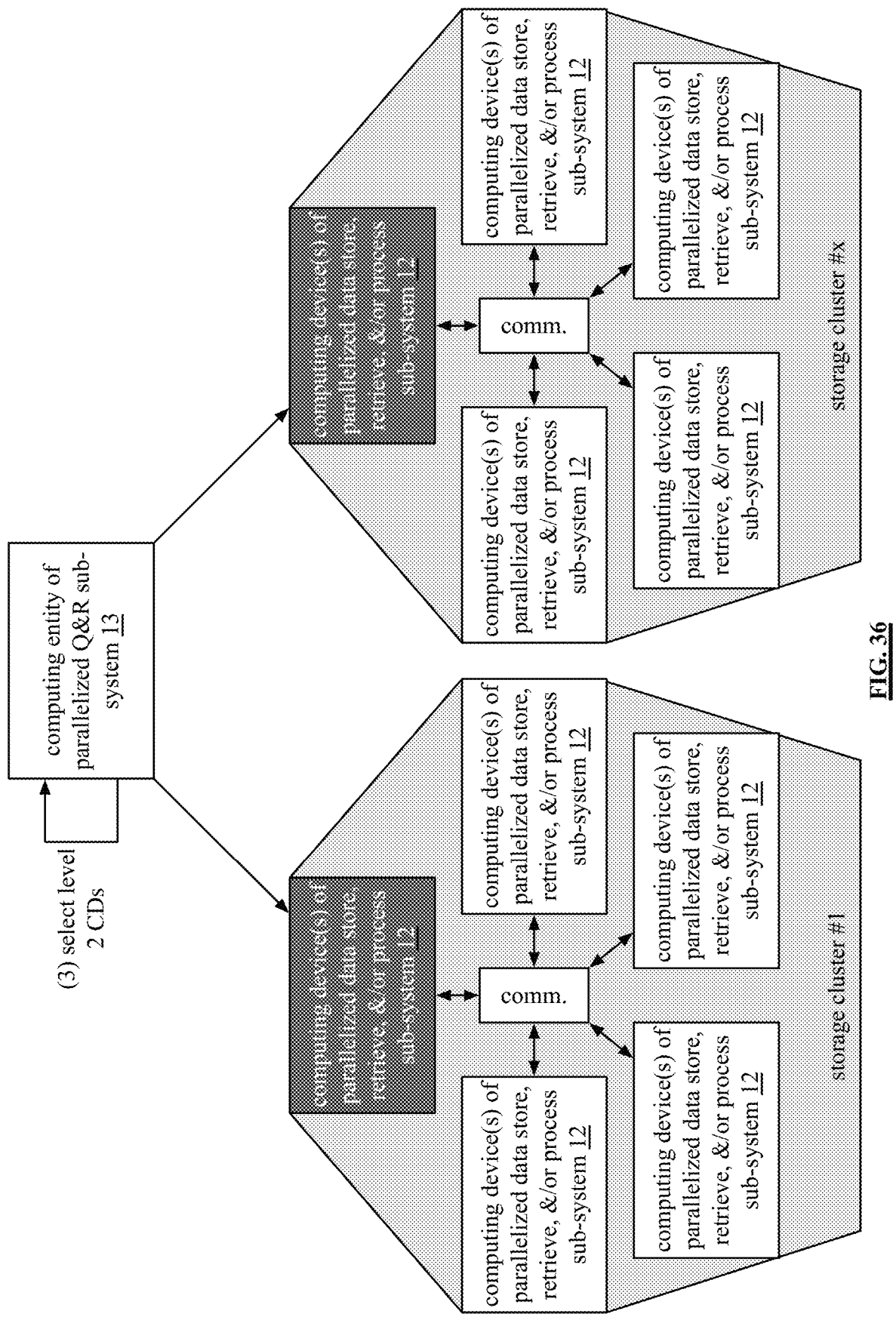

FIG. 36 illustrates the computing entity of the parallelized query & response sub-system, which is the level 1 processing entity, selecting computing devices of each storage cluster as level 2 processing entities. The selection of level 2 processing entities can be done in a variety of ways. For example, the level 2 processing entities are selected using a pseudo random selection process. As another example, the level 2 processing entities are selected using a round robin approach. The storage clusters are in the parallelized data store, retrieve, and/or process sub-system 12.

Figure 37:
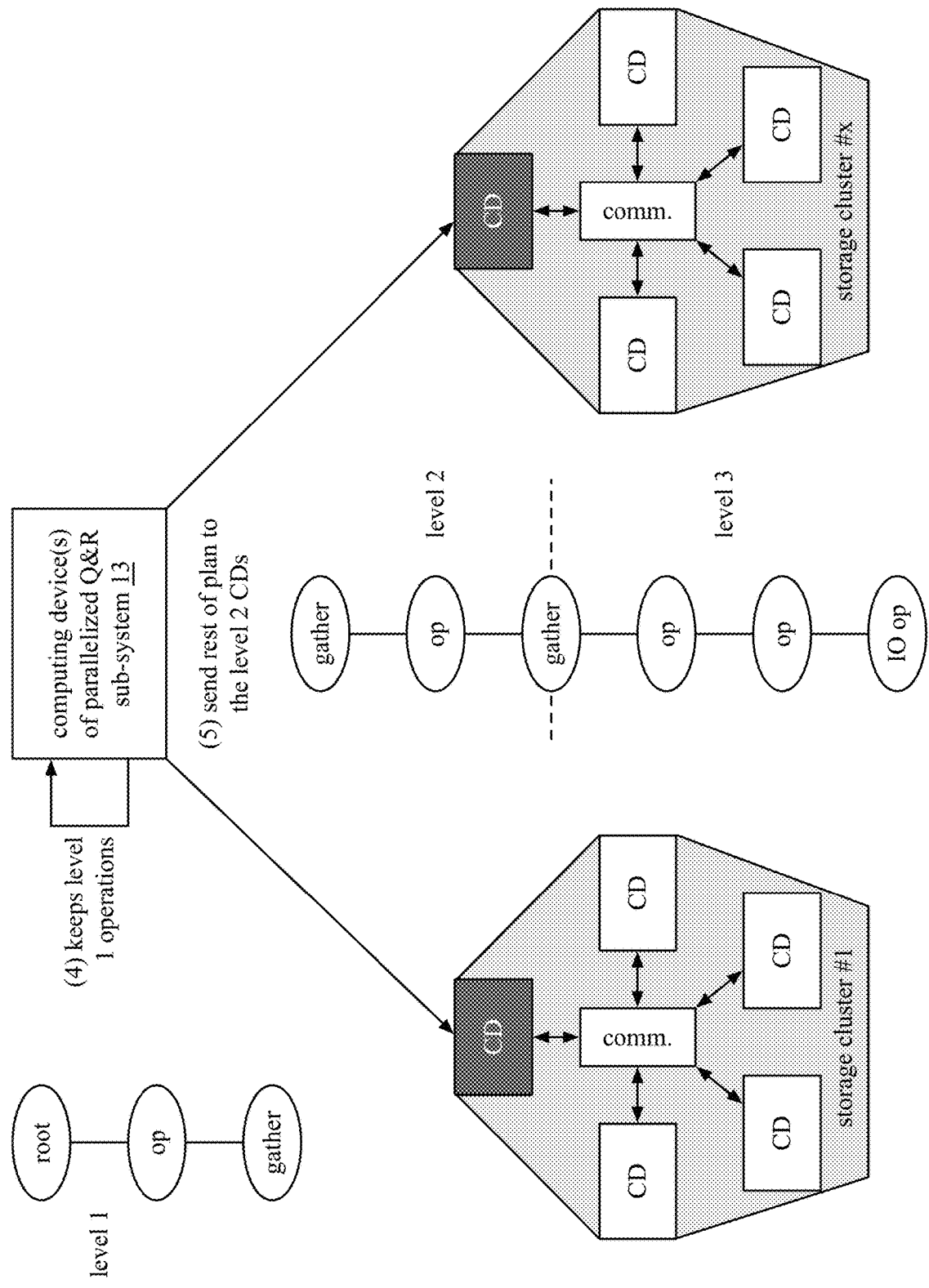

FIG. 37 illustrates the computing entity of the parallelized query & response sub-system keeping the level 1 operations and sending the rest of the plan to the level 2 computing devices. In addition, the computing entity sends control signals and set up instructions to the level 2 computing devices. In one embodiment, each level 2 computing device gets the same information.

Figure 38:
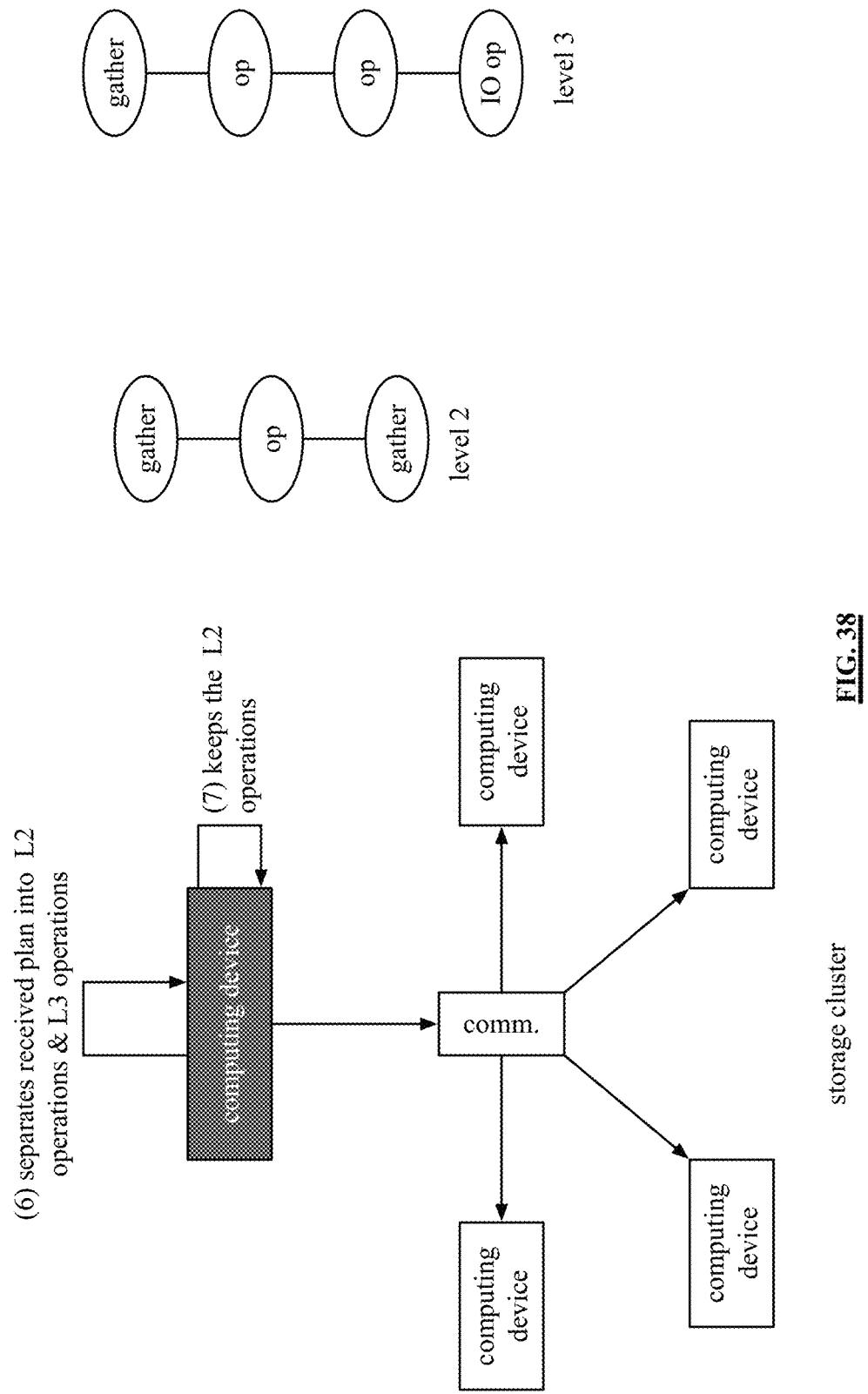

FIG. 38 illustrates a level 2 (L2) computing device of a storage cluster separating the received plan into L2 operations and L3 operations in accordance with the other information received. The L2 computing device keeps the L2 operations for itself and sends the L3 operations to other computing devices in its storage cluster.

Figure 39:
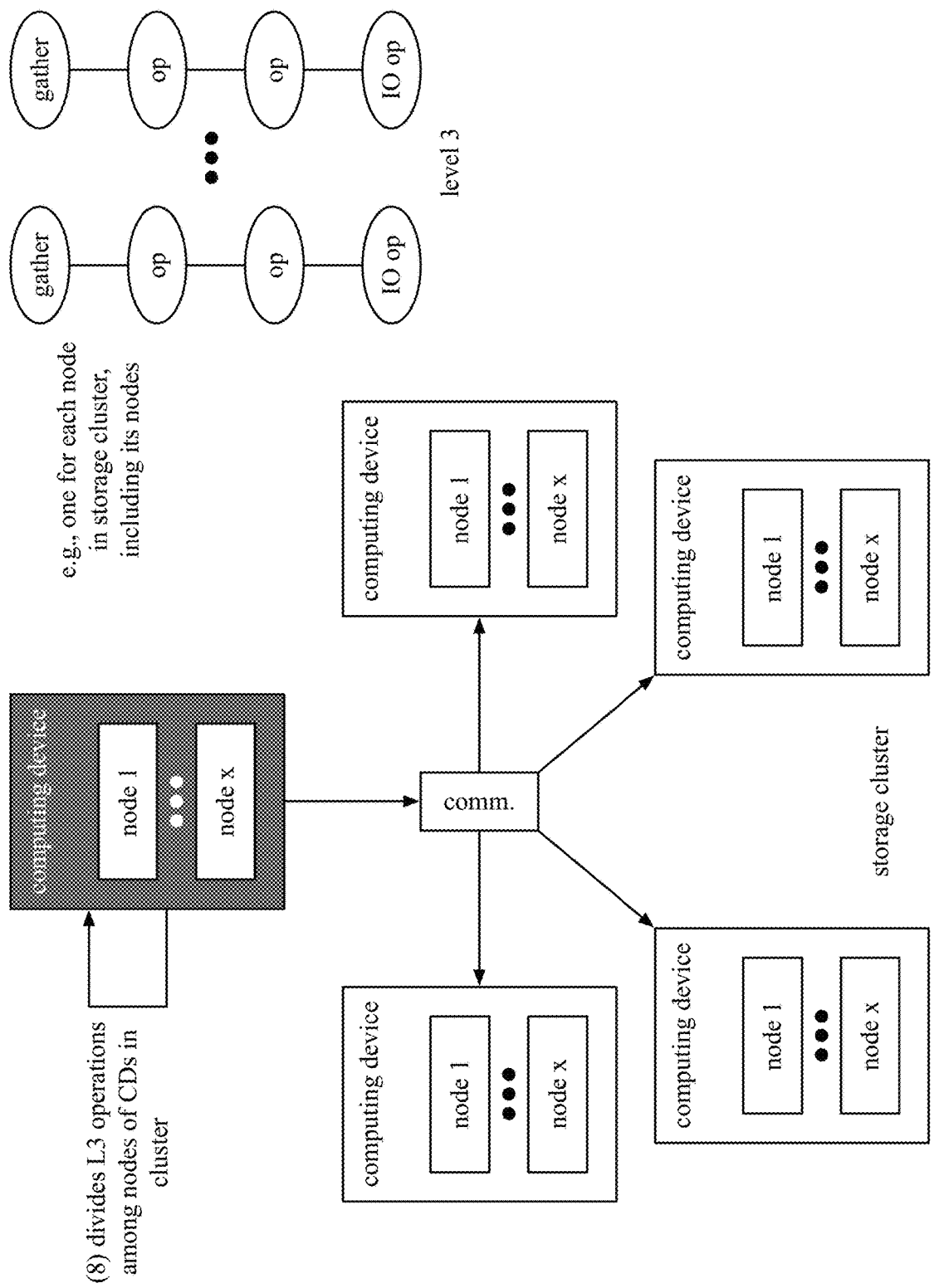

FIG. 39 illustrates the L2 computing device dividing the L3 operations among the nodes of the computing devices in the storage cluster. In an embodiment, the L2 computing device replicates the L3 instructions for each of the nodes in the storage cluster. As such, each node is executing the same operations. In addition, a node of the L2 computing device is selected to perform the L2 operations. The selection of the node of the L2 computing device may be done in a variety of ways similar to selecting the L2 computing device.

Figure 40:
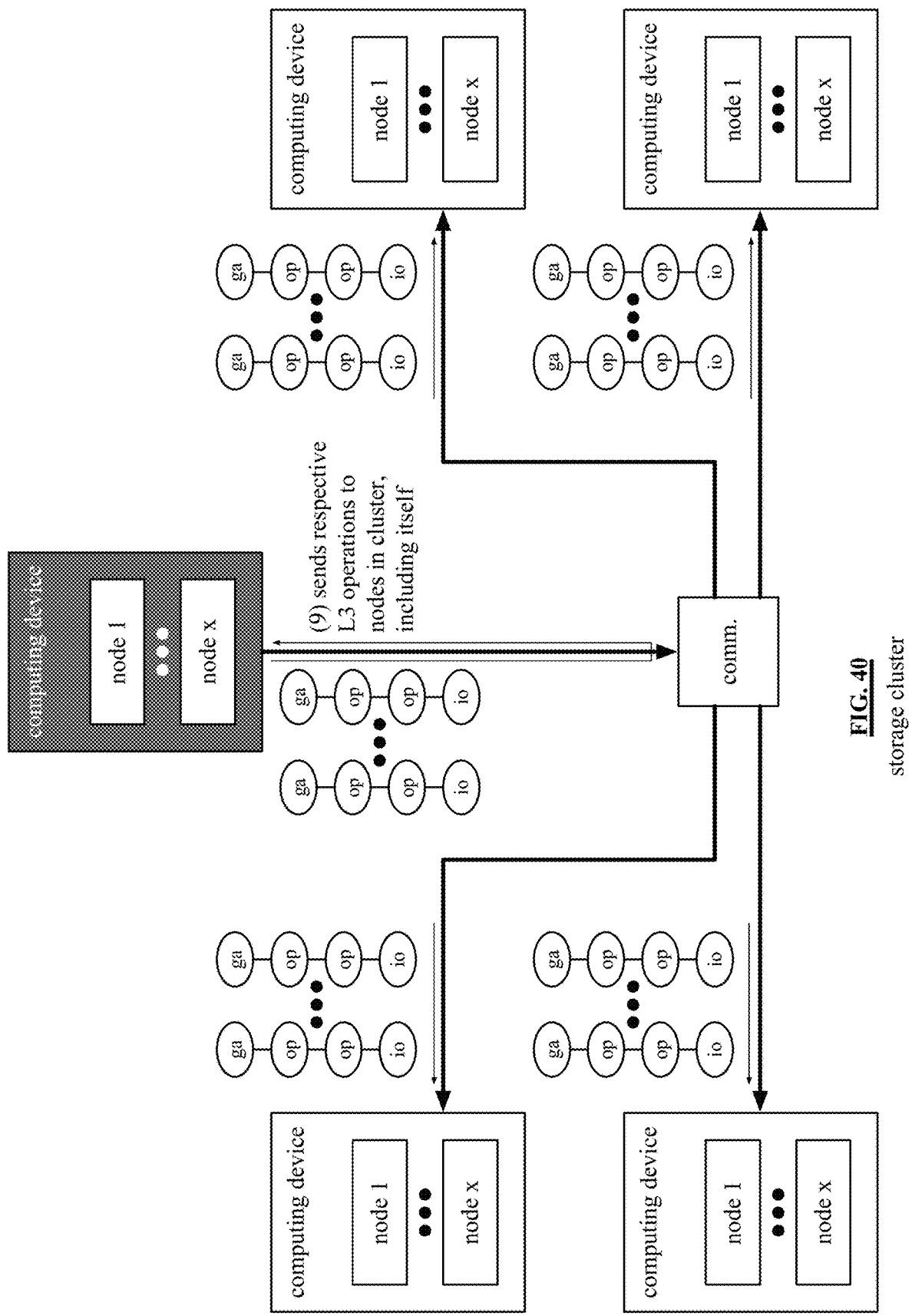

FIG. 40 illustrates the L2 node sending the replicated L3 operations to the other nodes in the storage cluster, including the nodes within the L2 computing device. As an alternative to replicating the L3 operations for all of the nodes, the L2 computing device only replicates the L3 operations for the other computing devices. In this example, the L2 computing device sends the replicated L3 operations to the other computing devices, including itself. Each of the other computing devices replicates the received L3 operations for each of its nodes and sends the replicated L3 operations to its nodes.

Figure 41:
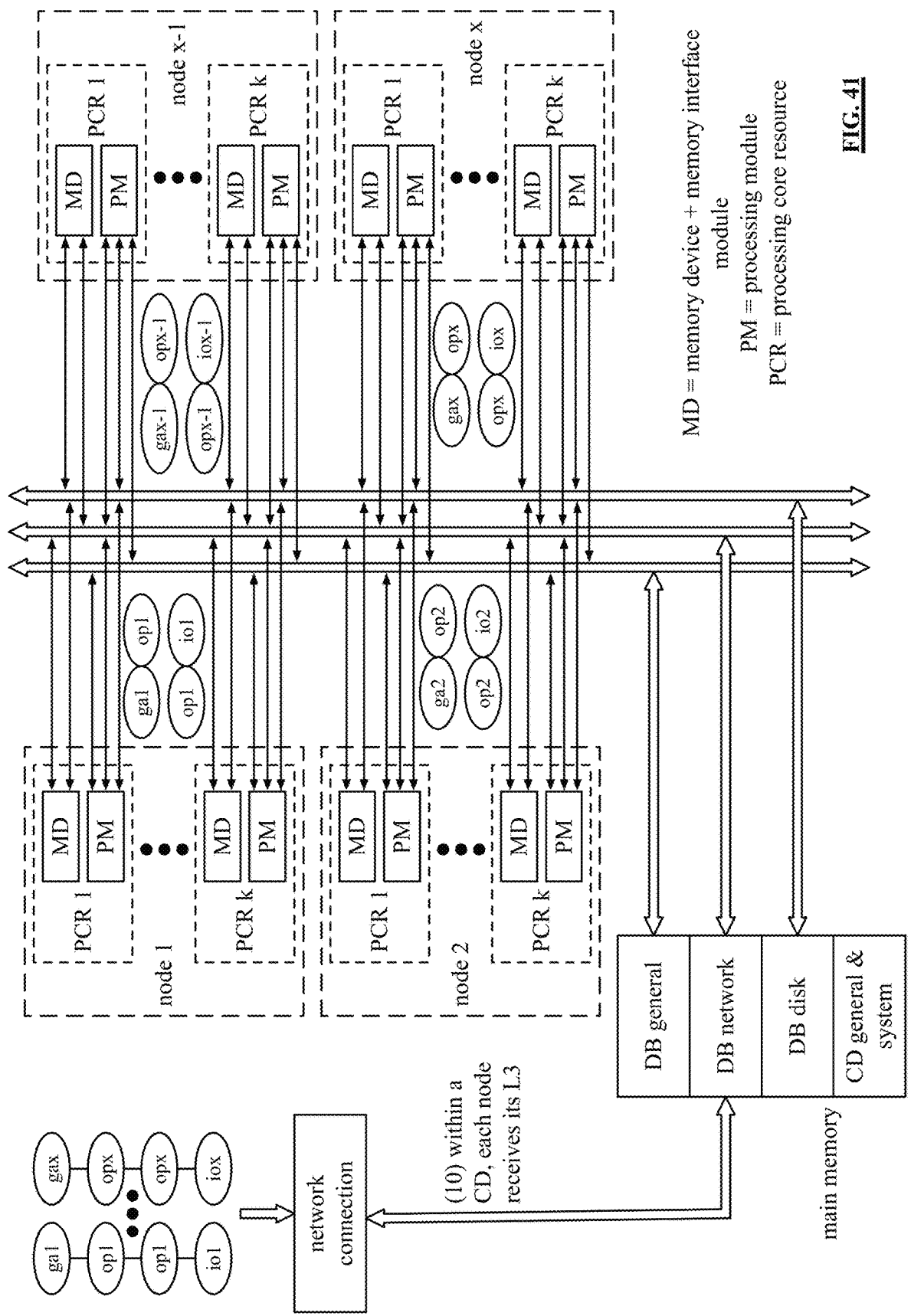

FIG. 41 illustrates each node within a computing device receiving their set of L3 operations. In this example, a portion of the main memory stores one or more replicated L3 instruction sets for the nodes.

Figure 42:
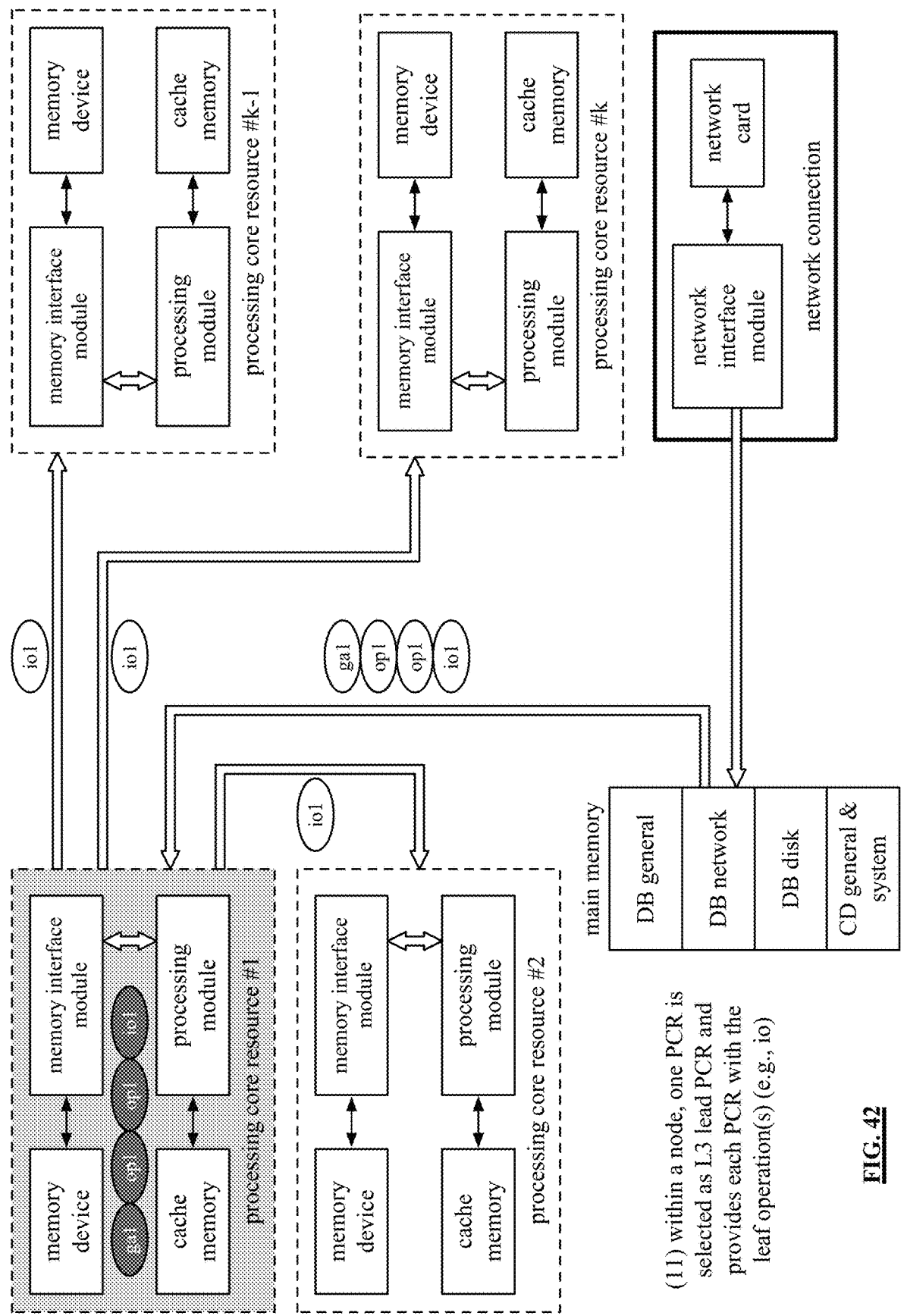

FIG. 42 illustrates a node selecting one of its processing core resources (PCR) as a lead PCR. The lead PCR provides each other PCR with leaf operations of the L3 instruction set, which are input/output operations. The lead PCR may further provide each PCR with other operations of the L3 instruction set that are to be performed with the corresponding I/O operation(s).

Figure 43:
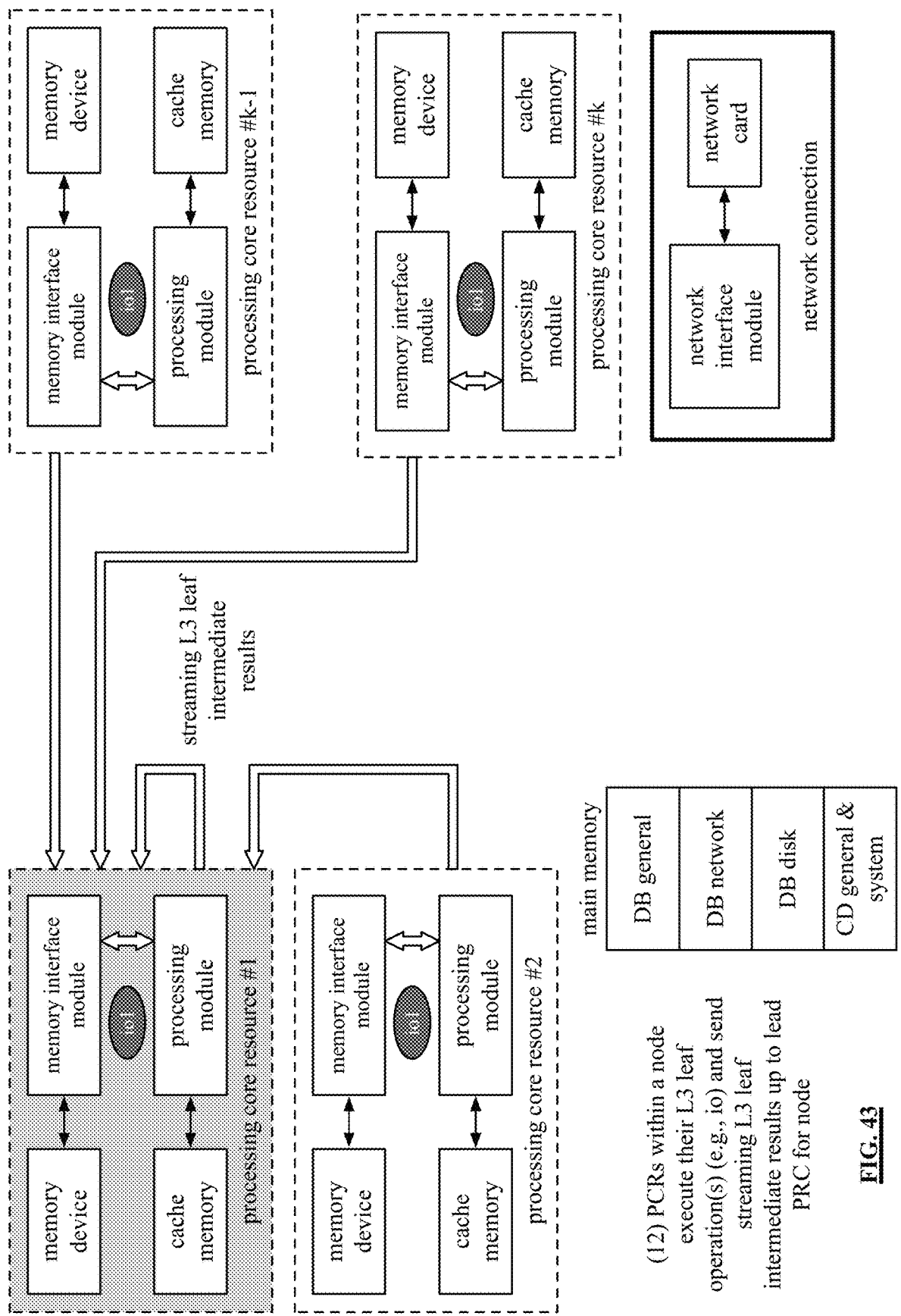
FIGS. 43-47 are schematic block diagrams of an example of executing a distributed query plan in the database system in accordance with the present invention.

FIGS. 43-47 are schematic block diagrams of an example of executing a distributed query plan in the database system. FIG. 43 illustrates PCRs within a node executing their L3 leaf operations (e.g., read data from a memory device and place it in a section of the main memory). In addition, the PCRs send streaming L3 leaf intermediate results up to the lead PCR for the node. For example, the L3 leaf operations include read data and filter it based on a filter criteria to produce L3 leaf intermediate results.

Figure 44:
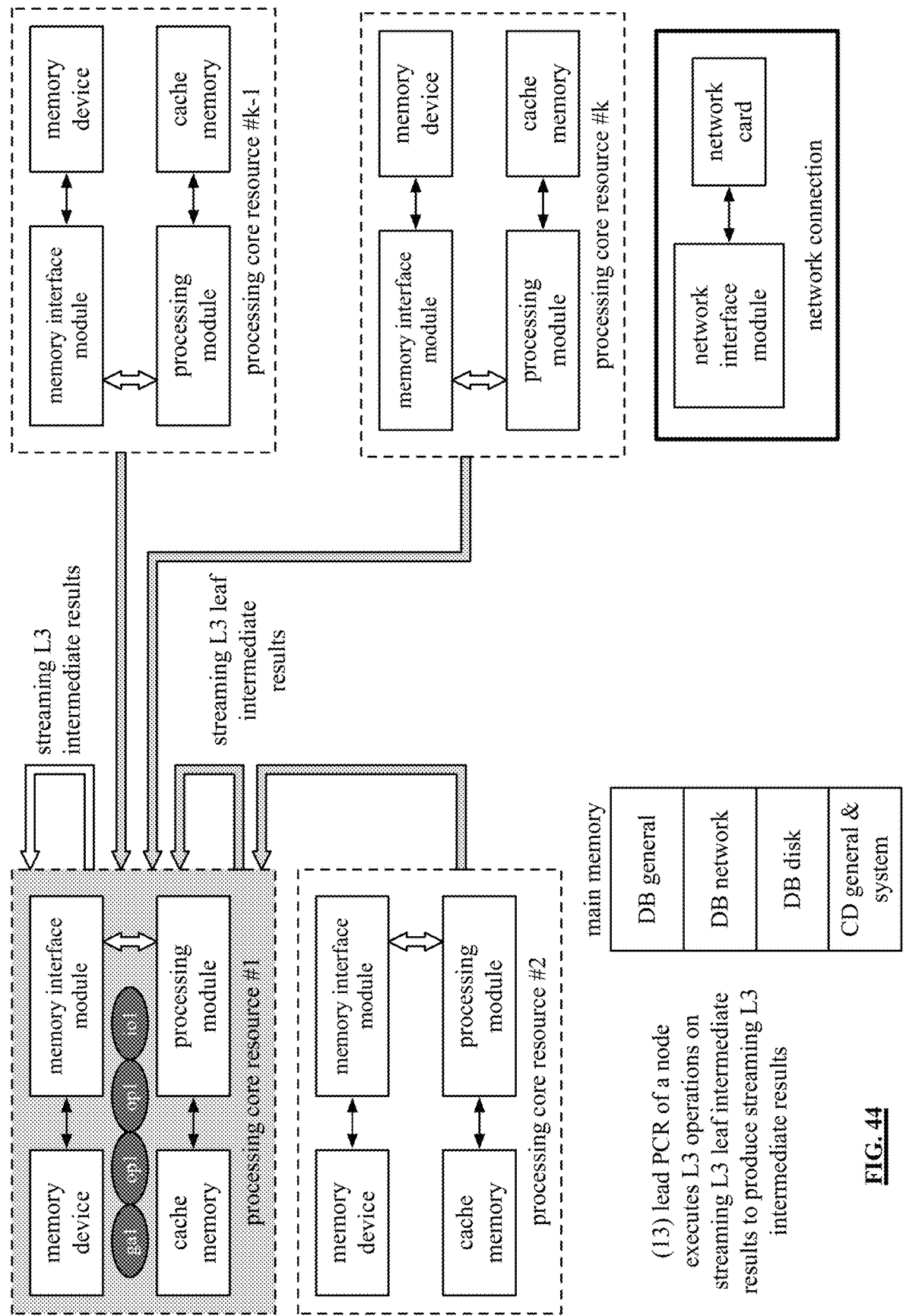

FIG. 44 illustrates the lead PCR of a node executing L3 operations on the streaming L3 leaf intermediate results to produce streaming L3 intermediate results. For example, the L3 leaf intermediate results is produced by gathering the filtered data from the other PCRs in the node. As such, the L3 intermediate results is an aggregation of the L3 leaf intermediate results.

Figure 45:
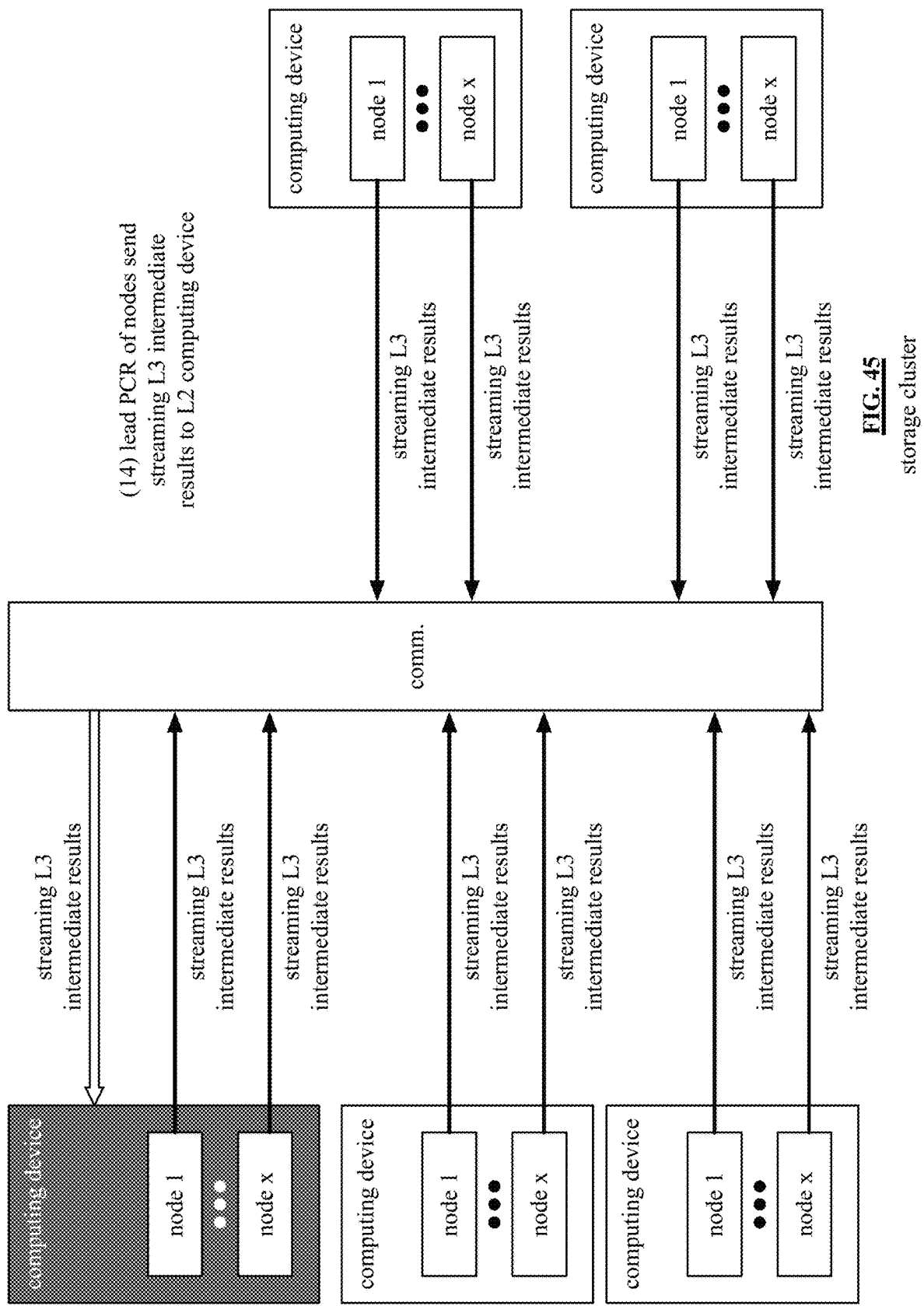

FIG. 45 illustrates the lead PCR of each node of a computing device sending the streaming L3 intermediate results to an L2 computing device of the storage cluster. The L2 computing device performs the remaining L3 set of operations on the incoming L3 intermediate results to produce L3 results.

Figure 46:
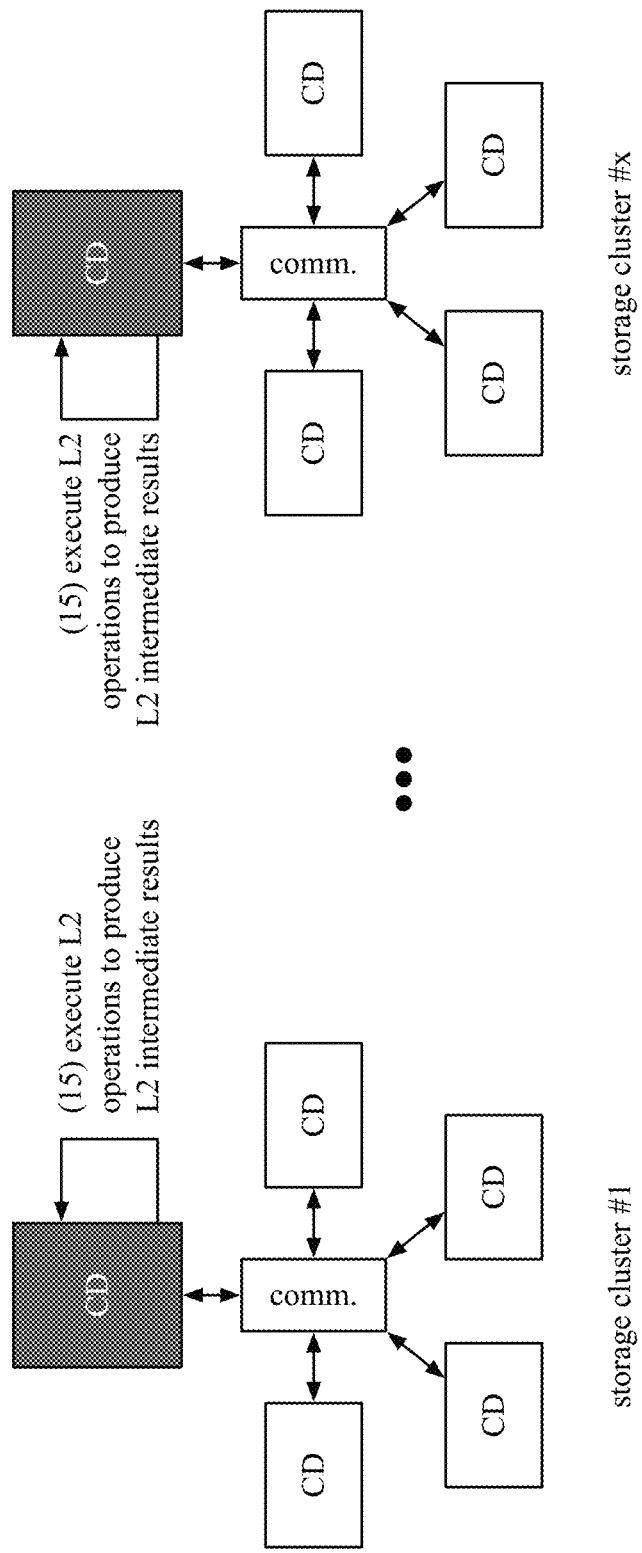

FIG. 46 illustrates the L2 computing device of each storage cluster executing L2 operations on the L3 results received in FIG. 46 to produce L2 intermediate results. For example, the L2 operations gather the L3 intermediate results of filtered data and further processes the filtered data.

Figure 47:
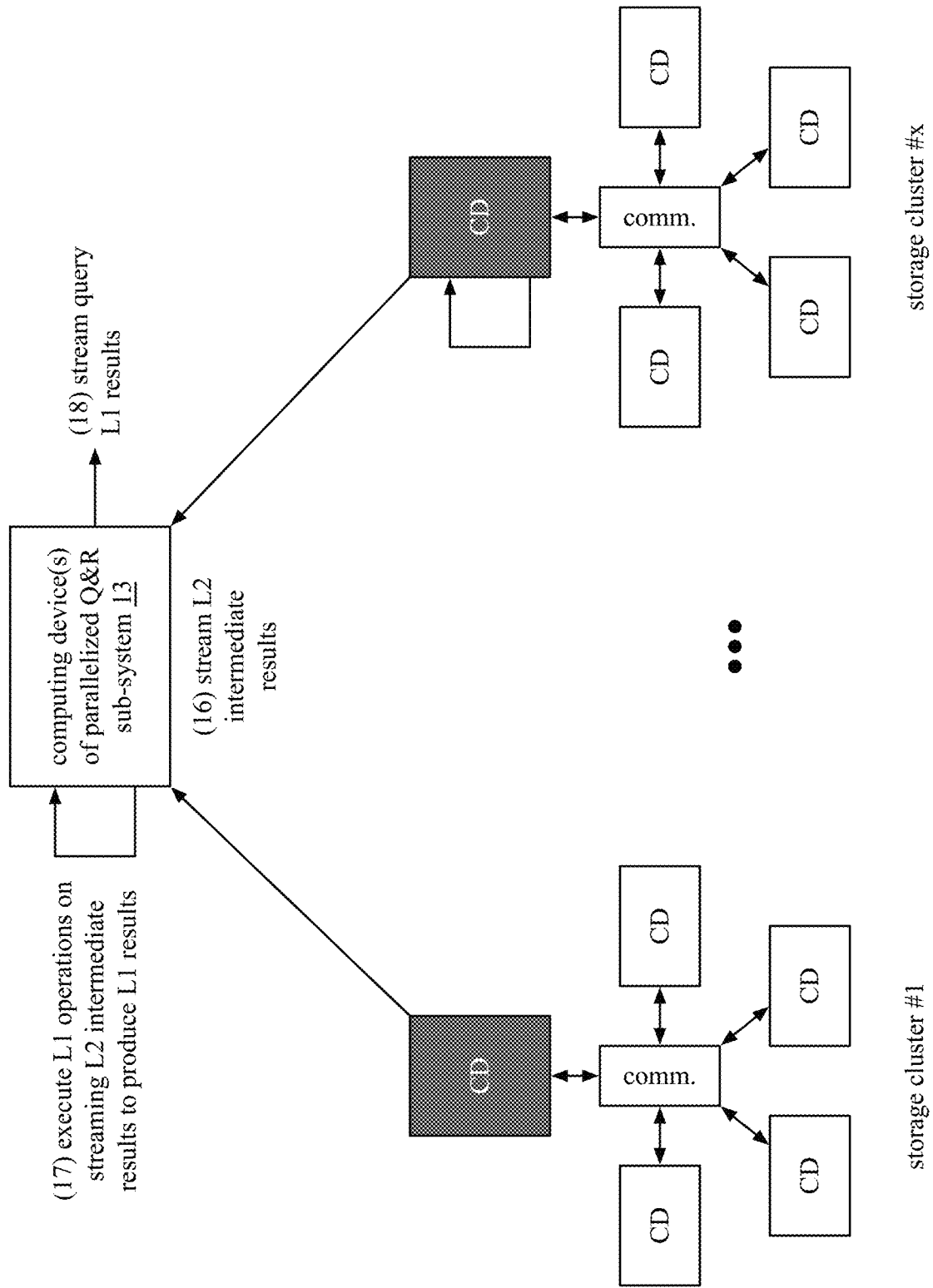

FIG. 47 illustrates the L2 computing devices sending the L2 intermediate results to the L1 computing device. The L1 computing devices executes the L1 operations to produce streaming query results.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory device includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information. A computing entity includes and/or has access to a computer readable memory device for executing the operational instructions stored thereon.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
receiving, by a first computing entity of a database system, a query request that is formatted in accordance with a generic query format, wherein the query request identifies at least one database table that includes a data set;
generating, by the first computing entity, an initial query plan based on the query request, wherein the initial query plan is generated to include a subset of a plurality of operations based on selecting the subset of a plurality of operations indicated in a query instruction set of the database system;
determining, by the first computing entity, storage parameters regarding how the at least one database table is stored within the database system;
expanding a level of a computation of the initial query plan from a single level to at least three levels to produce a multiple level query plan for performance via multiple levels of parallelization;
determining, by the first computing entity, a plurality of processing resources of the database system for processing the query request based on the storage parameters indicating the plurality of processing resources are associated with storing the data set;
generating, by the first computing entity, an optimized query plan from the multiple level query plan based on the storage parameters, the processing resources, and optimization tools, wherein the optimized query plan indicates:
a first set of operations be performed via one level of the at least three levels via one corresponding set of parallelized resources in one level of parallelism of the multiple levels of parallelism; and
a second set of operations be performed via another level of the at least three levels via another corresponding set of parallelized resources in another level of parallelism of the multiple levels of parallelism;
generating, by the first computing entity, a distribution plan to distribute portions of the optimized query plan among the plurality of processing resources; and
sending, by the first computing entity, the optimized query plan to a second computing entity of the database system that includes at least some of the plurality of processing resources for distribution and execution of the optimized query plan in the multiple levels of parallelism by the plurality of processing resources in accordance with the at least three levels based on the distribution plan, wherein the second computing entity includes a plurality of computing devices of a plurality of storage clusters, wherein each storage cluster of the plurality of storage clusters includes a corresponding set of multiple computing devices of the plurality of computing devices;
wherein sending the optimized query plan to the second computing entity includes selecting, by the first computing entity, a selected plurality of computing devices for parallelized execution of the first set of operations via the one level of the at least three levels based on selecting, for each storage cluster of the plurality of storage clusters, one computing device of corresponding set of multiple computing devices for inclusion in the selected plurality of computing devices, wherein the selected plurality of computing devices is a proper subset of the plurality of computing devices;

wherein distribution and execution of the optimized query plan includes communicating, by each computing device of the selected plurality of computing devices to other computing devices of the corresponding set of multiple computing devices of a corresponding storage cluster that includes the each computing device, the second set of operations of the another level of the at least three levels for parallelized execution of the second set of operations via the other computing devices of the corresponding set of multiple computing devices.

2. The method of claim 1, wherein the generating the initial query plan further comprises:
  converting, by the first computing entity, the query request into a syntax tree that represents a syntactic structure of instructions of the query instruction set of the database system;
  validating, by the first computing entity, the syntax tree by one or more of:
    verifying statements of the query request are valid statements of the generic query format;
    verifying that the data set is a valid data set; and
    verifying no hang conditions occurs;
  when the syntax tree is validated, annotating, by the first computing entity, the syntax tree with particular information of the data set to produce an annotated syntax tree; and
  generating, by the first computing entity, the initial query plan based on the annotated syntax tree.

3. The method of claim 2 further comprises:
  when the syntax tree is not validated, sending, by the first computing entity, a query error message to a requesting device associated with the query request.

4. The method of claim 2 further comprises:
  when the syntax tree is not validated, identifying, by the first computing entity, a portion of the query request causing the syntax tree to not be valid;
  changing, by the first computing entity, coding of the portion of the query request while substantially preserving meaning of the portion of the query request to produce a changed query request; and
  repeating, by the first computing entity, the converting and validated steps for the changed query request.

5. The method of claim 1, wherein the determining the storage parameters comprises one or more of:
  retrieving, by the first computing entity, the storage parameters from a lookup table based on identity of the data set;
  sending, by the first computing entity, a storage parameter request to the second computing entity regarding the data set, wherein the second computing entity is within a parallelized data store, retrieve, and/or process sub-system of the database system; and
  sending, by the first computing entity, a storage parameter request to a third computing entity regarding the data set, wherein the third computing entity is within a parallelized data input sub-system of the database system.

6. The method of claim 1, wherein the storage parameters comprise two or more of:
  number of rows per segment of the data set;
  number of columns of the data set;
  number of partitions the data set was divided into;
  a number of segments each partition was divided into;
  a data redundancy encoding scheme;
  a number of storage clusters storing the data set;
  a number of computing devices within a storage cluster;
  a number of nodes within a computing device; and
  a number of processing core resources within a node.

7. The method of claim 1, wherein the determining processing resources comprises one or more of:
  determining, as the processing resources, a number of processing core resources associated with storing the data set;
  determining, as the processing resources, a number of nodes associated with storing the data set; and
  determining, as the processing resources, a number of computing devices associated with storing the data set.

8. The method of claim 1, wherein the generating the optimized query plan comprises:
  determining an initial cost value for the multiple level query plan;
  comparing the initial cost value with a cost threshold;
  when the initial cost value compares unfavorably to the cost threshold, changing the multiple level query plan in accordance with one or more of the optimization tools to produce an updated multiple level query plan as the multiple level query plan; and
  when a cost value of the multiple level query plan compares favorably to the cost threshold, outputting the multiple level query plan as the optimized query plan.

9. The method of claim 1, wherein the optimization tools comprise two or more of:
  one or more pre-optimization tools;
  one or more heuristic optimization tools;
  one or more particle swarm optimization tools; and
  one or more time-key-time optimization tools.

10. The method of claim 1, wherein the plurality of processing resources are further determined based on determining processing resources that are available, and based on selecting processing resources that store a relevant portion of the database table, and wherein the plurality of processing resources execute the optimized query plan based on processing at least one operation of the optimized query plan on their respective portions of the database table.

11. The method of claim 1, wherein the plurality of processing resources includes at least one processing resource of the first computing entity, further comprising:
  generating, by the second computing entity via a first set of processing resources of the plurality of processing resources, first partial responses in accordance with a lowest level of the at least three levels;
  generating, by the second computing entity via a second set of processing resources of the plurality of processing resources, second partial responses in accordance with at least one middle level of the at least three levels based on the first partial responses;
  receiving, by the first computing entity, the second partial responses from the second computing entity; and
  generating, by the first computing entity, a query result from the second partial responses in accordance with a top-most level of the at least three levels.

12. The method of claim 1 further comprises:
  the first computing entity including one or more of: one or more first computing devices of a query and results sub-system of the database system, one or more first nodes of the one or more first computing devices, and one or more first processing core resources of the one or more first nodes; and the second computing entity including one or more of: one or more second computing devices of a data store, retrieve, and process sub-system of the database system, one or more second nodes of the one or more second computing devices, and one or more second processing core resources of the one or more second nodes.

13. A computer readable memory device comprises:

a memory section that stores operational instructions that, when executed by a first computing entity of a database system, causes the first computing entity to:
- receive a query request that is formatted in accordance with a generic query format, wherein the query request identifies at least one database table that includes a data set;
- generate an initial query plan based on the query request, wherein the initial query plan is generated to include a subset of a plurality of operations based on selecting the subset of a plurality of operations indicated in a query instruction set of the database system;
- expand a level of a computation of the initial query plan from a single level to at least three levels to produce a multiple level query plan for performance via multiple levels of barallelization;
- determine storage parameters regarding how the at least one database table is stored within the database system;
- determine a plurality of processing resources of the database system for processing the query request based on the storage parameters indicating the plurality of processing resources are associated with storing the data set;
- generate an optimized query plan from the multiple level query plan based on the storage parameters, the processing resources, and optimization tools, wherein the optimized query plan indicates:
  - a first set of operations be performed via one level of the at least three levels via one corresponding set of parallelized resources in one level of parallelism of the multiple levels of parallelism; and
  - a second set of operations be performed via another level of the at least three levels via another corresponding set of parallelized resources in another level of parallelism of the multiple levels of parallelism;
- generate a distribution plan to distribute portions of the optimized query plan among the plurality of processing resources; and
- send the optimized query plan to a second computing entity of the database system that includes at least some of the plurality of processing resources for distribution and execution of the optimized query plan in multiple levels of parallelism by the plurality of processing resources in accordance with the at least three levels based on the distribution plan, wherein the second computing entity includes a plurality of computing devices of a plurality of storage clusters, wherein each storage cluster of the plurality of storage clusters includes a corresponding set of multiple computing devices of the plurality of computing devices;
- wherein sending the optimized query plan to the second computing entity includes selecting, by the first computing entity, a selected plurality of computing devices for parallelized execution of the first set of operations via the one level of the at least three levels based on selecting, for each storage cluster of the plurality of storage clusters, one computing device of corresponding set of multiple computing devices for inclusion in the selected plurality of computing devices, wherein the selected plurality of computing devices is a proper subset of the plurality of computing devices;
- wherein distribution and execution of the optimized query plan includes communicating, by each computing device of the selected plurality of computing devices to other computing devices of the corresponding set of multiple computing devices of a corresponding storage cluster that includes the each computing device, the second set of operations of the another level of the at least three levels for parallelized execution of the second set of operations via the other computing devices of the corresponding set of multiple computing devices.

14. The computer readable memory device of claim 13, wherein the memory section further stores operational instructions that, when executed by the first computing entity, causes the first computing entity to generate the initial query plan by:
- converting, by the first computing entity, the query request into a syntax tree that represents a syntactic structure of instructions of the query instruction set of the database system;
- validating, by the first computing entity, the syntax tree by one or more of:
  - verifying statements of the query request are valid statements of the generic query format;
  - verifying that the data set is a valid data set; and
  - verifying no hang conditions occurs;
- when the syntax tree is validated, annotating, by the first computing entity, the syntax tree with particular information of the data set to produce an annotated syntax tree; and
- generating, by the first computing entity, the initial query plan based on the annotated syntax tree.

15. The computer readable memory device of claim 14, wherein the memory section further stores operational instructions that, when executed by the first computing entity, causes the first computing entity to:
- when the syntax tree is not validated, send a query error message to a requesting device associated with the query request.

16. The computer readable memory device of claim 14, wherein the memory section further stores operational instructions that, when executed by the first computing entity, causes the first computing entity to:
- when the syntax tree is not validated, identify a portion of the query request causing the syntax tree to not be valid;
- change coding of the portion of the query request while substantially preserving meaning of the portion of the query request to produce a changed query request; and
- repeat the converting and validated steps for the changed query request.

17. The computer readable memory device of claim 13, wherein the memory section further stores operational instructions that, when executed by the first computing entity, causes the first computing entity to determine the storage parameters by one or more of:
retrieving, by the first computing entity, the storage parameters from a lookup table based on identity of the data set;
sending, by the first computing entity, a storage parameter request to the second computing entity regarding the data set, wherein the second computing entity is within a parallelized data store, retrieve, and/or process sub-system of the database system; and
sending, by the first computing entity, a storage parameter request to a third computing entity regarding the data set, wherein the third computing entity is within a parallelized data input sub-system of the database system.

18. The computer readable memory device of claim 13, wherein the storage parameters comprise two or more of:
number of rows per segment of the data set;
number of columns of the data set;
number of partitions the data set was divided into;
a number of segments each partition was divided into;
a data redundancy encoding scheme;
a number of storage clusters storing the data set;
a number of computing devices within a storage cluster;
a number of nodes within a computing device; and
a number of processing core resources within a node.

19. The computer readable memory device of claim 13, wherein the memory section further stores operational instructions that, when executed by the first computing entity, causes the first computing entity to determine processing resources by one or more of:
determining, as the processing resources, a number of processing core resources associated with storing the data set;
determining, as the processing resources, a number of nodes associated with storing the data set; and
determining, as the processing resources, a number of computing devices associated with storing the data set.

20. The computer readable memory device of claim 13, wherein the memory section further stores operational instructions that, when executed by the first computing entity, causes the first computing entity to generate the optimized query plan by:
determining an initial cost value for the multiple level query plan;
comparing the initial cost value with a cost threshold;
when the initial cost value compares unfavorably to the cost threshold, changing the multiple level query plan in accordance with one or more of the optimization tools to produce an updated multiple level query plan as the multiple level query plan; and
when a cost value of the multiple level query plan compares favorably to the cost threshold, outputting the multiple level query plan as the optimized query plan.

21. The computer readable memory device of claim 13, wherein the optimization tools comprise two or more of:
one or more pre-optimization tools;
one or more heuristic optimization tools;
one or more particle swarm optimization tools; and
one or more time-key-time optimization tools.

22. The computer readable memory device of claim 13, wherein the plurality of processing resources are further determined based on determining processing resources that are available, and based on selecting processing resources that store a relevant portion of the database table, and wherein the plurality of processing resources execute the optimized query plan based on processing at least one operation of the optimized query plan on their respective portions of the database table.

23. The computer readable memory device of claim 13, wherein the first computing entity includes at least one processing resource of the plurality of processing resources, wherein the second computing entity generates first partial responses via a first set of processing resources of the plurality of processing resources in accordance with a lowest level of the at least three levels, wherein the second computing entity further generates second partial responses via a second set of processing resources of the plurality of processing resources in accordance with at least one middle level of the at least three levels based on the first partial responses, and wherein the memory section further stores operational instructions that, when executed by the first computing entity, causes the first computing entity to:
receive the second partial responses from the second computing entity; and
generate a query result from the second partial responses.

24. The computer readable memory device of claim 13 further comprises:
the first computing entity including one or more of: one or more first computing devices of a query and results sub-system of the database system, one or more first nodes of the one or more first computing devices, and one or more first processing core resources of the one or more first nodes; and
the second computing entity including one or more of: one or more second computing devices of a data store, retrieve, and process sub-system of the database system, one or more second nodes of the one or more second computing devices, and one or more second processing core resources of the one or more second nodes.

* * * * *